US007397682B2

(12) United States Patent
Ogura

(10) Patent No.: US 7,397,682 B2
(45) **Date of Patent: *Jul. 8, 2008**

(54) ASSOCIATIVE MEMORY HAVING A MASK FUNCTION FOR USE IN NETWORK DEVICES AND NETWORK SYSTEM

(75) Inventor: Naoyuki Ogura, Yokohama (JP)

(73) Assignee: Terminus Technology Limited (JP)

( * ) Notice: Subject to any disclaimer, the term of this patent is extended or adjusted under 35 U.S.C. 154(b) by 290 days.

This patent is subject to a terminal disclaimer.

(21) Appl. No.: 11/252,360

(22) Filed: Oct. 17, 2005

(65) Prior Publication Data

US 2006/0120128 A1 Jun. 8, 2006

Related U.S. Application Data

(63) Continuation of application No. 10/475,031, filed as application No. PCT/JP01/03562 on Apr. 25, 2001, now Pat. No. 6,956,756.

(51) Int. Cl.
*G11C 15/00* (2006.01)

(52) U.S. Cl. .................................... 365/49; 365/189.07

(58) Field of Classification Search .................. 365/49, 365/189.07; 712/237
See application file for complete search history.

(56) References Cited

U.S. PATENT DOCUMENTS 6,070,223 A 5/2000 Yoshizawa et al. .......... 711/108
6,144,574 A 11/2000 Kobayashi et al. ............ 365/49
6,295,576 B1 9/2001 Ogura et al. ................ 711/108
2003/0182543 A1* 9/2003 Keller et al. ................ 712/237

FOREIGN PATENT DOCUMENTS

| | | |
|---|---|---|
| CA | 2265302 | 9/1999 |
| DE | 19839205 | 3/1999 |
| JP | 11-073782 | 3/1999 |
| JP | 11-261647 | 9/1999 |
| JP | 2000-322892 | 11/2000 |

OTHER PUBLICATIONS

English translation of International Preliminary Examination Report for Intl. Application No. PCT/JP01/03562, dated Jun. 27, 2003.

* cited by examiner

*Primary Examiner*—Son Dinh
(74) *Attorney, Agent, or Firm*—Cook, Alex, McFarron, Manzo, Cummings & Mehler, Ltd.

(57) ABSTRACT

An associative memory carries out a search operation in plural fields. The search data 3-1 through **3-*r* in fields, r in number, are supplied to the primary associative memories 20-1 through 20-*r*. The i-th primary associative memory 20-*i* carries out the search operation, produces the primary match line 17-1-1 through 17-*m*-*r*, and maintains the state of logical AND operation by every word of the primary match line 17-*j*-1 through 17-*j*-*r*, the secondary match line 18-*j*-1 through 18-*j*-*r*, and memory means m-j when primary search enabling signal 10-*i* is in a valid state. Supplied with the states maintained in the stored information in each word and memory means 43, the primary associative memory 20-*i* provides the intermediate data 93-*i*. The secondary associative memory 21-*i* with words, m in number, searches for the intermediate data 93-*i* and produces the secondary match line 18-*i*-1 through 18-*i*-*m* when secondary search enabling signal 11-I is in a valid state. The match signal 5-1 through 5-*m*** with the logical operation by every word of the secondary match line are suppried exteriorly.

13 Claims, 34 Drawing Sheets

82
3-1
SEARCH DATA
3-n
86
TWO-INPUT/ONE-OUTPUT N-BIT SELECTOR WITH ENABLE
87
BIT LINE 51-1
44-1 ASSOCIATIVE MEMORY WORD
52-1
BIT LINE 51-n
52-n
83-1-1 ASSOCIATIVE MEMORY CELL
83-1-n ASSOCIATIVE MEMORY CELL
8-1-1
DATA CELL
8-1-n
53-1
84-1-1
56-1-1
84-1-n
56-1-n
a b COMPARATOR dm MASK
OUT
37-1
38-1
9-1-1
MASK CELL
9-1-n
54-1
83-m-1
44-m ASSOCIATIVE MEMORY WORD
83-m-n
ASSOCIATIVE MEMORY CELL
8-m-1
8-m-n
53-m
84-m-1
56-m-1
84-m-n
56-m-n
37-m
38-m
9-m-1
9-m-n
54-m
45
85
Vdd
REGISTER
58-1
57-n
58-n
CONTROLLER
86
87
10
11
92-1
92-n
36 ASSOCIATIVE MEMORY SEARCHING FOR A SINGLE FIELD

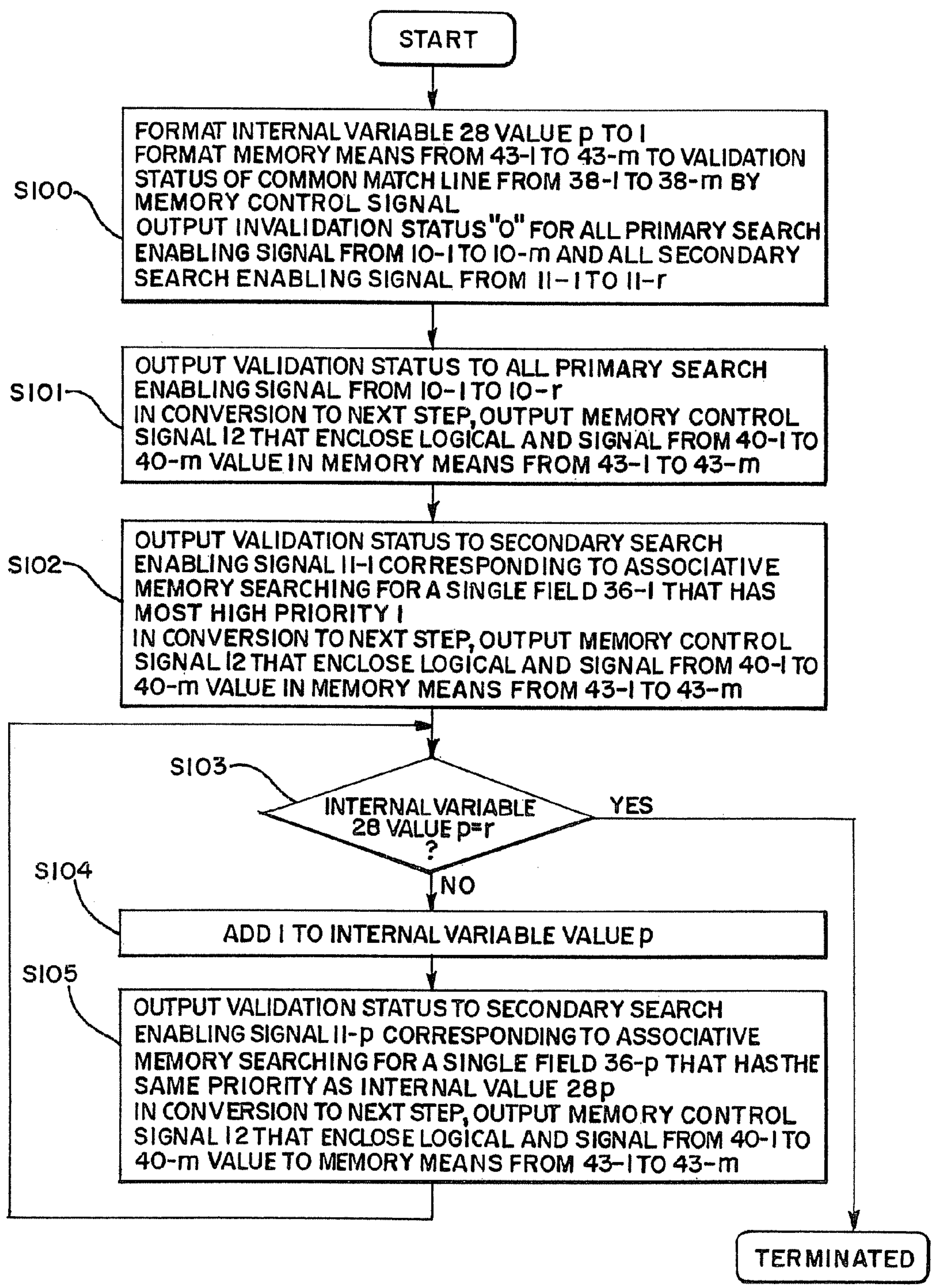
FIG. 5
START
S100
FORMAT INTERNAL VARIABLE 28 VALUE p TO 1
FORMAT MEMORY MEANS FROM 43-1 TO 43-m TO VALIDATION STATUS OF COMMON MATCH LINE FROM 38-1 TO 38-m BY MEMORY CONTROL SIGNAL
OUTPUT INVALIDATION STATUS "0" FOR ALL PRIMARY SEARCH ENABLING SIGNAL FROM 10-1 TO 10-m AND ALL SECONDARY SEARCH ENABLING SIGNAL FROM 11-1 TO 11-r
S101
OUTPUT VALIDATION STATUS TO ALL PRIMARY SEARCH ENABLING SIGNAL FROM 10-1 TO 10-r
IN CONVERSION TO NEXT STEP, OUTPUT MEMORY CONTROL SIGNAL 12 THAT ENCLOSE LOGICAL AND SIGNAL FROM 40-1 TO 40-m VALUE IN MEMORY MEANS FROM 43-1 TO 43-m
S102
OUTPUT VALIDATION STATUS TO SECONDARY SEARCH ENABLING SIGNAL 11-1 CORRESPONDING TO ASSOCIATIVE MEMORY SEARCHING FOR A SINGLE FIELD 36-1 THAT HAS MOST HIGH PRIORITY 1
IN CONVERSION TO NEXT STEP, OUTPUT MEMORY CONTROL SIGNAL 12 THAT ENCLOSE LOGICAL AND SIGNAL FROM 40-1 TO 40-m VALUE IN MEMORY MEANS FROM 43-1 TO 43-m
S103
INTERNAL VARIABLE 28 VALUE p=r ?
YES
NO
S104
ADD 1 TO INTERNAL VARIABLE VALUE p
S105
OUTPUT VALIDATION STATUS TO SECONDARY SEARCH ENABLING SIGNAL 11-p CORRESPONDING TO ASSOCIATIVE MEMORY SEARCHING FOR A SINGLE FIELD 36-p THAT HAS THE SAME PRIORITY AS INTERNAL VALUE 28p
IN CONVERSION TO NEXT STEP, OUTPUT MEMORY CONTROL SIGNAL 12 THAT ENCLOSE LOGICAL AND SIGNAL FROM 40-1 TO 40-m VALUE TO MEMORY MEANS FROM 43-1 TO 43-m
TERMINATED

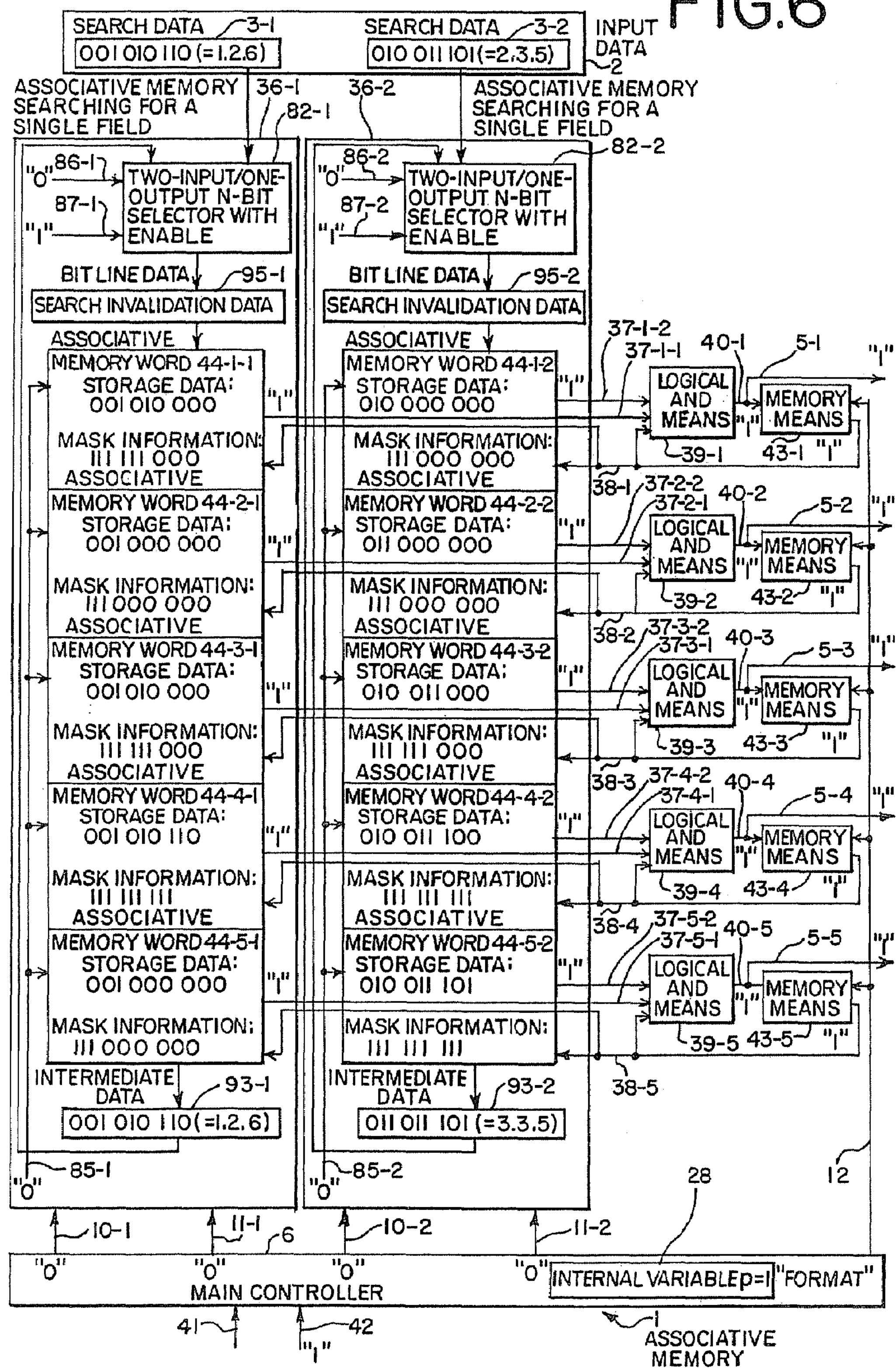
FIG.6
SEARCH DATA 3-1
001 010 110 (=1.2.6)
SEARCH DATA 3-2
010 011 101 (=2.3.5)
INPUT DATA 2
ASSOCIATIVE MEMORY SEARCHING FOR A SINGLE FIELD
TWO-INPUT/ONE-OUTPUT N-BIT SELECTOR WITH ENABLE
BIT LINE DATA
SEARCH INVALIDATION DATA
ASSOCIATIVE MEMORY WORD 44-1-1 STORAGE DATA: 001 010 000
MASK INFORMATION: 111 111 000
ASSOCIATIVE MEMORY WORD 44-1-2 STORAGE DATA: 010 000 000
MASK INFORMATION: 111 000 000
LOGICAL AND MEANS
MEMORY MEANS
INTERMEDIATE DATA
001 010 110 (=1.2.6)
011 011 101 (=3.3.5)
INTERNAL VARIABLE p=1
"FORMAT"
MAIN CONTROLLER
ASSOCIATIVE MEMORY

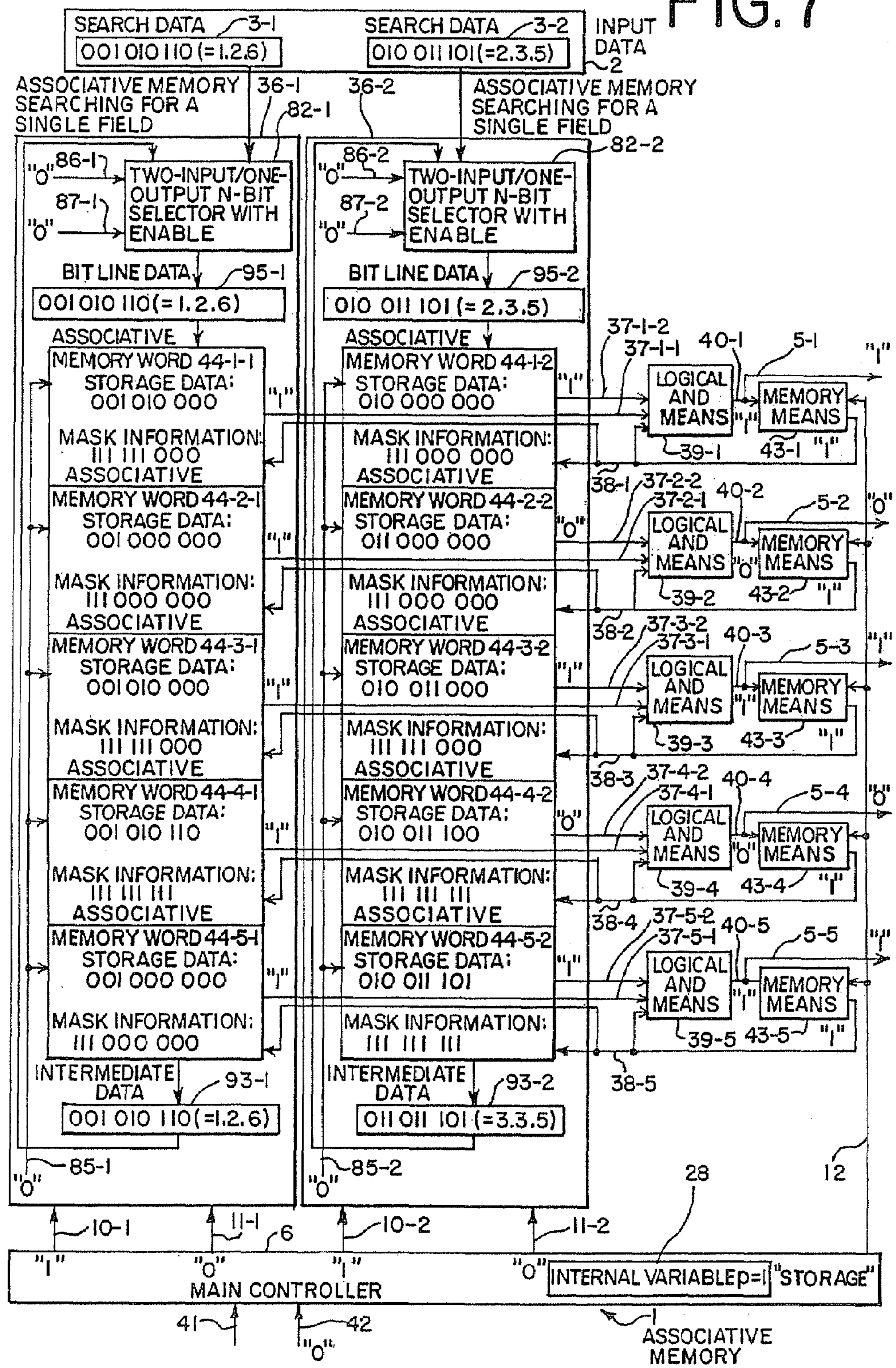
FIG. 7
SEARCH DATA 3-1
001 010 110 (=1.2.6)
SEARCH DATA 3-2
010 011 101 (=2.3.5)
INPUT DATA 2
ASSOCIATIVE MEMORY SEARCHING FOR A SINGLE FIELD
36-1
82-1
36-2
ASSOCIATIVE MEMORY SEARCHING FOR A SINGLE FIELD
82-2
TWO-INPUT/ONE-OUTPUT N-BIT SELECTOR WITH ENABLE
86-1
87-1
86-2
87-2
BIT LINE DATA 95-1
001 010 110 (=1.2.6)
BIT LINE DATA 95-2
010 011 101 (=2.3.5)
ASSOCIATIVE MEMORY WORD 44-1-1
STORAGE DATA: 001 010 000
MASK INFORMATION: 111 111 000
ASSOCIATIVE MEMORY WORD 44-1-2
STORAGE DATA: 010 000 000
MASK INFORMATION: 111 000 000
ASSOCIATIVE MEMORY WORD 44-2-1
STORAGE DATA: 001 000 000
MASK INFORMATION: 111 000 000
ASSOCIATIVE MEMORY WORD 44-2-2
STORAGE DATA: 011 000 000
MASK INFORMATION: 111 000 000
ASSOCIATIVE MEMORY WORD 44-3-1
STORAGE DATA: 001 010 000
MASK INFORMATION: 111 111 000
ASSOCIATIVE MEMORY WORD 44-3-2
STORAGE DATA: 010 011 000
MASK INFORMATION: 111 111 000
ASSOCIATIVE MEMORY WORD 44-4-1
STORAGE DATA: 001 010 110
MASK INFORMATION: 111 111 111
ASSOCIATIVE MEMORY WORD 44-4-2
STORAGE DATA: 010 011 100
MASK INFORMATION: 111 111 111
ASSOCIATIVE MEMORY WORD 44-5-1
STORAGE DATA: 001 000 000
MASK INFORMATION: 111 000 000
ASSOCIATIVE MEMORY WORD 44-5-2
STORAGE DATA: 010 011 101
MASK INFORMATION: 111 111 111
INTERMEDIATE DATA 93-1
001 010 110 (=1.2.6)
INTERMEDIATE DATA 93-2
011 011 101 (=3.3.5)
85-1
85-2
37-1-2
37-1-1
40-1
5-1
LOGICAL AND MEANS
MEMORY MEANS
39-1
43-1
38-1
37-2-2
37-2-1
40-2
5-2
39-2
43-2
38-2
37-3-2
37-3-1
40-3
5-3
39-3
43-3
38-3
37-4-2
37-4-1
40-4
5-4
39-4
43-4
38-4
37-5-2
37-5-1
40-5
5-5
39-5
43-5
38-5
12
28
10-1
11-1
6
10-2
11-2
INTERNAL VARIABLE p=1
"STORAGE"
MAIN CONTROLLER
41
42
1 ASSOCIATIVE MEMORY

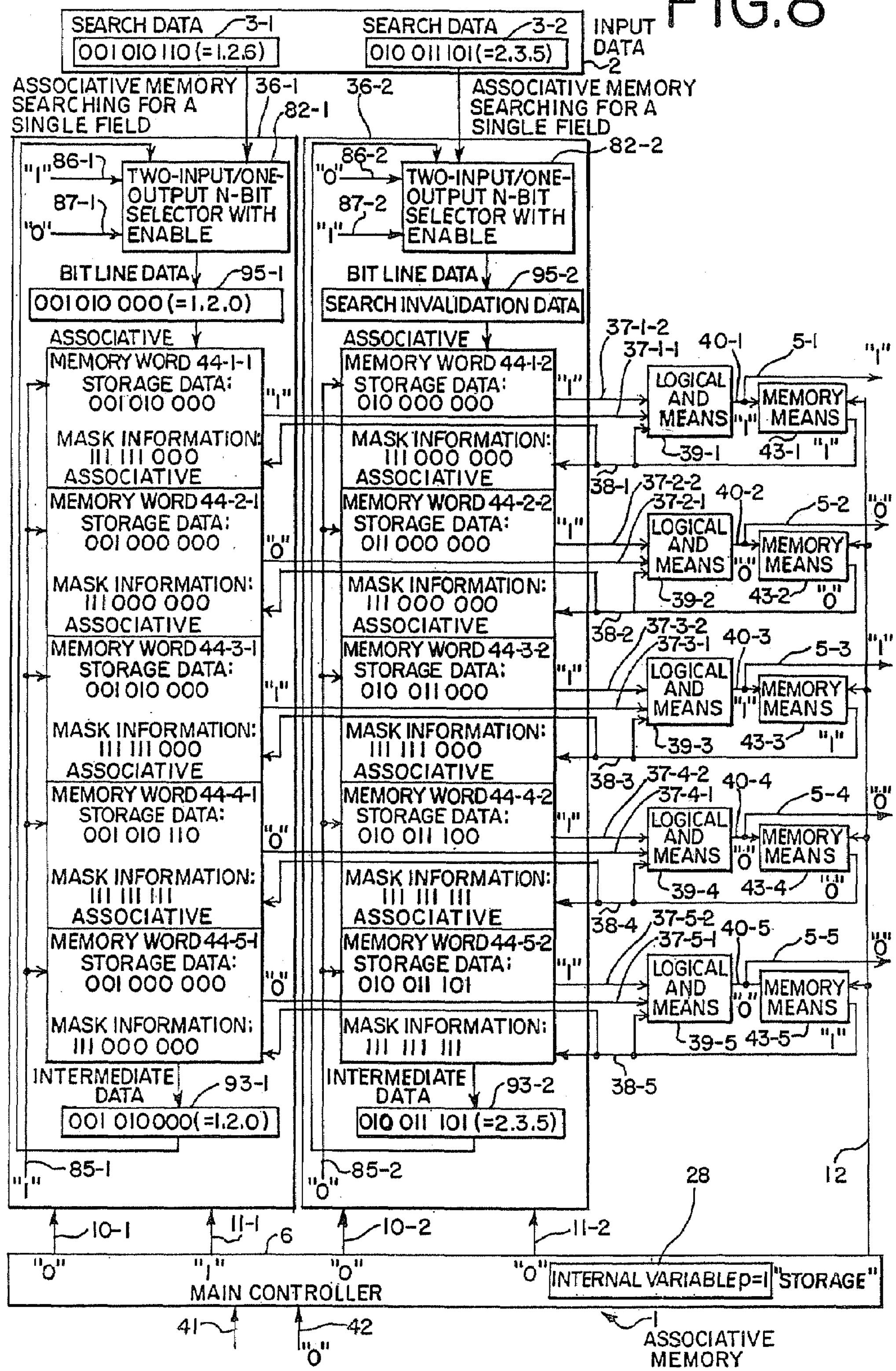
FIG.8
SEARCH DATA 3-1
001 010 110 (=1.2.6)
SEARCH DATA 3-2
010 011 101 (=2.3.5)
INPUT DATA 2
ASSOCIATIVE MEMORY SEARCHING FOR A SINGLE FIELD
36-1
36-2
82-1
82-2
86-1
87-1
86-2
87-2
TWO-INPUT/ONE-OUTPUT N-BIT SELECTOR WITH ENABLE
BIT LINE DATA 95-1
001 010 000 (=1.2.0)
BIT LINE DATA 95-2
SEARCH INVALIDATION DATA
ASSOCIATIVE MEMORY WORD 44-1-1
STORAGE DATA: 001 010 000
MASK INFORMATION: 111 111 000
ASSOCIATIVE MEMORY WORD 44-2-1
STORAGE DATA: 001 000 000
MASK INFORMATION: 111 000 000
ASSOCIATIVE MEMORY WORD 44-3-1
STORAGE DATA: 001 010 000
MASK INFORMATION: 111 111 000
ASSOCIATIVE MEMORY WORD 44-4-1
STORAGE DATA: 001 010 110
MASK INFORMATION: 111 111 111
ASSOCIATIVE MEMORY WORD 44-5-1
STORAGE DATA: 001 000 000
MASK INFORMATION: 111 000 000
ASSOCIATIVE MEMORY WORD 44-1-2
STORAGE DATA: 010 000 000
MASK INFORMATION: 111 000 000
ASSOCIATIVE MEMORY WORD 44-2-2
STORAGE DATA: 011 000 000
MASK INFORMATION: 111 000 000
ASSOCIATIVE MEMORY WORD 44-3-2
STORAGE DATA: 010 011 000
MASK INFORMATION: 111 111 000
ASSOCIATIVE MEMORY WORD 44-4-2
STORAGE DATA: 010 011 100
MASK INFORMATION: 111 111 111
ASSOCIATIVE MEMORY WORD 44-5-2
STORAGE DATA: 010 011 101
MASK INFORMATION: 111 111 111
LOGICAL AND MEANS
MEMORY MEANS
37-1-1 37-1-2 38-1 39-1 40-1 43-1 5-1
37-2-1 37-2-2 38-2 39-2 40-2 43-2 5-2
37-3-1 37-3-2 38-3 39-3 40-3 43-3 5-3
37-4-1 37-4-2 38-4 39-4 40-4 43-4 5-4
37-5-1 37-5-2 38-5 39-5 40-5 43-5 5-5
INTERMEDIATE DATA 93-1
001 010 000 (=1.2.0)
INTERMEDIATE DATA 93-2
010 011 101 (=2.3.5)
85-1
85-2
10-1
11-1
10-2
11-2
6
28
12
INTERNAL VARIABLE p=1 "STORAGE"
MAIN CONTROLLER
41
42
1 ASSOCIATIVE MEMORY

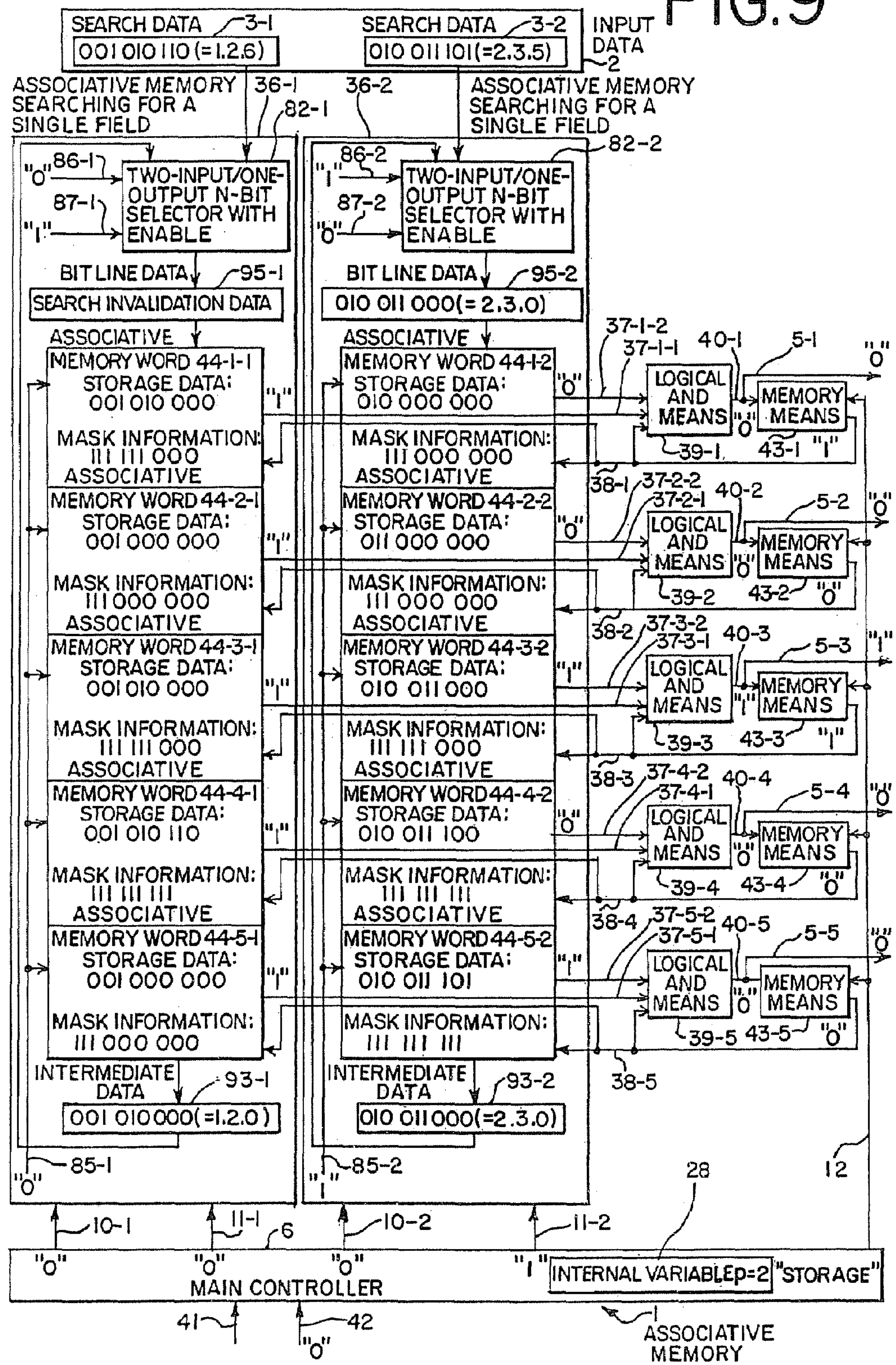
FIG.9
SEARCH DATA 3-1
001 010 110 (=1.2.6)
SEARCH DATA 3-2
010 011 101(=2.3.5)
INPUT DATA 2
ASSOCIATIVE MEMORY SEARCHING FOR A SINGLE FIELD
TWO-INPUT/ONE-OUTPUT N-BIT SELECTOR WITH ENABLE
BIT LINE DATA
SEARCH INVALIDATION DATA
010 011 000(= 2.3.0)
ASSOCIATIVE MEMORY WORD 44-1-1
STORAGE DATA: 001 010 000
MASK INFORMATION: 111 111 000
ASSOCIATIVE MEMORY WORD 44-1-2
STORAGE DATA: 010 000 000
MASK INFORMATION: 111 000 000
ASSOCIATIVE MEMORY WORD 44-2-1
STORAGE DATA: 001 000 000
MASK INFORMATION: 111 000 000
ASSOCIATIVE MEMORY WORD 44-2-2
STORAGE DATA: 011 000 000
MASK INFORMATION: 111 000 000
ASSOCIATIVE MEMORY WORD 44-3-1
STORAGE DATA: 001 010 000
MASK INFORMATION: 111 111 000
ASSOCIATIVE MEMORY WORD 44-3-2
STORAGE DATA: 010 011 000
MASK INFORMATION: 111 111 000
ASSOCIATIVE MEMORY WORD 44-4-1
STORAGE DATA: 001 010 110
MASK INFORMATION: 111 111 111
ASSOCIATIVE MEMORY WORD 44-4-2
STORAGE DATA: 010 011 100
MASK INFORMATION: 111 111 111
ASSOCIATIVE MEMORY WORD 44-5-1
STORAGE DATA: 001 000 000
MASK INFORMATION: 111 000 000
ASSOCIATIVE MEMORY WORD 44-5-2
STORAGE DATA: 010 011 101
MASK INFORMATION: 111 111 111
LOGICAL AND MEANS
MEMORY MEANS
INTERMEDIATE DATA
001 010000(=1.2.0)
010 011000(=2.3.0)
MAIN CONTROLLER
INTERNAL VARIABLEp=2
"STORAGE"
ASSOCIATIVE MEMORY INPUT DATA
SEARCH DATA
SEARCH DATA
2
3-1
3-r
26-1
26-r
ASSOCIATIVE MEMORY
29
ASSOCIATIVE MEMORY SEARCHING FOR A SINGLE FIELD
ASSOCIATIVE MEMORY SEARCHING FOR A SINGLE FIELD
8-1-1-1
8-1-n-1
8-1-1-r
8-1-s-r
DATA CELL
MASK CELL
9-1-1-1
9-1-n-1
9-1-1-r
9-1-s-r
5-1
ASSOCIATIVE MEMORY WORD
27-1-1
27-1-r
37-1
8-m-1-1
8-m-n-1
8-m-1-r
8-m-s-r
9-m-1-1
9-m-n-1
9-m-1-r
9-m-s-r
5-m
27-m-1
27-m-r
37-m
CONTROLLER
45-1
45-r
12
10-1
11-1
10-r
11-r
6
28
MAIN CONTROLLER
INTERNAL VARIABLE p
41
42

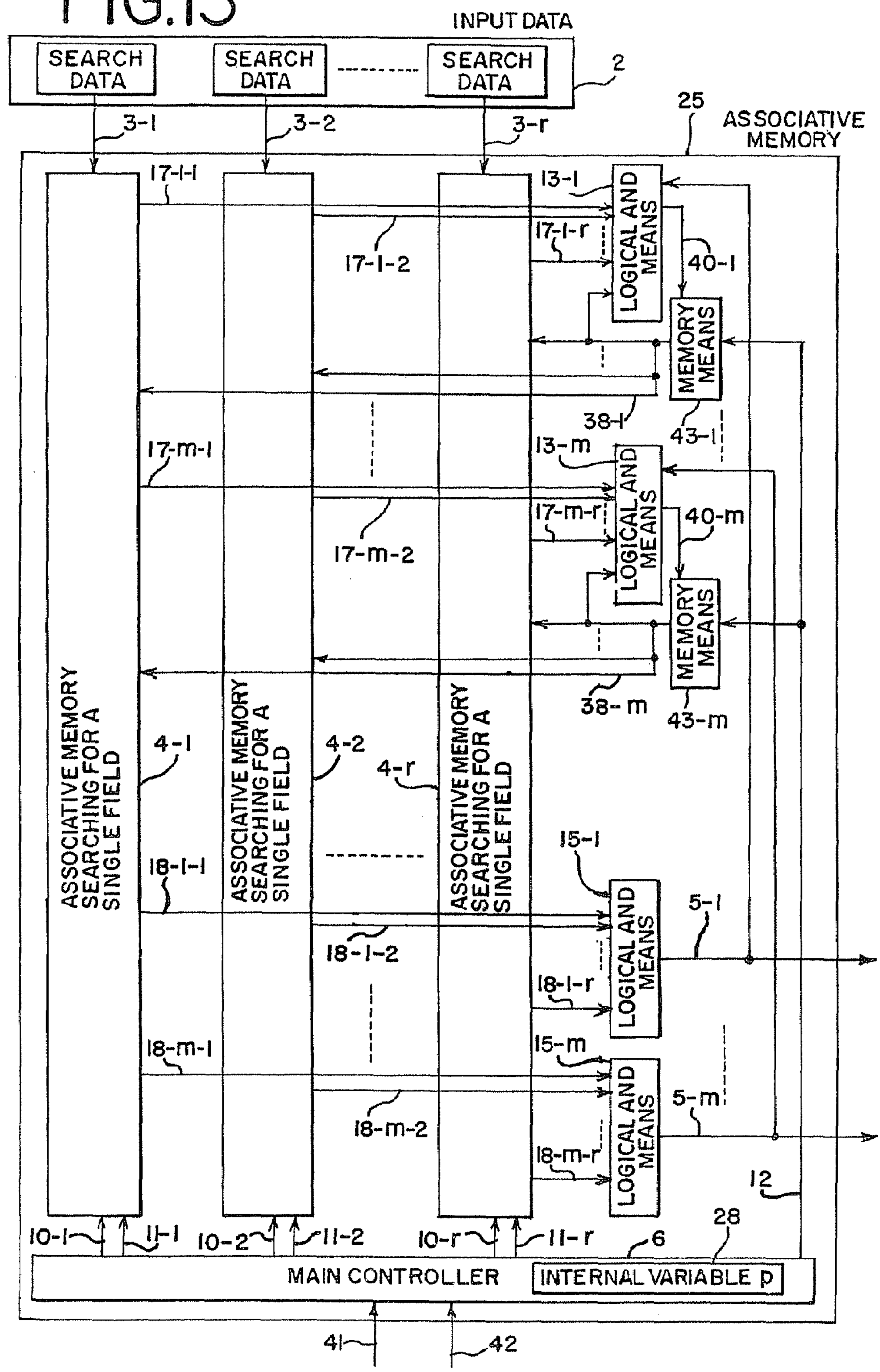
FIG.13
INPUT DATA
SEARCH DATA
SEARCH DATA
SEARCH DATA
2
25
ASSOCIATIVE MEMORY
3-1
3-2
3-r
17-1-1
17-1-2
17-1-r
13-1
LOGICAL AND MEANS
40-1
MEMORY MEANS
38-1
43-1
17-m-1
17-m-2
17-m-r
13-m
LOGICAL AND MEANS
40-m
MEMORY MEANS
38-m
43-m
ASSOCIATIVE MEMORY SEARCHING FOR A SINGLE FIELD
ASSOCIATIVE MEMORY SEARCHING FOR A SINGLE FIELD
ASSOCIATIVE MEMORY SEARCHING FOR A SINGLE FIELD
4-1
4-2
4-r
15-1
18-1-1
18-1-2
18-1-r
LOGICAL AND MEANS
5-1
18-m-1
18-m-2
18-m-r
15-m
LOGICAL AND MEANS
5-m
12
28
10-1
11-1
10-2
11-2
10-r
11-r
6
MAIN CONTROLLER
INTERNAL VARIABLE p
41
42

INPUT DATA
SEARCH DATA
SEARCH DATA
ASSOCIATIVE MEMORY
ASSOCIATIVE MEMORY SEARCHING FOR A SINGLE FIELD
PRIMARY ASSOCIATIVE MEMORY
DATA CELL
MASK CELL
ASSOCIATIVE MEMORY WORD
INTERMEDIATE DATA
SECONDARY ASSOCIATIVE MEMORY
LOGICAL AND MEANS
MEMORY MEANS
MAIN CONTROLLER
INTERNAL VARIABLE p

SEARCH DATA 3-1
001 010 110 (=1.2.6)
SEARCH DATA 3-2
010 011 101 (=2.3.5)
INPUT DATA 2
ASSOCIATIVE MEMORY SEARCHING FOR A SINGLE FIELD
PRIMARY ASSOCIATIVE MEMORY
INTERMEDIATE DATA
001 010 110 (=1.2.6)
011 011 101 (=3.3.5)
SECONDARY ASSOCIATIVE MEMORY
LOGICAL AND MEANS
MEMORY MEANS
ASSOCIATIVE MEMORY
MAIN CONTROLLER
INTERNAL VARIABLE p=1
"FORMAT"

SEARCH DATA 3-1
001 010 110 (=1.2.6)
SEARCH DATA 3-2
010011101 (=2.3.5)
INPUT DATA 2
ASSOCIATIVE MEMORY SEARCHING FOR A SINGLE FIELD
PRIMARY ASSOCIATIVE MEMORY
ASSOCIATIVE MEMORY WORD
STORAGE DATA:
MASK INFORMATION:
LOGICAL AND MEANS
MEMORY MEANS
INTERMEDIATE DATA
001 010 110 (=1.2.6)
011 011 101 (=3.3.5)
SECONDARY ASSOCIATIVE MEMORY
ASSOCIATIVE MEMORY
MAIN CONTROLLER
INTERNAL VARIABLE p=1
"STORAGE"

SEARCH DATA 3-1
001 010 110 (=1.2.6)
SEARCH DATA 3-2
010 011 101 (=2.3.5)
INPUT DATA 2
ASSOCIATIVE MEMORY SEARCHING FOR A SINGLE FIELD
PRIMARY ASSOCIATIVE MEMORY
INTERMEDIATE DATA
001 010 000 (=1.2.0)
010 011 101 (=2.3.5)
SECONDARY ASSOCIATIVE MEMORY
LOGICAL AND MEANS
MEMORY MEANS
ASSOCIATIVE MEMORY
MAIN CONTROLLER
INTERNAL VARIABLE p=1
"STORAGE"

SEARCH DATA 3-1
001 010 110 (=1.2.6)
SEARCH DATA 3-2
010 011 101 (=2.3.5)
INPUT DATA 2
ASSOCIATIVE MEMORY SEARCHING FOR A SINGLE FIELD
PRIMARY ASSOCIATIVE MEMORY
ASSOCIATIVE MEMORY WORD
STORAGE DATA:
MASK INFORMATION:
LOGICAL AND MEANS
MEMORY MEANS
INTERMEDIATE DATA
001 010 000 (=1.2.0)
010 011 000 (=2.3.0)
SECONDARY ASSOCIATIVE MEMORY
ASSOCIATIVE MEMORY 25
MAIN CONTROLLER
INTERNAL VARIABLE p=2
"STORAGE"

INPUT DATA
SEARCH DATA
SEARCH DATA
ASSOCIATIVE MEMORY
ASSOCIATIVE MEMORY SEARCHING FOR A SINGLE FIELD
ASSOCIATIVE MEMORY SEARCHING FOR A SINGLE FIELD
PRIMARY ASSOCIATIVE MEMORY
DATA CELL
MASK CELL
ASSOCIATIVE MEMORY WORD
INTERMEDIATE DATA
SECONDARY ASSOCIATIVE MEMORY
MAIN CONTROLLER
INTERNAL VARIABLE p 32-1
51-1
80-1-1
ASSOCIATIVE MEMORY WORD
52-1
51-n
80-1-n
52-n
ASSOCIATIVE MEMORY CELL
8-1-1
DATA CELL
56-1-1
53-1
8-1-n
56-1-n
55-1-1
55-1-n
a
b
COMPARATOR
en
MASK
OUT
17-1
10
9-1-1
MASK CELL
54-1
9-1-n
32-m
80-m-1
80-m-n
8-m-1
53-m
8-m-n
56-m-1
56-m-n
55-m-1
55-m-n
17-m
9-m-1
54-m
9-m-n
Vdd
57-1
57-n
58-1
58-n
92-1
92-n
31
PRIMARY ASSOCIATIVE MEMORY
93
INTERMEDIATE DATA

INPUT DATA
SEARCH DATA
SEARCH DATA
SEARCH DATA
47
46
3-1
3-r
48
17-1-1
91-1
LOGICAL AND MEANS
40-1
17-1-r
90-1
MEMORY MEANS
38-1
43-1
49
ASSOCIATIVE MEMORY
17-m-1
91-m
LOGICAL AND MEANS
17-m-r
40-m
90-m
MEMORY MEANS
38-m
43-m
ASSOCIATIVE MEMORY SEARCHING FOR A SINGLE FIELD
4-1
ASSOCIATIVE MEMORY SEARCHING FOR A SINGLE FIELD
4-r
15-1
18-1-1
LOGICAL AND MEANS
5-1
18-1-r
15-m
18-m-1
LOGICAL AND MEANS
5-m
18-m-r
12
10-1
11-1
10-r
11-r
6
28
MAIN CONTROLLER
INTERNAL VARIABLE p
41
42

ASSOCIATIVE MEMORY HAVING A MASK FUNCTION FOR USE IN NETWORK DEVICES AND NETWORK SYSTEM

This application is a continuation of U.S. application Ser. No. 10/475,031 filed with a 371(c) date of Dec. 8, 2003 (now U.S. Pat. No. 6,956,756) which is a 371 of PCT/JP01/03562 filed Apr. 25, 2001.

The present invention relates to a network system having a network device using an associative memory and, in particular, to an associative memory having a mask function.

BACKGROUND OF THE INVENTION

The function that calculates the permission of transfer is indispensable to conventional network devices in order to ensure conventional security of conventional computer network system, as follows.

Referring to FIG. 33, a conventional computer network will be described. A user or subscriber of the network possesses a user's terminal, such as a computer terminal, for concatenation to the network. A user's terminal is assigned with a specific network address in accordance with a predetermined rule when it is concatenated to the network in order to be distinguished from other user's terminals. Herein, the network address is represented by a numeral of a plurality of digits of, for example, first through third digits (a, b, c). The predetermined rule defines a hierarchical structure of the network address. The predetermined rule defines a hierarchical structure of the network address. For example, the first digit of the numeral represents a nation, such as England, Germany, and Japan. The second digit of the numeral represents a city in the nation, and the third digit of the numeral represents a company name in the city. In the following description, these hierarchical items will be called segments. Referring to FIG. 33, each segment is depicted by a rectangular block. Specifically, the network includes a first segment (SEGMENT1), second segment (SEGMENT2), and a third segment (SEGMENT3) at a highest hierarchical level. The first segment (SEGMENT1) includes the fourth segment (SEGMENT4) and the fifth segment (SEGMENT5). Likewise, the second segment (SEGMENT2) and the third segment (SEGMENT3) include the sixth segment (SEGMENT6) and the seventh segment (SEGMENT7), respectively. A user's terminal (PC) 401-1 exists in the fourth segment. Likewise, a user's terminal (PC) 401-2 and a user's terminal (PC) 401-3 exists in the sixth segment. The first segment possesses a network address (1, *, *) in which a first digit alone is specified as "1". The fourth segment subordinate to the first segment possesses a network address (1, 2, *) in which first and second digits "1" and "2" are specified. Like wise, the fifth segment subordinate to the first segment possesses a network address (1, 3 *) in which first and second digits "1" and "3" are specified. Thus, the user's terminal 401-1 in the fourth segment possesses a specific or unique network address (1, 2, 6). The second segment possesses a network address (2, *, *) in which a first digit alone is specified as "2". The sixth segment subordinate to the second segment possesses a network address (2, 3, *) in which first and second digits "2" and "3" are specified. Thus, the user's terminal 401-2 and 402-3 in the sixth segment possesses a specific or unique network address (2, 3, 4) and (2, 3, 5) respectively. The third segment possesses a network address (3, *, *) in which a first digit alone is specified as "3". The seventh segment subordinate to the third segment possesses network address (3, 5, *) in which first and second digits "3" and "5" are specified. A symbol "*" contained in these addresses represents "don't care".

Each digit of each network address is represented by a binary number of three bits. Thus, each network address is represented by a bit sequence of nine bits in total. For example, a network address (1, 2, *) is represented by a bit sequence (001, 010, 000). In the following description, these bit sequences will be called storage data. Since the symbol "*" represents "don't care" for the third digit, it is necessary to indicate that the first six bits (001, 010) in the storage data (001, 010, 000) alone are valid and the remaining bits (000) are invalid. For this purpose, mask information (or mask data) is combined with storage data. In the following description, these pairs will be called structured data. In the illustrated example, the mask information (or mask data) is given by a bit sequence (111, 111, 000). Herein, "0" and "1" represent a mask invalid state and a mask valid state, respectively.

In order to concatenate or establish communication between a plurality of user's terminals in the network, each segment is provided with a network device, for example, a router. As illustrated in FIG. 33, the first segment, the second segment, the third segment, the forth segment, the fifth segment, the sixth segment, and the seventh segment are provided with the first network device 400-1, the second network device 400-2, the third network device 400-3, the fourth network device 400-4, the fifth network device 400-5, the sixth network device 400-6, and the seventh network device 400-7, respectively. As illustrated in FIG. 33, each network device is concatenated to any user's terminals or any network devices subordinate to the corresponding segment. In addition, the first network device 400-1 is concatenated to the network device 400-2, the network device 400-3, and the network device 400-6.

Each network device in the corresponding segment is supplied from any user's terminals or any network devices concatenated to the network devices with communication data, and a source network address and destination network address annexed thereto. With reference to the source network address, the destination network address and predetermined transfer rule, the network device calculates a permission of transfer. Furthermore, with reference to the destination network address and the relationship of connection of network apparatuses, the network device calculates an optimum transfer route and produces a transfer network address. Herein, the network device controls a communication data transfer.

Herein, description will be made about the case where the associative memory is applied to the network device 400-1 in FIG. 33. It is assumed that the transferring the input data to a network device 400-6 having a network address (2, 3, *) is more optimum than to another network device 400-2 having a network address (2, *, *). In other words, it is optimum here to select the network device having the least number of bits in a mask valid state, in the network devices corresponding to the network address coincident with each other, taking the destination network address and the mask information into account, into a valid state.

Table 1(a) shows one setting of transfer rule in the computer network described in this example:

TABLE 1(a)

| | |
|---|---|
| TRANSFER RULE 1: | PERMIT TRANSFER FROM THE INTERNAL OF SEGMENT 4 TO THE INTERNAL OF SEGMENT 2 |

TABLE 1(a)-continued

| | |
|---|---|
| TRANSFER RULE 2: | PERMIT TRANSFER FROM THE INTERNAL OF SEGMENT 1 TO THE INTERNAL OF SEGMENT 3 |
| TRANSFER RULE 3: | REJECT TRANSFER FROM THE INTERNAL OF SEGMENT 4 TO THE INTERNAL OF SEGMENT 6 |
| TRANSFER RULE 4: | PERMIT TRANSFER FROM INTERNAL PC401-1 OF SEGMENT 4 TO INTERNAL PC401-2 OF SEGMENT 6 |
| TRANSFER RULE 5: | REJECT TRANSFER FROM THE INTERNAL OF SEGMENT 1 TO INTERNAL PC401-3 OF SEGMENT 6 |

TABLE 1(b)

| TRANSFER RULE | SOURCE NETWORK ADDRESS | DESTINATION NETWORK ADDRESS | PERMIT = 1 REJECT = 0 |
|---|---|---|---|
| 1 | (1. 2. *)<br>STORAGE DATA<br>"001 010 000" = (1. 2. 0)<br>MASK INFORMATION<br>"111 111 000" = (7. 7. 0) | (2. *. *)<br>STORAGE DATA<br>"010 000 000" = (2. 0. 0)<br>MASK INFORMATION<br>"111 000 000" = (7. 7. 0) | 1 |
| 2 | (1. *. *)<br>STORAGE DATA<br>"001 000 000" = (1. 0. 0)<br>MASK INFORMATION<br>"111 000 000" = (7. 7. 0) | (3. *. *)<br>STORAGE DATA<br>"011 000 000" = (3. 0. 0)<br>MASK INFORMATION<br>"111 000 000" = (7. 0. 0) | 1 |
| 3 | (1. 2. *)<br>STORAGE DATA<br>"001 010 000" = (1. 2. 0)<br>MASK INFORMATION<br>"111 111 000" = (7. 7. 0) | (2. 3. *)<br>STORAGE DATA<br>"010 011 000" = (2. 3. 0)<br>MASK INFORMATION<br>"111 111 000" = (7. 7. 0) | 0 |
| 4 | (1. 2. 6)<br>STORAGE DATA<br>"001 010 110" = (1. 2. 6)<br>MASK INFORMATION<br>"111 111 111" = (7. 7. 7) | (2. 3. 4)<br>STORAGE DATA<br>"010 011 100" = (2. 3. 4)<br>MASK INFORMATION<br>"111 111 111" = (7. 7. 7) | 1 |
| 5 | (1. *. *)<br>STORAGE DATA<br>"001 000 000" = (1. 0. 0)<br>MASK INFORMATION<br>"111 000 000" = (7. 0. 0) | (2. 3. 5)<br>STORAGE DATA<br>"010 011 101" = (2. 3. 5)<br>MASK INFORMATION<br>"111 111 111" = (7. 7. 7) | 0 |

Rule 1 defines that transfer from subordinate to segment 4 to subordinate to segment 2 is permitted. Rule 2 defines that transfer from subordinate to segment 1 to subordinate to segment 3 is permitted. Rule 3 defines that transfer from subordinate to segment 4 to subordinate to segment 6 is prohibited. Rule 4 defines that transfer from PC401-1 subordinate to segment 4 to PC401-2 subordinate to segment 6 is permitted. Rule 5 defines that transfer from subordinate to segment 1 to PC401-3 subordinate to segment 6 is prohibited. When source network address and destination network address are represented by a pair of storage data and mask information, the transfer rule of Table1(a) can be described as Table1(b). These transfer rules are necessary for security of computer network system. In case of the transfer from segment 4 to segment 6 under the transfer rule of Table1(a), vital data stored in PC401-3, for example, can be protected from unlawful access, copy, falsification, and elimination, because only the transfer from PC401-1 to PC401-2 is permitted and all other transfer is prohibited.

Herewith, the user's terminals are not directly connected by the use of the communication channels but carry out communication by controlling the transfer of communication data by the use of communication control functions of the network devises. Thus, communication channels as limited resources are saved while security is ensured.

Next, referring to FIG. 34, the conventional network device 422 is used in the network devise 400-1 in FIG. 33.

The network device 422 is supplied with input transfer data 402, and produce output transfer data 403. The input transfer data 402 comprises a source network address 404, a transfer network address 405, a destination network address 406, and data division 407. The output transfer data 403 comprises a source network address 406, a second transfer network address 408, a destination network address 406, and data division 407. Since the conventional network device 422 is used in the network device 400-1 of FIG. 33, as will readily be understood, the transfer network address 405 in the input transfer data 402 is the network address of the network devise 400-1 itself in FIG. 34.

The network device 422 comprises a source network address 409, a destination network address 410, an associative memory 101, a CPU 413, an encoder 414, a memory 416, a transfer network address changing section 418, and data transfer division 421.

The source network address extracting section 409 extracts the source network address 404 contained in the input transfer data 402, and supplies it to the CPU 413 as the source network address 411. The destination network address extracting section 410 extracts the destination network address 402 contained in the input transfer data 402, and supplies it to the associative memory 101 and the CPU 413 as the destination network address 412.

Among the network devices concatenated with the network device 422 in the network, the network address of the segment of the network device out of the network to which the network device 422 belongs, is memorized in the associative memory word 102 in the associative memory 101 of the network device 422. Herein, in FIG. 34, description will be made about the case where the conventional network device is used in the network device 400-1 in FIG. 33. The network address (2, *, *), to which the network device 400-2 belongs, is memorized in the associative memory word 102-1. Specifically, the associative memory word 102-1 stores in binary numbers the storage data (010, 000, 000) and the mask information (111,000,000) to implement (2, *, *) represented by structured data format. Likewise, the network address (2, 3, *), to which the network device 400-6 belongs, is memorized in the associative memory word 102-2, and the network address (3, *, *), to which the network device 400-3 belongs, is memorized in the associative memory word 103-3, respectively. The associative memory 101 possesses searching (or retrieving) function or mask searching function in addition to write/read functions of writing and reading storage data (namely, the address data) at a designated memory address in the matter similar to an ordinary memory circuit. Specifically, the associative memory 101 possesses the mask searching function to put the only match line 115 corresponding to the storage data with the least number of bits in a mask valid state, in the match lines 105-1 through 105-3 corresponding to one of the storage data coincident with the input destination network address 412 taking the mask information into account, into a valid state. The pending patent application 2000-181406 can be cited as one example of the associative memory 101.

The encoder 414 encodes the match lines 105-1 through 105-3, supplied by the associative memory 101, into a memory address signal 415. The memory 416 stores the network addresses of the network device corresponding to the segment network addresses, each of which comprises the storage data and the mask information, and each of which is stored in each associative memory word of the associative memory 101. In the memory 416, each network device network address is memorized in a word corresponding to the associative memory word of the associative memory 101 where a corresponding network address is memorized. For example, the network address (2, *, *) is stored in the first associative memory word 102-1 of the associative memory 101 while the network address of the network device 400-2 (FIG. 33) corresponding thereto is stored in the first word of the memory 416. Similarly, the network address of the network device 400-6, the network address of the network device 400-3, are stored in the second word and the third word of the memory 416, respectively. Supplied with the memory address signal 415 as a read address, the memory 416 produces a memory data signal 417 stored in the word designated by the memory address signal 415.

The transfer network address 418 produces the changed transfer data 419 by changing the transfer network address 405 of input transfer data 402 into memory data signal 417, and supplies it to the data transfer division 421. The CPU 413 determines the transfer permission under the rule indicated in the table (a), and supplies the result of the determination to the data transfer field 421 as the transfer control signal 420. The data transfer division 421 produces the changed transfer data 419 as the output transfer data 403 when the transfer control signal 420 permits the transfer. Otherwise, the data transfer division 421 does not produce the changed transfer data when the transfer control signal prohibits the transfer.

It is assumed that the source network address 404 in the input transfer data 402 is (1, 2, 3), and the destination network address 405 in the input transfer data 402 is (3, 5, 6). Upon completion of the searching operation in the associative memory 101, the match line 105-3 corresponding to the network address (3, *, *) in the associative memory word 102-3 alone is put into a valid state. Then, the encoder 414 produces "3" as the memory address 403. The memory 416 produces the memory data signal 417 representative of the network address of the network device 400-3. The transfer network address changing section 418 changes the transfer network address 405 in the input transfer data 402 into the network address of the network device 400-3, and supplies it to the data transfer field 421 as the changed transfer data 419. Since the source network address information 411 is (1, 2, 3) and the destination network address information 412 is (3, 5, 6), CPU 413 applies the transfer rule 2, and supplies the transfer control signal 420 to the data transfer field 421 with transfer permitted state. Consequently, the data transfer field 421 transfers the changed transfer data 419 as the output transfer data 403 to the router 400-3. The router 400-3 is responsive to the transfer data and performs the operation similar to that mentioned above. Thus, the transfer data are successively transferred with security from network devices to network devices on the optimised route until the user's terminal at the destination network address (3, 5, 6) is reached.

Description of the Conventional Associative Memory

Herein, referring to FIG. 28, a typical conventional associative memory will be described. An associative memory 101 comprises a two-input/one-output n-bit selector 123, first through m-th n-bit associative memory words 102, an n-bit latch 121, a controller 130, and the first through n-th logical gate 116. The j-th associative memory word 102-*j* combines the associative memory cells 107-*j*-1 through 107-*j*-*n*, n in number. The j-th associative memory word 102-*j* (where j is and integer variable between 1 and m, both inclusive) comprises first through n-th associative memory cells 107-*j*-1 through 107-*j*-*n*. Each of the associative memory words 102-*j* is concatenated to the corresponding data word line 103-*j* the corresponding mask word line 106-*j*, and comparison control line as input lines and to the corresponding mask match line 105-*j* and the first through the n-th shortest mask lines 114 as output lines and to the first through the n-th bit lines 113 as data input/output lines.

The k-th associative memory cells of the j-th associative memory word, 107-*j*-*k* (where k is and integer variable between 1 and n, both inclusive), is concatenated to the corresponding data word line 103-*j*, the corresponding mask word line 106-*j*, and comparison control line 104 as input lines, and to the corresponding data match line 105-*j* and the corresponding matched data intermediate logic line 114-*k* as output lines, and to the corresponding bit line 113-*k* as data input/output line.

The associative memory cell 107-*j*-*k* comprises a data cell 108-*j*-*k*, a comparator 110-*j*-*k*, a mask cell 109-*j*-*k*, and logical gate 111-*j*-*k*. The data cell 108-*j*-*k* is for storing "data" bit information at a corresponding bit of storage data supplied from an external source through a bit line 113-*k*. The comparator 110-*j*-*k* is for comparing the "data" bit information memorized in the data cell 108-*j*-*k* and the information supplied from the external source through the bit line 113-*k*. The mask cell 109-*j*-*k* is for storing "mask" bit information of a corresponding bit of mask information supplied from the external source through the bit line 113-*k*. Herein, when the bit information stored in the mask cell 109-*i*-*k* is in a valid state for mask information, an invalid state for storage data is stored in the corresponding data cell 108-*j*-*k*.

In this embodiment, a valid state and an invalid state for the mask information are represented by "0" and "1". A valid state and an invalid state are represented by "1" and "0", respectively, for all of the storage data, the matched data logical-OR lines 117-1 through 117-*n*, and the match lines 105-1 through 105-*m*.

The data cell 108-*j*-*k* stores as the storage data the state on a corresponding bit line 113-*k* on which the write data is driven when a corresponding data word line 103-*j* is in a valid state, or supplies the storage data stored therein to the corresponding bit line 113-*k* on which the write data is not driven when a corresponding data word line 103-*j* is in a valid state. When the corresponding data word line 103-*j* is in an invalid state, no operation is performed for the corresponding bit line 113-*k*. Irrespective of the state of the corresponding data word line 103-*j*, the storage data stored therein is supplied to the comparator 110-*j*-*k* and the logical gate 111-*j*-*k* in the same associative memory cell 107-*j*-*k*.

The mask cell 109-*j*-*k* stores as the mask information the state on a corresponding bit line 113-*k* on which the write data is driven when a corresponding mask word line 106-*j* is in a valid state, or supplies the mask information stored therein to the corresponding bit line 113-*k* on which the write data is not driven when a corresponding mask word line 106-*j* is in a valid state. When the corresponding mask word line 106-*j* is in an invalid state, no operation is performed for the corresponding bit line 113-*k*. Irrespective of the state of the corresponding mask word line 106-*j*, the mask information stored therein is supplied to the comparator 110-*j*-*k* in the same associative memory cell 107-*j*-*k*.

Prior to the start of the searching operation, the first through m-th data match line 105 is precharged to a high level to be put into a valid state "1".

The comparator 110-*j*-*k* is supplied with the value of the search data on the corresponding bit line 113-*k*, the storage data stored in the data cell 108-*j*-*k* in the same associative memory cell 107-*j*-*k*, the mask information stored in the mask cell 109-*j*-*k* in the same associative memory cell 107-*j*-*k*, and the comparison control signal 104. When the comparison control signal 104 is in an invalid state "0" and the mask information is in a valid state "0", the comparator 110-*j*-*k* puts the corresponding match line 105 into an opened state. Otherwise, if the value on the corresponding bit line 113-*k* and the storage data stored in the data cell 108-*j*-*k* are coincident with each other, the corresponding match line 105-*j* is put into an opened state. Upon incoincidence, the corresponding match line 105-*j* is put into an invalid state "0". Thus, the wired AND logic concatination with the valid state "1" for the match line 105-*j* as true is achieved such that, when all of the comparator 110-*j*-1 through 110-*j*-*n*, n in number, in the associative memory word 102-*j* render the match line 105-*j* in an opened state, the match line 105 is put into a valid state "1" and otherwise into an invalid state "0". In other words, upon the searching operation, only when the comparison control signal 104 is in an invalid state "0" and all of the storage data stored in an associative memory word 102-*j* is completely coincident with the bit lines 113-1 through 113-*n* except those bits excluded from a comparison object by the mask valid state "0" in the corresponding mask information, the match line 105-*j* is put into a valid state "1" and otherwise into an invalid state "0".

The logical gate 111-*j*-*k* supplies a state "0" to the matched data intermediate line 114-*k* when the match line 105-*j* in the same associative memory word 102-*j* is in a valid state "1" and the storage data stored in the corresponding data cell 108-*j*-*k* in the same associative memory cell 107-*j*-*k* is in an valid state for the storage data. Otherwise, the logical gate 111-*j*-*k* puts the matched data intermediate line 114-*k* into an opened state. Herein, since a valid state for the storage data is represented by "1"in this embodiment, when the storage data stored in the data cell 108-*j*-*k* is in an valid state "1" and the match line 105-*j* is in a valid state "1", the logical gate 111-*j*-*k* puts the corresponding matched data intermediate line 114-*k* into a state "0" and otherwise into an opened state.

Each of the matched data intermediate lines 114-*k* (where k is and integer variable between 1 and n, both inclusive) is pulled up by a corresponding register 115-*k* to be put into a state "1". The matched data intermediate line 114-*k* is concatenated to all of the corresponding logical gates 111-1-*k* through 111-*m*-*k*, m in number, by a wired logic concatenation. Thus, when all of the first through m-th logical gates 111 concatenated to the corresponding matched data intermediate line 114-*k* render the matched data intermediate line 114-*k* in an opened state, the matched data intermediate line 114-*k* is put into a valid state "1" and otherwise into an invalid state "0". In other words, the matched data intermediate line 114-*k* is concatenated by a wired AND concatenation.

Each of the logical gates 116-1 through 116-*n* supplies an inverted value of the corresponding matched data intermediate line 114-1 through 114-*n* to the corresponding matched data logical-OR line 117-1 through 117-*n*.

Therefore, the matched data logical-OR line 117-*k* (where k is and integer variable between 1 and n, both inclusive) is supplied with the result of the logical sum operation, with the valid state for the 105 storage data as true, of all the storage data stored in the corresponding data cells 108-1-*k* through 108-*m*-*k* in the associative memory cells 107-1-*k* through 107-*m*-*k* which have the match line 105 that is in a valid state "1" upon completion of the searching operation by the logical gate 116-*k*, the matched data intermediate line 114-*k*, the resister 115-*k*, and corresponding logical gates 111-1-*k* through 111-*m*-*k*, m in number. In this embodiment, the matched data logical-OR line 117-1 through 117-*n* are supplied with the result of the logical sum with the valid state "1" for 105 storage data as true. As mentioned above, upon completion of the searching operation, the matched data logical-OR line 117 is supplied with the same value of the storage data coincident with the search data 112 that has the least number of bits in a invalid state "0".

The n-bit latch 121 stores the states of the matched data logical-OR lines 117-1 through 117-*n* as stored states when a latch control signal 122 is in a valid state. The n-bit latch 121 supplies the stored states to the latch output lines 120-1 through 120-*n*.

With reference to the state of a selection signal 124, the two-input/one-output n-bit selector 123 selects, as output data to be supplied to the bit lines 113-1 through 113-*n*, either the search data 112-1 through 112-*n* or latch output lines 120-1 through 120-*n*.

The controller 130 supplies latch control signal 122, a selection signal 124, and comparison control signal 104 synchronizing with a clock signal 131, in order to control operation of the associative memory 101.

Detailed Description of the Conventional Associative Memory

Next referring to FIG. 29, the associative memory cell 107 will be described. Two bit lines 113*a* and 113*b* correspond to each bit line 113 illustrated in FIG. 28. In FIG. 28, each single bit line 113-*i* collectively represents these bit lines 113*a* and 113*b*. Through the two bit lines 113*a* and 113*b*, writing and reading of the data into and from the memory cell and the input of the search data 112 are carried out. Upon writing the data or the input of the search data 112, the bit line 113*b* is supplied with an inverted value of a value on the bit line 113*a*. The data cell 108 is a typical SRAM (Static Random Access Memory) comprising inverted logical gates (G101 and G102) 301 and 302 with one's input and output terminals concatenated to the other's output and input terminals, respectively, a MOS (Metal Oxide Semiconductor) transistor (T101) 303 concatinateing the output terminal of the inverted logical gate (G102) 302 to the bit line 113*a* and rendered conductive when the data word line 103 has a high level, and a MOS transistor (T102) 304 concatinateing the output terminal of the inverted logical gate (G101) 301 to the bit line 113*b* and rendered conductive when the data word line 103 has the high level.

The mask cell 109 is also a typical SRAM comprising inverted logical gates (G103 and G104) 310 and 311 with one's input and output terminals concatenated to the other's output and input terminals, respectively, a MOS transistor (T108) 312 concatinateing the output terminal of the inverted logical gate (G104) 311 to the bit line 113*a* and rendered conductive when the mask word line 106 has the high level, and a MOS transistor (T109) 313 concatinateing the output terminal of the inverted logical gate (G103) 310 to the bit line 113*b* and rendered conductive when the mask word line 106 has the high level.

The comparator 110 comprises a MOS transistor (T103) 305, a MOS transistor (T104) 306, a MOS transistor (T105) 307, a MOS transistor (T106) 308, and a MOS transistor (T107) 309. The MOS transistor (T103) 305 and the MOS transistor (T104) 306 are inserted between the bit lines 113*a* and 113*b* in cascade. The MOS transistor (T103) 305 is rendered conductive when the inverted logical gate (G101) 301 in the data cell 108 produces an output of a high level. The MOS transistor (T104) 306 is rendered conductive when the inverted logical gate (G102) 302 in the data cell 108 produces an output of a high level. The MOS transistor (T106) 308 and the parallel connection of the MOS transistor (T107) 309 and the MOS transistor (T105) 307 are connected between a low potential and the match line 5 in cascade. The MOS transistor (T106) 308 is rendered conductive when the inverted logical gate (G104) 311 in the mask cell 109 produces an output of a high level. The MOS transistor (T107) 309 is rendered conductive when the comparison control signal 104 is in a valid state "1".

The MOS transistor (T105) 307 is rendered conductive when a junction or node of the MOS transistor (T103) 305 and the MOS transistor (T104) 306 has a potential of a high level. When both the bit line 113*a* and the inverted logical gate (G101) 301 produce outputs of a high level or when both the bit line 113*b* and the inverted logical gate (G102) 302 produce outputs of a high level, the junction of the MOS transistor (T103) 305 and the MOS transistor (T104) 306 has a high level to render the MOS transistor (T105) 307 conductive.

Therefore, when the storage data stored in the data cell 108 and the search data 112 on the bit lines 113*a* and 113*b* are different from each other, the MOS transistor (T105) 307 is rendered conductive. The MOS transistor (T106) 308 is put into an opened state and conductive state when the mask information stored in the mask cell 109 is "0" and "1", respectively. The word match line 105 is precharged to a high potential prior to the start of the searching operation. This provides the wired AND concatenation such that, when a plurality of the associative memory cells 107 are concatenated to the match line 105 through both the MOS transistors (T106) 308 and the MOS transistors (T107) 309, the match line 105 is given a low level if at least one associative memory cell 107 produces an output of a low level.

When MOS transistor (T105) 307 is conductive and either of the MOS transistor (T106) 308 or the MOS transistor (T107) 309 is conductive, the associative memory cell 107 supplied an invalid state "0" to the match line 105. Otherwise, the match line 105 is put into an opened state. Specifically, when the mask information is in a valid state "0" and the comparison control signal 104 is in an invalid state "0", the match line 105 is put into an opened state irrespective of the comparison result between the search data 112 and the storage data. Otherwise, the match line 105 is put into an opened state and supplied with an invalid state "0", when the search data 112 on the bit lines 113*a* and 113*b* and the storage data stored in the data cell 108 are coincident with each other and different from each other, respectively.

Next, the logical gate 111 and the matched data intermediate line 114 will be described. The matched data intermediate line 114 is pulled up by a resister 115 (FIG. 28) to be put into a state "1" prior to a searching operation. The logical gate 111 comprises MOS transistors (T110 and T111) 314 and 315 concatenated in cascade between the matched data intermediate line 14 and a low potential. The MOS transistor (T110) 314 is put into a conductive state and an opened state when a match line 105 is in a valid state "1" and an invalid state "0", respectively. The MOS transistor (T111) 315 is put into a conductive state and an opened state when an inverted logical gate (G102) 302 in the data cell 108 produces an output of a high level and a low level, respectively, i.e., when the storage data stored in the data cell 108 is in an valid state "1" and a invalid state "0", respectively. Thus, the logical gate 111 supplies an state "0" to the matched data intermediate line 114 when the match line 105 is in a valid state "1" and the storage data stored in the data cell 108 is in an valid state "1". Otherwise, the logical gate 111 puts the matched data intermediate line 114 into an opened state.

Operation of the Conventional Associative Memory

Next referring to FIG. 30, description will be made about the operation when the above-mentioned associative memory 101 is used in calculating the transfer network address in the network device 400-1 in FIG. 33. Referring to FIG. 31, this operation will be described by the use of a timing chart.

It is assumed here that the associative memory 101 comprises three words of nine bits. The associative memory 101 memorizes the concatenation information in the associative memory words 102-1 through 102-3 except the network address (1, *, *) of the network device 400-1 in FIG. 33. Herein, when a digit of a network address is represented by the symbol "*" as "don't care", the corresponding bit of the storage data is stored with an invalid state "0" for the storage data, and the corresponding bit of the mask information is stored with a valid state "0" for the mask information.

Specifically, the associative memory word 102-1 stores in binary numbers the storage data (010, 000, 000) and the mask information (111, 000, 000) to implement (2, *, *). Likewise, the associative memory word 102-2 stores in binary numbers the storage data (010, 011, 000) and the mask information (111, 111, 000) to implement (2, 3, *). The associative memory word 102-3 stores in binary numbers the storage data (011, 000, 000) and the mask information (011, 000, 000) to implement (3, *, *).

Description will proceed to the searching operation by supplying as the search data 112 the network address (2, 3, 4), in octal numbers, of the user's terminal (PC) 401-2 in FIG. 112. At first, all of the match lines 105-1 through 105-3 are precharged to a high level ("1") to be put into a valid state "1" at the timing (1) in FIG. 31.

Next, the two-input/one-output 8-bit selector 123 is responsive to the selection signal 124 which the controller 130 supplies, and selects the search data 112 to deliver the search data 112 to the bit lines 113-1 through 113-9 at the timing (2) in FIG. 31. The controller 130 puts the comparison control line 104 into an invalid state "0" in order to permit each of the associative memory cells 107-1-1 through **107-*m-n* to puts the corresponding match line 105 into an opened state irrespective of the comparison result between the search data 112** and the storage data stored therein when the mask information stored therein is in a valid state "0". In other words, the searching operation is carried out taking the "don't care" state represented by the symbol "*" into account. Therefore, the octal notations (2, *, *), and (2, 3, *) respectively stored in the associative memory words 102-1, and 102-2 in the associative memory 101 are coincident with the search data 112 on the bit lines 113-1 through 113-9. Accordingly, as a result of the primary searching operation, the match lines 105-1, and 105-2 are put into a valid state "1" while the remaining match line, 105-3, is put into an invalid state "0".

Herein, the matched data logical-OR line 117-1 produces the logical sum "0", with "1" as true, of the storage bit data "0", in the memory words 102-2 at bit positions corresponding to the matched data logical-OR line 117-1. The matched data logical-OR line 117-2 produces the logical sum "1", with "1" as true, of the storage bit data "1", in the memory words 102-1 at bit positions corresponding to the matched data logical-OR line 117-2. Likewise, the matched data logical-OR lines 117-3, 117-4, 117-5, 117-6, 117-7, 117-8, and 117-9 produce the logical sum "0" of "0" and "0", the logical sum "0" of "0" and "0", the logical sum "1" of "0" and "1", the logical sum "1" of "0" and "1", the logical sum "0" of "0" and "0", the logical sum "0" of "0" and "0", and the logical sum "1" of "0" and "0", respectively, "1" as true. As a result, the binary notation "010011000" is delivered to the matched data logical-OR lines 117-1 through 117-9.

In this state, the controller 130 puts the latch control signal 122 into valid state. The n-bit latch 121 stores the states of the matched data logical-OR lines 117-1 through 117-9. Accordingly, the n-bit latch 21 stores the binary notation "010011000". The n-bit latch 121 delivers the stored state "010011000" to the latch output line 120-1 through 120-9.

The timing (3) in FIG. 31 is inserted in order to arrange the state of the clock signal 131 of the timing (2) and the timing (4) so that the associative memory 101 holds the states of the timing (2).

At the timing (4) in FIG. 31, in response to the selection signal 124 which the controller 130 supplies, the two-input/one-output n-bit selector 123 selects the latch output line 120 and supplies the information "010011000" on the latch output line 120 to the corresponding bit lines 113-1 through 113-9. Thereafter, the associative memory 101 starts a secondary searching operation. In the secondary searching operation, use is made of the states of result of the primary searching operation at the timing (2) that is maintained on the match lines 105-1 through 105-3. In this example of the operation, the two match lines 105-1 and 105-2 maintain a valid state "1" while the match line 105-3 maintains an invalid state "0". The controller 130 puts the comparison control signal 104 into valid state "1". Thus, each of the associative memory cells 107-1-1 through **107-*m-n* to puts the corresponding match line 105 into an invalid state "0" irrespective of the mask information stored therein when the storage data stored therein is different from the states of the bit lines 113-1 through 113-9**. In other words, the secondary searching operation is carried out irrespective of the "don't care" state represented by the symbol "*". Therefore, the match line 105-1 through 105-3 is put into an invalid state "0" when the storage data stored in the corresponding associative memory word 102-1 through 102-3 is different from the states "010011000" of the bit lines 113-1 through 113-9.

In this example of the operation, the storage data stored in the associative memory word 102-2 is completely coincident with the states "010011000" on the bit lines 113-1 through 113-9 so that the corresponding match line 105-2 is put into an opened state. Since the storage data stored in any other associative memory words 102-1 and 102-3 is not coincident, the corresponding match lines 105-1 and 105-3 are supplied with an invalid state "0". Thus, in the match line 105-1, and 105-2 that maintain a valid state "1" prior to the start of the secondary searching operation, the only match line 105-2 can maintain a valid state "1" upon completion of the secondary searching operation.

It will therefore be understood that, in the match lines 105 corresponding to one of the storage data coincident with the search data 112 taking the mask information into account, the only match line 105-2 corresponding to the storage data with the least number of bits in a mask valid state is put into a valid state.

The conventional associative memory 101 can not produce the storage data with the least number of bits in a mask valid state in the mask information field corresponding to one of the storage data field, which also corresponds to each network address, coincident with the plurality of the network address supplied for searching operation taking the mask information into account, when the plurality of the network address pair of the storage data and the mask information is memorized in one associative memory word, as follows.

Next referring to FIG. 32, description will be made about one example of the operation when the conventional associative memory 101 is used in determination of the transfer permission for the data transfer from PC401-1 with network address (1, 2, 6) to PC401-3 with network address (2, 3, 5).

The transfer rule 1 through 5 in the Table 1(b) defines that the pair of the structured data composed of the storage data and mask information is memorized in which each pair of structured data comprises 18 bits of concatenated storage data, with 9 bits of source network address and 9 bits of destination network address, and 18 bits of mask information with each 9 bits of corresponding mask information.

It is assumed here that the associative memory 101 comprises five words of eighteen bits. The nine bits of structured data of the source network address under each transfer rule in Table 1(b) combines nine bits of storage data and nine bits of mask information. Herein, each nine bits of storage data and nine bits of mask information is stored as the upper nine bits of each storage data and mask information of associative memory word 102-1 through 102-5 corresponding to each transfer rule. Likewise, the nine bits of structured data of the destination network address under each transfer rule in Table 1(b) combines nine bits of storage data and nine bits of mask information. Herein, each nine bits of storage data and nine bits of mask information is stored as the lower nine bits of each storage data and mask information of the associative memory word 102-1 through 102-5 corresponding to each transfer rule. As a result, eighteen bits of the structured data stored in the associative memory word 102-1 through 102-5 will be described as FIG. 32 shows.

Like the operation described above, in the primary searching operation, the search data 112 (1, 2, 6 2, 3, 5), in octal numbers, is supplied to the bit line 113, and associative memory 101 compares it regarding the storage data 10 associative memory word 102-1 through 102-5 and corresponding mask information. Therefore, the octal notations (1, 2, * 2, *, *), (1, 2, * 2, 3, *), (1, *, * 2, 3, 5) respectively stored in the associative memory words 102-1, 102-3 and 102-5 in the associative memory 101 are coincident with the search data 112 on the bit lines 113. Accordingly, as a result of the primary searching operation, three data match lines 105-1, 105-3 and 105-5 are put into a valid state "1" while the remaining data match lines 105-2, and 105-4 are put into an invalid state "0".

Herein, like the operation described above, in associative memory word 102-1 through 102-5, the result of the logical-OR of the eighteen bits of storage data, which corresponding match line 105 holds valid state "1", is stored in the n-bit latch 102 with the valid state "1", as true. Accordingly, the n-bit latch 121 stores the logically OR with the data stored in the associative memory word 102-1, 102-3, and 102-5, which is represented by (1, 2, 0, 2, 0, 0), (1, 2, 0, 2, 3, 0), and (1, 1, 0, 2, 3, 5) notation respectively, and "001, 010, 000, 010, 000, 000", "001, 010, 000, 010, 011, 000" and "001, 000, 000, 010, 011, 101" in binary notation respectively. The result of logical-OR is represented by (1, 2, 0, 2, 3, 5), in octal notation and "001, 010, 000, 010, 011, 101", in binary notation. Then the n-bit latch 121 stores this result and delivers it to the latch output line 120.

Like the operation described above, in the secondly searching operation, supply the search data 112 represented by (1, 2, 6 2, 3, 5), "001, 010, 000, 010, 011, 101", in octal notation and binary notation respectively, is supplied to the bit line 113, and compares it with the storage data stored in the associative memory word 102-1 through 102-5 and without regard to corresponding mask information. Accordingly, all the storage data stored in the associative memory word 102-1 through 102-5 are not coincident with each other, while all the match lines 105-1 through 105-5 are put into an invalid state "0".

It is assumed here that the data transfer from PC401-1 with network address (1, 2, 6) to PC401-3 with network address (2, 3, 5) will be prohibited by the transfer rule 3. In other words, the only match line 105-3 corresponding to the associative memory word 102-3 is supposed to be put into valid state "1". However, as described above, the match line 105-1 through 105-5 in the conventional associative memory are in an invalid state after searching operation.

Therefore, in order to ensure the security of the network, a function of determination of transfer permission based on the transfer rule to the source network address and destination network address of input transfer data is implemented by CPU using software processing with binary-tree-search algorithm in the conventional network devises as described above. This software processing requires hundreds of clock or more. Besides, even fast calculation of transfer network address is provided by an associative memory, the whole data transfer rate of the whole network declines if the security of the network is ensured.

In case of the determination of transfer permission by software processing with binary-tree-search algorithm, huge search table is required in advance. Therefore, transfer operation of network device is suspended while transfer rule is deleted, added, or changed. Consequently, since deletion, addition, or change of transfer rule is not operated frequently by a network administrator, whole network is operated under low security.

Furthermore, high speed determination of transfer permission requires costly high-speed CPU system, which means total cost of network device increase overall.

It is therefore an object of this invention is to provide an associative memory which produces the signal identifying particular word with the least number of bits in a valid state of mask information comparing, with order of priority, the number of bits in a valid state of mask information which consists of structure data at each field when two or more words are found, all of which storage data coincident with corresponding input data, in the searching operation against input data composed of plural search field taking mask information into account.

It is another object of this invention to provide a network devise which is capable of carrying one fast determination of transfer permission to input data based on transfer rule.

It is still another object of this invention to provide a network devise with ability of frequent deletion, addition, or change of transfer rule without suspending the transfer operation.

It is still another object of this invention to reduce the total cost of network devise with fast determination of transfer permission.

It is still another object of this invention to provide network system which is capable of ensuring the security with high data transfer rate.

SUMMARY OF THE INVENTION

According to a first aspect of the invention, there is provided an associative memory which stores mask information for every single word of storage data to indicate a valid state or an invalid state representative of whether or not every single bit or every plural bits of the storage data should be excluded from a search object; the associative memory comprising:

i) a first circuit means as a primary searching means for producing a primary distinguishing signal to distinguish a selected word, when all bits of an external search data composed of partial bits, n in number (where n is an integer variable 2 or more), are in a primary searching operation, the primary searching operation taking the mask information into account in order to exclude single or plural bits of the storage data from a search object when the corresponding mask information is in a valid state of mask information for each single word, ii) a second circuit means for producing an intermediate data which supply an intermediate data produced by a logical operation of storage data corresponding to words in a selected state, a logical operation of mask information corresponding to the words, and a logical operation of a single or plural pairs of external search data, iii) a third circuit means as a single or plural shared secondary searching means for producing a secondary distinguishing signal which distinguish a word selected from the search operation, when the intermediate data divided into n, n in number, are supplied similar to a composition of partial bit fields of the external search data, controlling whether or not a secondary search operation is to be carried out against only a bit field of the storage data or mask information corresponding to the partial bit fields in words, depending on a state of secondary search controlling signal, iv) a fourth circuit means for updating and storing a word invalid information at each primary and secondary search operation, whether a word corresponding to each word is selected or not, through primary and secondary search operation, and providing the selected state or non-selected state to the intermediate data producing means, and v) a fifth circuit means for controlling, to produce the secondary search controlling signal to implement the secondary search, using the partial bit field, n in number, of the intermediate data as a search data in order, after the primary search operation using all bit fields of the external search data as a search data.

According to a second aspect of the invention, there is provided an associative memory which stores mask information for every single word of storage data to indicate a valid state or an invalid state representative of whether or not every single bit or every plural bits of the storage data should be excluded from a search object; the associative memory comprising:

i) a first circuit means as a primary searching means for producing a primary distinguishing signal to distinguish a selected word, when all bits of an external search data composed of partial bits, n in number (where n is an integer variable 2 or more), are in a primary searching operation, the primary searching operation taking the mask information into account in order to exclude single or plural bits of the storage data from a search object when the corresponding mask information is in a valid state of mask information for each single word, ii) a second circuit means as an intermediate data producing means, n in number, for supplying an intermediate data produced by a logical operation of storage data corresponding to words in a selected state, a logical operation of mask information corresponding to the words, and a logical operation of a single or plural pairs of external search data, iii) a third circuit means as a secondary searching means, n in number, for producing a secondary distinguishing signal which distinguish a word selected from selected secondary search operation, against only a bit field of the storage data or mask information corresponding to the partial bit fields in words, when the intermediate data divided into n, n in number, are supplied similar to a composition of partial bit fields of the external search data, and iv) a fourth circuit means for carrying out the secondary search operation in the intermediate data producing means, n in number, and secondary searching means, n in number, the first intermediate data producing means carrying out the first secondary searching operation against the first partial bit field, providing the first intermediate data produced as a result of a primary search operation to the first secondary searching means, the second intermediate data producing means carrying out the second secondary searching operation against the second partial bit field, providing the second intermediate data produced as a result of the first secondary search operation to the second secondary searching means, the third intermediate data producing means carrying out the second secondary searching operation against the third partial bit field, providing the third intermediate data produced as a result of a secondary search operation to the third secondary searching means, likewise, the n-th intermediate data producing means carrying out the a secondary searching operation against the n-th partial bit field, providing the n-th intermediate data produced as a result of the (n-1)-th secondary search operation to the n-th secondary searching means.

According to a third aspect of the invention, there is provided the associative memory of the second aspect, wherein the first through n-th secondary searching means, which share structure elements of the j-th through k-th secondary searching means, the associative memory comprising:

i) a first circuit means as a memory means for updating and storing a word invalid information at each k-th through j-th secondary search operation (where j and k is an integer variable between 1 and n, both inclusive), whether a word corresponding to each word is selected or not, through primary and secondary search operation, and providing the selected state or non-selected state, ii) a second circuit means as a shared intermediate data producing means for supplying j-th through k-th intermediate data produced by the logical operation of storage data corresponding to words in a selected state, the logical operation of mask information corresponding to the words, and the logical operation of a single or plural pairs of external search data, iii) a third circuit means as a single or plural shared secondary searching means for controlling whether or not a secondary search operation is to be carried out, against only a bit field of the storage data or mask information corresponding to the j-th through k-th partial bit fields in words, depending on a state of secondary search controlling signal, and producing a signal which distinguish a word selected from the search operation, and iv) a fourth circuit means providing the secondary search controlling signal in order to carry out j-th through k-th secondary search operation sequentially, and possessing a controlling means which produce the memory controlling means in order to update the word valid information of the memory means.

According to a fourth aspect of the invention, there is provided the associative memory of the first through third aspect, wherein the searching means which use a single or plural attribute data as search data, the associative memory possessing the second associative memory to produce an attribute match signal corresponding to the word storing the storage data, and producing a primary distinguishing signal which distinguish a word, the primary distinguishing signal selected by primary searching operation and indicating coincidence as a result of searching operation for the attribute data by the attribute matching signal using the second associative memory, the primary searching operation against the external search data taking the mask information into account in order to exclude single or plural bits of the storage data from a search object when the corresponding mask information is in a valid state of mask information for each single word.

According to a fifth aspect of the invention, there is provided the associative memory of the first through third aspect, wherein the primary searching means which shares structure elements of the primary searching means and secondary searching means, the associative memory comprising:

i) a first circuit means as a selecting means for selecting the external search data as search data when primary control enabling signal is in a valid state, otherwise select the intermediate data, and ii) a second circuit means for carrying out a primary search operation against all bits of the external search data as search data to exclude single or plural bits of the storage data from a search object when the corresponding mask information is in a valid state of mask information for each single word, when primary search enabling signal is in a valid state, and a secondary search operation selectively against only a designated bit field, depending on a state of the storage data or mask information in words when secondary search controlling signal is in a valid state, the associative memory possessing means to put primary control enabling signal into a valid state, and produce the secondary search controlling signal in order to carry out the secondary search operation using the partial bit field, n in number, of the intermediate data after the primary search operation using all bit fields of the external search data as search data.

According to a sixth aspect of the invention, there is provided the associative memory of the second through third aspect, which enable a pipeline process; the associative memory comprising:

i) memory means to store a single or plural signal of primary distinguishing signals produced by the primary searching means, and first through n-th secondary distinguishing signal produced by the secondary searching means, n in number, and/or ii) memory means to store a single or plural data of first through n-th intermediate data.

According to a seventh aspect of the invention, there is provided the associative memory of the first, second or third aspect, sharing the lines for providing the information to the intermediate data producing means and the lines for a primary or a secondary distinguishing signal, by using a wire connection logic for updating and storing the information whether or not the corresponding word for each word is selected through a primary or a secondary searching operation which provides to the intermediate data producing means.

According to a eighth aspect of the invention, there is provided the associative memory of the first or third aspect, establishing a same priority to each partial bit field of the intermediate data as the corresponding partial bit field of the external searching data, and operating the secondary searching operation against the intermediate data in the order of descending priorities of the partial bit field.

According to a ninth aspect of the invention, there is provided the associative memory of the first or second aspect, storing a particular bit pattern in single or plural bits as the storage data excluded from a search object by the corresponding mask information in the primary searching operation, and selecting the word including the storage data, or partial bit field of the storage data as a searching target, coincident with the intermediate data, or partial bit field of the intermediate data in a secondary searching operation.

According to a tenth aspect of the invention, there is provided the associative memory of the first or second aspect, carrying out a secondary searching operation regarding single or plural bits of the storage data excluded from the search object by the corresponding mask information in the primary searching operation as a particular bit pattern, to select the word including the storage data, or partial bit field of the storage data as a searching target, coincident with the intermediate data, or partial bit field of the intermediate data provided as a search data.

According to a eleventh aspect of the invention, there is provided the associative memory of the ninth or tenth aspect, wherein each bit of the particular bit pattern is in an invalid state for the storage data.

According to a twelfth aspect of the invention, there is provided the associative memory of the ninth or tenth or eleventh aspect, wherein the logical operation is a logical sum (an OR operation) of the storage data corresponding with the words in a selected state, with the valid state for the storage data as true, carrying out the secondary searching operation of selecting the word including the storage data coincident with the intermediate data as a result of the logical sum (an OR operation).

According to a thirteenth aspect of the invention, there is provided the associative memory of the ninth or tenth or eleventh or twelfth aspect, wherein the logical operation is a logical multiplication (an AND operation) of the mask information corresponding with the words in a selected state, with the valid state for the mask information as true; the first logical operation is conducted to produce the intermediate data in a manner that information of the same bit position of the external search data is set as the intermediate data at the same bit position when a bit for the result of the logical AND information is an invalid state for the mask information, or that invalid state of a storage data is set as intermediate data at the same bit position when a bit for the result of the logical AND information is a valid state for the mask information, and selecting the word including the storage data, coincident with the intermediate data in a secondary searching operation.

According to the fourteenth aspect of the invention, there is provided the associative memory of the first or second or third aspect, wherein the logical operation is a logical multiplication (an AND operation) of the mask information corresponding with the words in a selected state, with the valid state for the mask information as true, and selecting the word including mask information, coincident with the intermediate data, and possessing the selected state by that time in a secondary searching operation.

According to a fifteenth aspect of the invention, there is provided a network device which determine a transfer permission by a transfer rule selected as final, the network device determining a transfer permission of the input transfer data with reference to an match state in search operation for a single or plural transfer rule, using an issuer network address and a destination network address annexed to an input transfer data as search data, the transfer rule wherein the network device which stores a transfer rule table to indicate a mask information representative of whether or not every single bit or every plural bits of the storage data should be excluded from a search object, for every storage data including a bit field corresponding to each component, information of transfer permission, and the single or plural transfer rule, the transfer rule carrying out primary search operation, the primary searching operation taking the mask information into account in order to exclude single or plural bits of the storage data from a search object when the corresponding mask information is in a valid state of mask information for each single transfer rule, using an issuer network address and a destination network address annexed to an input transfer data as search data, the transfer rule producing an intermediate data by a logical operation of a single or plural pairs of storage data, mask information, and the determination input data, structuring a single or plural transfer rule, selected in the primary search operation, the transfer rule carrying out secondary search operation selectively for the first through the last components of the determination input data sequentially, for the storage data or mask information of bit field corresponding to the components, using bit field corresponding to the components of intermediate data updated by the result of the logical operation of a single or plural pairs of storage data, mask information, and the determination input data, structuring a single or plural transfer rule, selected for every primary search operation and secondary search operation.

According to a sixteenth aspect of the invention, there is provided a network device possessing a means, determining a transfer permission of the input transfer data with reference to an match state in search operation for a single or plural transfer rule, using an issuer network address and a destination network address annexed to an input transfer data as search data, the transfer rule wherein the network device which stores a transfer rule table to indicate a mask information representative of whether or not every single bit or every plural bits of the storage data should be excluded from a search object, for every storage data including a bit field corresponding to each component, information of transfer permission, and the single or plural transfer rule, the transfer rule possessing, when all bits of determination input data are in a primary searching operation, the primary searching operation taking the mask information into account in order to exclude single or plural bits of the storage data from a search object when the corresponding mask information is in a valid state of mask information for each single word, a primary searching means to produce a primary distinguishing signal to distinguish a selected word, the network device possessing an intermediate data producing means which supply an intermediate data produced by a logical operation of the storage data corresponding to words holding a selected state, a logical operation of the mask information corresponding to the words, and a logical operation of a single or plural pairs of external search data, the network device possessing a single or plural shared secondary searching means when each partial bit field of the divided intermediate data are supplied, similar to a composition of partial bit fields of the determination input data, controlling whether or not a secondary search operation is to be carried out for only a bit field of the storage data or mask information corresponding to the partial bit fields in transfer rule, with reference to a state of secondary search controlling signal, and producing a secondary identification signal for identifying a particular transfer rule selected from the search operation, the network equipment possessing a memory means through primary and secondary search operation, updating and storing a transfer rule invalid information for every primary and secondary search operation, whether a transfer rule corresponding to each transfer rule is selected or not, and providing a match signal which indicates the selected state or non-selected state to the intermediate data producing means, the network equipment memory possessing means producing the secondary search controlling signal in order to carry out the secondary search operation using the partial bit field of the intermediate data upon completion of the primary search operation using all bit fields of the determination input data as search data, the network device possessing a determination means to determine a transfer permission of the input transfer data, with reference to information of transfer permission with the match signal.

According to a seventeenth aspect of the invention, there is provided a network device determining a transfer permission of the input transfer data with reference to an match state in search operation for a single or plural transfer rules, using a determination input data composed of components, n in number (where n is an integer variable 2 or more), as search data, including an issuer network address and a destination network address annexed to an input transfer data, the transfer rule wherein the network equipment, possessing a transfer rule table represented by a mask information of whether or not one or more field of a single bit or plural bits in the storage data among each single or plural storage data, information of transfer permission, the transfer rule, including bit field corresponding to each component of the determination input data, should be excluded from a search object, the transfer rule wherein the network device which stores a transfer rule table to indicate a mask information representative of whether or not every single bit or every plural bits of the storage data should be excluded from a search object, for every storage data including a bit field corresponding to each component, information of transfer permission, and the single or plural transfer rule, the transfer rule possessing, when all bits of determination input data are in a primary searching operation, the primary searching operation taking the mask information into account in order to exclude single or plural bits of the storage data from a search object when the corresponding mask information is in a valid state of mask information for each single transfer rule, a primary searching means to produce a primary distinguishing signal to distinguish a selected transfer rule, the network device possessing an intermediate data producing means which supply an intermediate data produced by a logical operation of the storage data corresponding to words holding a selected state, a logical operation of the mask information corresponding to the words, and a logical operation of a single or plural pairs of external search data, the network device possessing shared secondary searching means, n in number, when each partial bit field of divided the intermediate data are supplied, similar to a composition of partial bit fields of the determination input data, wherein a secondary search operation is carried out for only a bit field of the storage data or mask information corresponding to the partial bit fields in transfer rule, producing a secondary identification signal for identifying a particular transfer rule selected from the search operation, the network device possessing a determination means to determine a transfer permission of the input transfer data, with reference to information of transfer permission with the transfer rule selected by the n-th secondary searching means, the network device carrying out the secondary search operation with the intermediate data producing means, n in number, and secondary searching means, n in number, the first intermediate data producing means carrying out the first secondary searching operation for the first partial bit field, providing the first intermediate data produced as a result of a primary search operation to the first secondary searching means, the second intermediate data producing means carrying out the second secondary searching operation for the second partial bit field, providing the second intermediate data produced as a result of the first secondary search operation to the second secondary searching means, the third intermediate data producing means carrying out the second secondary searching operation for the third partial bit field, providing the third intermediate data produced as a result of a secondary search operation to the third secondary searching means, likewise, the n-th intermediate data producing means carrying out the secondary searching operation for the n-th partial bit field, providing the n-th intermediate data produced as a result of the (n-1)-th secondary search operation to the n-th secondary searching means.

According to a eighteenth aspect of the invention, there is provided a network system in which data communication is carried out among apparatuses connected to the network via network equipment as described in the fifteenth or sixteenth or seventeenth aspect of the invention.

BRIEF DESCRIPTION OF THE DRAWING

FIG. 5 is a flow chart describing the operation of an associative memory according to the first embodiment of this invention.

FIG. 6 describes one example of the operation of an associative memory at step S100 in FIG. 5 according to the first embodiment of this invention.

FIG. 7 describes one example of the operation of an associative memory at step S101 in FIG. 5 according to the first embodiment of this invention.

FIG. 8 describes one example of the operation of an associative memory at step S102 in FIG. 5 according to the first embodiment of this invention.

FIG. 9 describes one example of the operation of an associative memory at step S105 in FIG. 5 according to the first embodiment of this invention.

FIG. 13 is a block diagram of one example of associative memories according to the third embodiment of this invention.

DESCRIPTION OF THE PREFERRED EMBODIMENTS

Construction of the First Embodiment

Figure 1:
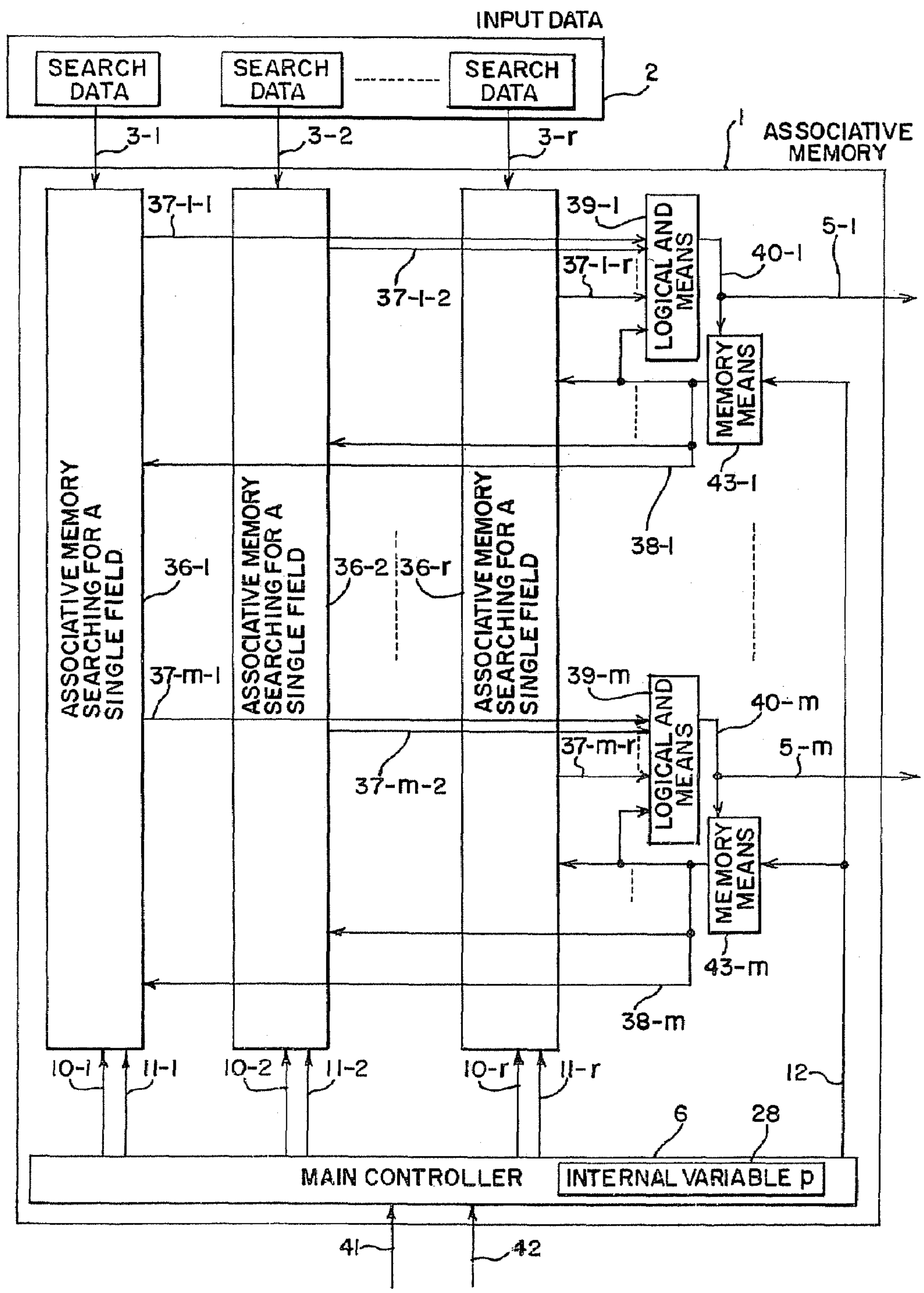
FIG. 1 is a block diagram of one example of associative memories according to the first embodiment of this invention.

Now, description will be made in detail about several preferred embodiments of the present invention with reference to the drawing. Referring to FIG. 1, an associative memory 1 according to a first embodiment of this invention is supplied with the input data 2 which is comprised of a clock signal 41, start signal 42, and search data 3-1 through 3-*r*, r in number, and provides the match line 5-1 through 5-*m*, m in number. The associative memory 1 comprises an associative memory searching for a single field 36-1 through 36-*r*, main controller 6, logical AND means 39-1 through 39-*m*, and memory means 43-1 through 43-*m*.

The main controller 6 is supplied the clock signal 41, start signal 42, and provides the memory control signal 12, the primary search enabling signal 10-1 through 10-*m*, and the secondary search enabling signal 11-1 through 11-*r*. The main controller comprises the internal variable 28 which is writable and readable. The value of the internal variable 28 is indicated as P. The main controller 6 starts the searching operation of input data 2 when the start signal 42 is in a valid state, and supplies the memory control signal 12, the primary search enabling signal 10-1 through 10-*m*, and the secondary search enabling signal 11-1 through 11-*r*, synchronizing with a clock signal 41, in accordance with the flowchart in FIG. 5 describing the operation of the associative memory according to a first embodiment of this invention.

The i-th associative memory searching for a single field 36-*i* is supplied the search data 3-*i*, the primary search enabling signal 10-1 through 10-*i*, the secondary search enabling signal 11-1 through 11-*i*, and the common math line 38-1 through 38-*m*, and as a search result in a single field, provide the match line 37-*i*-1 through 37-*i*-*m*. The searching operation of the associative memory searching for a single field 36-*i* is controlled by the primary search enabling signal 10-*i*, and the secondary search enabling signal 11-*i*, as follows. When the primary search enabling signal 10-*i* is in a valid state, the primary searching operation is performed in which the search data 3-*i* and the internal storage data is compared taking the corresponding mask information into account. The search result is provided into match line 37-*i*-1 through 37-*i*-*m*. When the secondary search enabling signal 11-*i* is in a valid state, intermediate data is produced with reference to the state of common match line 38-1 through 38-*m*, using the internal storage data and/or mask information. The result of secondary searching operation by intermediate data is provided into the match line 37-*i*-1 through 37-*i*-*m*. Referring to the secondary searching operation by intermediate data, in case that the secondary searching operation is implemented following to the primary searching operation with the i-th associative memory searching for a single field 36-*i* independently composed, only the match line 37-*i*-1 through 37-*i*-*m* is supplied with a valid state, which corresponds to the storage data with the least number of bits in a mask valid state, in the storage data coincident with the search data 3-*i* taking the mask information into account.

In this regards, the i-th associative memory searching for a single field 36-*i* put all the match lines 37-*i*-1 through 37-*i*-*m*, m in number, into a valid state of common match line 38 when both result of the primary search enabling signal 10-*i* and the secondary search enabling signal 11-*i* are in an invalid state.

In this example, the priority of the operation is given in the order of search data 3-1, 3-2, through 3-*r*, r as the lowest priority. Herein, the number of bits of each search data 3-1 through 3-*r* may differ from each other. Only if the search data 3-1 through 3-*r* is supplied to the corresponding to the associative memory searching for a single field 36-1 through 36-*r*, the order in the input data 2 is optional. Besides, only if the concatenation is compatible, the order in the associative memory searching for a single field 36-1 through 36-*r*, r in number, is optional.

The j-th logical AND means 39-*j* is supplied the match line 37-*j*-1 through 37-*j*-*r*, r in number, and single common match line 38-*j*, and provide the result of logical AND as the logical AND signal 40-*j* wherein logical operation is a logical AND with the valid state for the common match line 38-*j* as true. In this example, the logical AND signal 40-*j* is quite similar to the match signal 5-*j*.

The j-th memory means 43-*j* is supplied the logical AND signal 40-*j* and single memory control signal 12, and provide the common match line 38-*j*. With reference to the state of memory control signal 12, one of three operations is proceeded, to maintain the state of the common match line 38-*j*, store the value of the logical AND signal 40-*j*, or initialize the the state of the common match line 38-*j* into a valid state.

Figure 2:
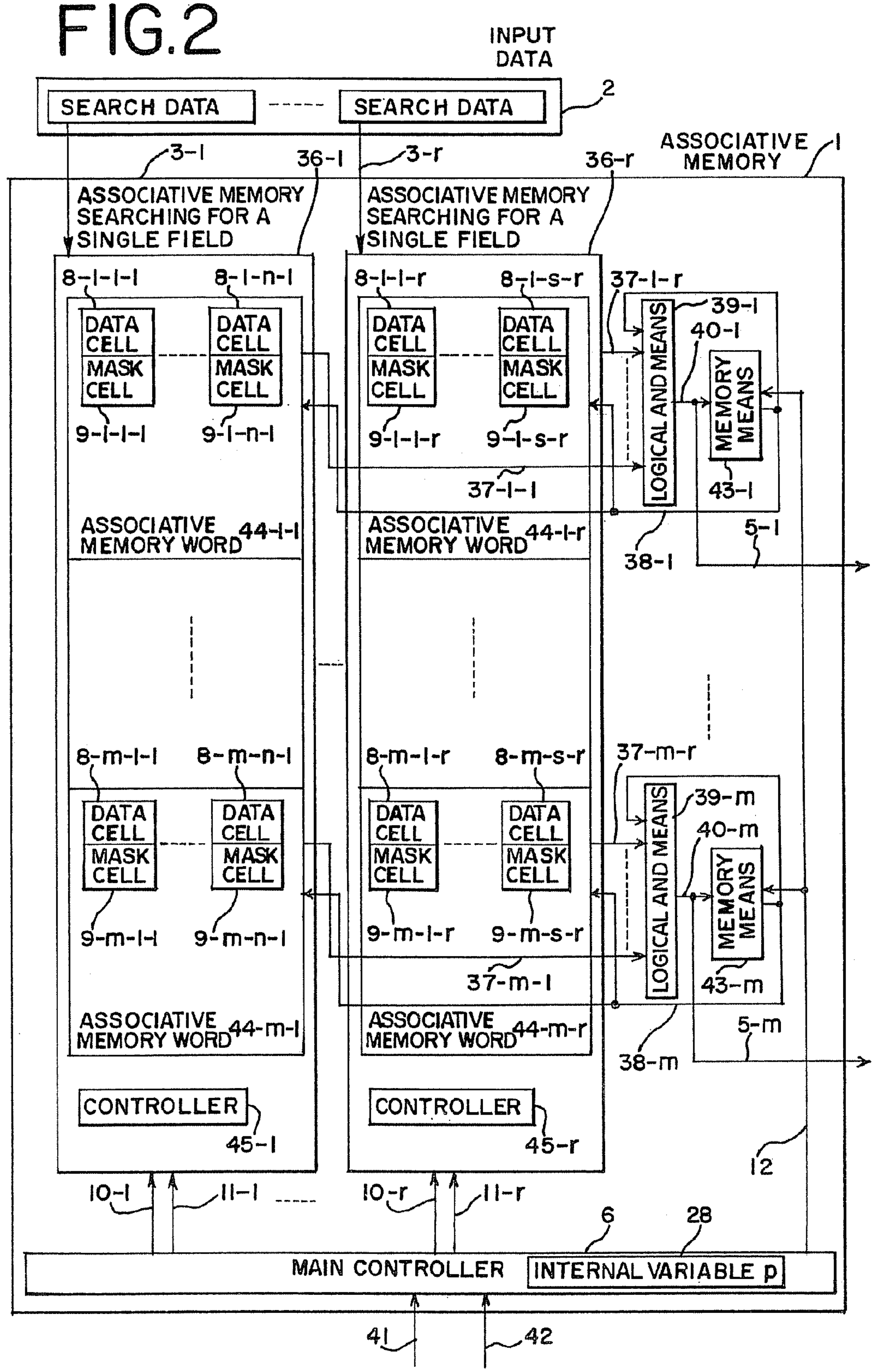
FIG. 2 is a detailed block diagram of one example of associative memories illustrated in FIG. 1.

Referring to FIG. 2, the associative memory 1 is described in detail as one example of preferred embodiments according to a first embodiment of this invention. In this example, the m-th n-bit associative memory searching for a single field 36-1 is similar to the corresponding component in the m-th s-bit associative memory searching for a single field 36-*r* except the bit number of a word.

The associative memory searching for a single field 36-1 comprises the n-bit associative memory word 44-1-1 through 44-*m*-1, and controller 45-1. The associative memory searching for a single field 36-*r* comprises the s-bit associative memory word 44-1-*r* through 44-*m*-*r*, and controller 45-*r*.

The j-th associative memory word 44-*j*-1 comprises the data cell 8-*j*-1-1 through 8-*j*-*n*-1, and mask cell 9-*j*-1-1 through 9-*j*-*n*-1, n in number. The j-th associative memory word 44-*j*-*r* comprises the data cell 8-*j*-1-*r* through 8-*j*-*s*-*r*, and mask cell 9-*j*-1-*r* through 9-*j*-*s*-*r*, s in number.

Figure 3:
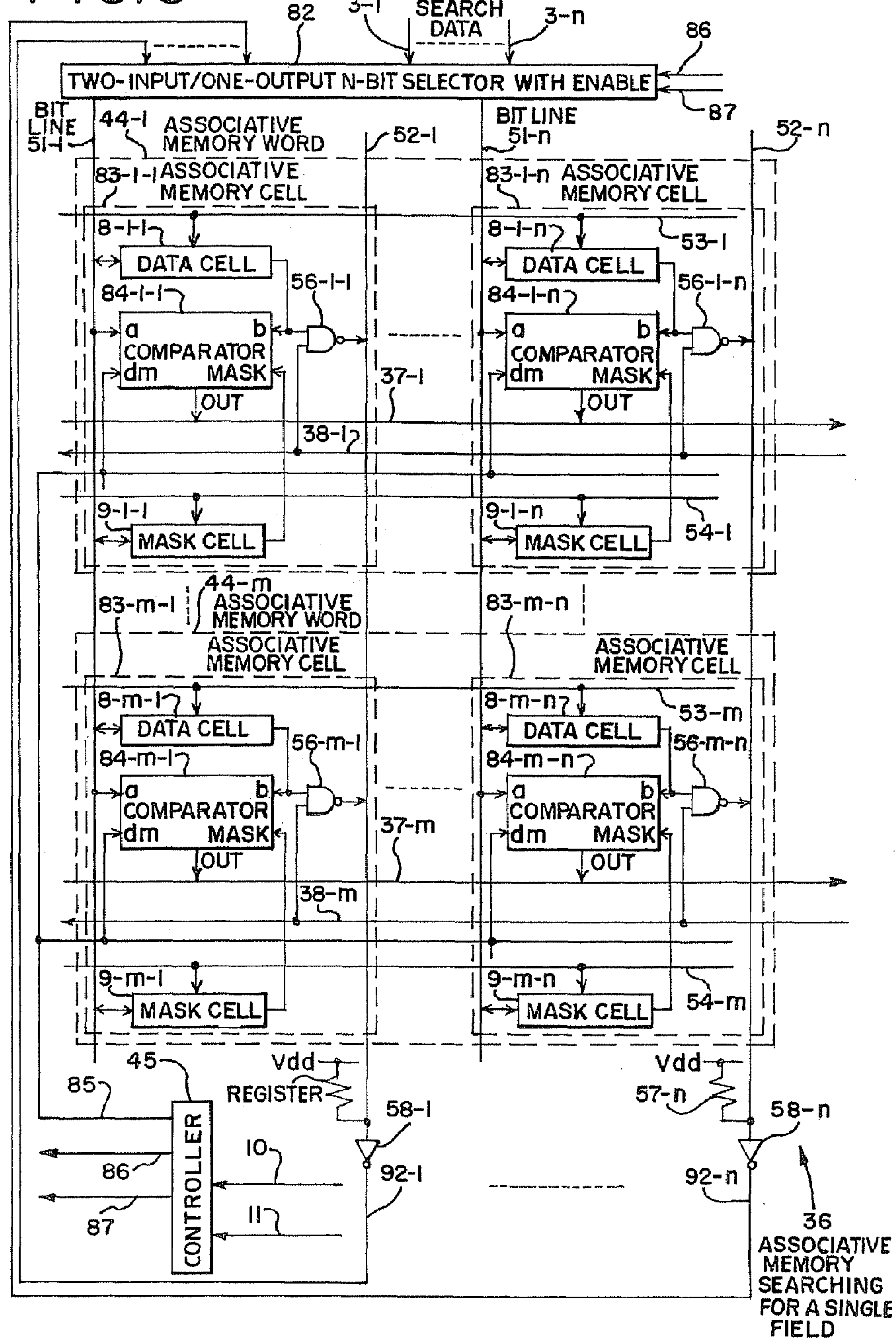
FIG. 3 is a block diagram of one example of associative memories searching for a single field in an associative memory according to the first embodiment of this invention.

Construction of an Associative Memory Searching for a Single Field According to the First Embodiment Referring to FIG. 3, an associative memory searching for a single field according to the first embodiment of this invention comprises a two-input/one-output n-bit selector with enable 82, the first through m-th n-bit associative memory words 44, the controller 45, the first through m-th logical gates 58, and the first through n-th register 57. The j-th associative memory word 44-*j* comprises the associative memory cell 83-*j*-1 through 83-*j*-*n*, n in number. The associative memory word 44-*j* is concatenated to the corresponding data word 53-*j*, mask word 54-*j*, common match line 38-*j*, and comparison control line 85 as input lines, and concatenated to the corresponding match line 37-*j* and match data intermediate line 52-1 through 52-*n* as output lines, and concatenated to bit line 51-1 through 51-*n*, as input/output lines.

In this embodiment, a valid state and an invalid state for the mask information are represented by "0" and "1". A valid state and an invalid state are represented by "1" and "0", respectively, for all of the storage data, the matched data logical-OR lines 52-1 through 52-*n*, the match lines 37-1 through 37-*m*, and the common match lines 38-1 through 38-*m*.

Prior to the start of the searching operation, the match line 37 is precharged to a high level to be put into a valid state "1".

The memory cell 83-*j*-*k* in the j-th associative memory word 44-*j* is concatenated to the corresponding data word 53-*j*, mask word 54-*j*, common match line 38-*j*, and comparison control line 85 as input lines, and concatenated to the corresponding match line 37-*j* and match data intermediate line 52-*k* as output lines, and concatenated to bit line 51-*k* as input/output lines.

Each associative memory cell 83-*j*-*k* comprises the data cell 8-*j*-*k*, the comparator 84-*j*-*k*, the mask cell 9-*j*-*k*, and the logical gate. 56-*j*-*k*. The data cell 8-*j*-*k* is for storing "data" bit information at a corresponding bit of storage data supplied from an external source through a bit line 51-*k*. The comparator 10-*j*-*k* is for comparing the "data" bit information stored in the data cell 8-*j*-*k* and input data supplied from the external source through a bit line 51-*k*. The mask cell 9-*j*-*k* is for storing "mask" bit information of a corresponding bit of mask information supplied from the external source through the bit line 51-*k*. Herein, when the bit information stored in the mask cell 9-*j*-*k* is in a valid state for mask information, an invalid state for storage data is stored in the corresponding data cell 8-*j*-*k*.

The comparator 84-*j*-*k* is supplied with the state of the search data on the corresponding bit line 51-*k*, the storage data stored in the data cell 8-*j*-*k* in the same associative memory cell 83-*j*-*k*, the mask information stored in the mask cell 9-*j*-*k* in the same associative memory cell 83-*j*-*k*, and the comparison control signal 85. When the comparison control signal 85 is in an invalid state "0" and the mask information is in a valid state "0", the comparator 84-*j*-*k* puts the corresponding match line 37-*j* into an opened state. Otherwise, if the value on the corresponding bit line 51-*k* and the storage data stored in the data cell 8-*j*-*k* are coincident with each other, the corresponding match line 37-*j* is put into an opened state. Upon incoincidence, the corresponding match line 37-*j* is put into an invalid state "0". Thus, the wired AND logic concatenation with the valid state "1" for the match line 37 as true is achieved such that, when all of the comparator 84-*j*-1 through 84-*j*-*n*, n in number, in the associative memory word 44-*j* render the match line 37-*j* in an opened state, the match line 37-*j* is put into a valid state "1" and otherwise into an invalid state "0". In other words, upon the searching operation, only when the comparison control signal 85 is in an invalid state "0" and all of the storage data stored in an associative memory word 44-*j* is completely coincident with the bit lines 51-1 through 51-*n* except those bits excluded from a comparison object by the mask valid state "0" in the corresponding mask information, the match line 37-*j* is put into a valid state "1" and otherwise into an invalid state "0". Alternatively, an ordinary logical gate may be used as far as the similar operation is performed.

The logical gate 56-*j*-*k* supplies an state "0" to the matched data intermediate line 52-*k* when the common match line 38-*j* in the same associative memory word 44-*j* is in a valid state "1" and the storage data stored in the corresponding data cell 8-*j*-*k* is in a valid state for the storage data. Otherwise, the logical gate 56-*j*-*k* puts the matched data intermediate line 52-*k* into an opened state. Herein, since a valid state for the storage data is represented by "1" in this embodiment, when the storage data stored in the data cell 8-*j*-*k* is in a valid state "1" and the match line 5-*j* is in a valid state "1", the logical gate 11 puts the corresponding matched data intermediate line 52-*k* into a state "0" and otherwise into an opened state.

Each of the matched data intermediate lines 52-1 through 52-*n* is pulled up by a corresponding register 57-1 through 57-*n* to be put into a state "1". The matched data intermediate line 52-*k* (where k is and integer variable between 1 and n, both inclusive) is concatenated to all of the corresponding logical gates 56-1-1 through 56-*m*-*n*, m in number, by a wired logic concatenation. Thus, when all of the first though m-th logical gates 56 concatenated to the corresponding matched data intermediate line 52 render the matched data intermediate line 52 in an opened state, the matched data intermediate line 52 is put into a valid state "1" and otherwise into an invalid state "0". In other words, the matched data intermediate line 52 is concatenated by a wired AND concatenation. Alternatively, an ordinary logical gate may be used as far as the similar operation is performed.

Each of the logical gates 58-1 through 58-*n* supplies an inverted value of the corresponding matched data intermediate line 52 to the corresponding intermediate data line 92.

Therefore, the intermediate data line 92-*k* (where k is and integer variable between 1 and n, both inclusive) is supplied with the result of the logical sum operation, with the valid state for the storage data as true, of all the storage data stored in the corresponding data cells 8-1-*k* through 8-*m*-*k* in the associative memory cells 83-1-*k* through 83-*m*-*k* which have the match line 37 that is in a valid state "1" upon completion of the searching operation by the logical gate 58-*k*, the resister 57-*k*, the matched data intermediate line 52-*k*, and corresponding logical gates 56-1-*k* through 56-*m*-*k*, m in number. In this embodiment, the intermediate data line 92 is supplied with the result of the logical sum with the valid state "1" for the storage data as true. Alternatively, an ordinary logical gate may be used as far as the similar operation is performed. As mentioned above, upon completion of the searching operation, the inter mediate data line 92 is supplied with the same value of the storage data coincident with the search data 3 that possesses the least number of bits in a invalid state "0".

The controller 45 is provided with the primary search enabling signal 10 and the secondary search enabling signal 11, and supplies comparison control line 85, selection signal 86, and invalidation signal 87. The controller 45 puts the invalidation signal 87 into a valid state "1", when both states of the primary search enabling signal 10 and the secondary search enabling signal 11 are in an invalid state "0", in order to control operation of the associative memory searching for a single field 36. The controller 45 puts the invalidation signal 87 into a valid state "0", puts the selection signal 86 into an invalid state "0", and puts the comparison signal 85 into an invalid state "0",when the state of the primary search enabling signal 10 is in a valid state "1". The controller 45 puts the invalidation signal 87 into a valid state "0", puts the selection signal 86 into an invalid state "0", and puts the comparison signal 85 into an invalid state "1", when the state of the secondary search enabling signal 11 is in a valid state "1".

Next, the two-input/one-output n-bit selector with enable 82 is supplied with the selection signal 86, the invalidation signal 87, the intermediate data line 92, the search data 3, and deliver bit line 51-1 through 51-*n*. Only when the invalidation signal 87 is in a valid state "1", the two-input/one-output n-bit selector with enable 82 supplies the search invalidation data with which comparison results is coincident between the bit line 51 and all associative memory word 44. Otherwise, the two-input/one-output n-bit selector with enable 82 supplies the search data 3, or intermediate data line 92, in case the selection signal 86 is in an invalid state "0", or in a valid state "1", respectively.

As described above, each component of the associative memory searching for a single field 36 in this embodiment is similar to the corresponding component in the conventional associative memory 101, except the common match line 38-1 through 38-*m* is added, the logical gate 56-*j*-1 through 56-*j*-*n* is supplied by the common match line 38-*j* in place of the match line 105-*j*, n-bit latch 121 is eliminated, the two-input/one-output n-bit selector with enable 82 is added in place of the two-input/one-output n-bit selector 123, the clock signal 131 to the controller 45 is eliminated, and the primary and secondary search enabling signal 10 and 11 are added. Therefore, it is possible to implement that when the common match line 38-1 through 38-*m* and corresponding match line 37-1 through 37-*m* are concatenated by each latch, outside of the associative memory searching for a single field 36, the similar operation is carried out as the conventional associative memory by providing a valid state "1" to the primary search enabling signal 10 prior to providing a valid state "1" to the secondary search enabling signal 11, wherein the mask searching function to put the only mask match line 37 corresponding to the storage data with the least number of bits in a mask valid state, in the mask match lines 37 corresponding to one of the storage data coincident with the search data 3-1 through 3-*n*, taking the mask information into account, into a valid state.

Detailed Construction of the First Embodiment

Figure 4:
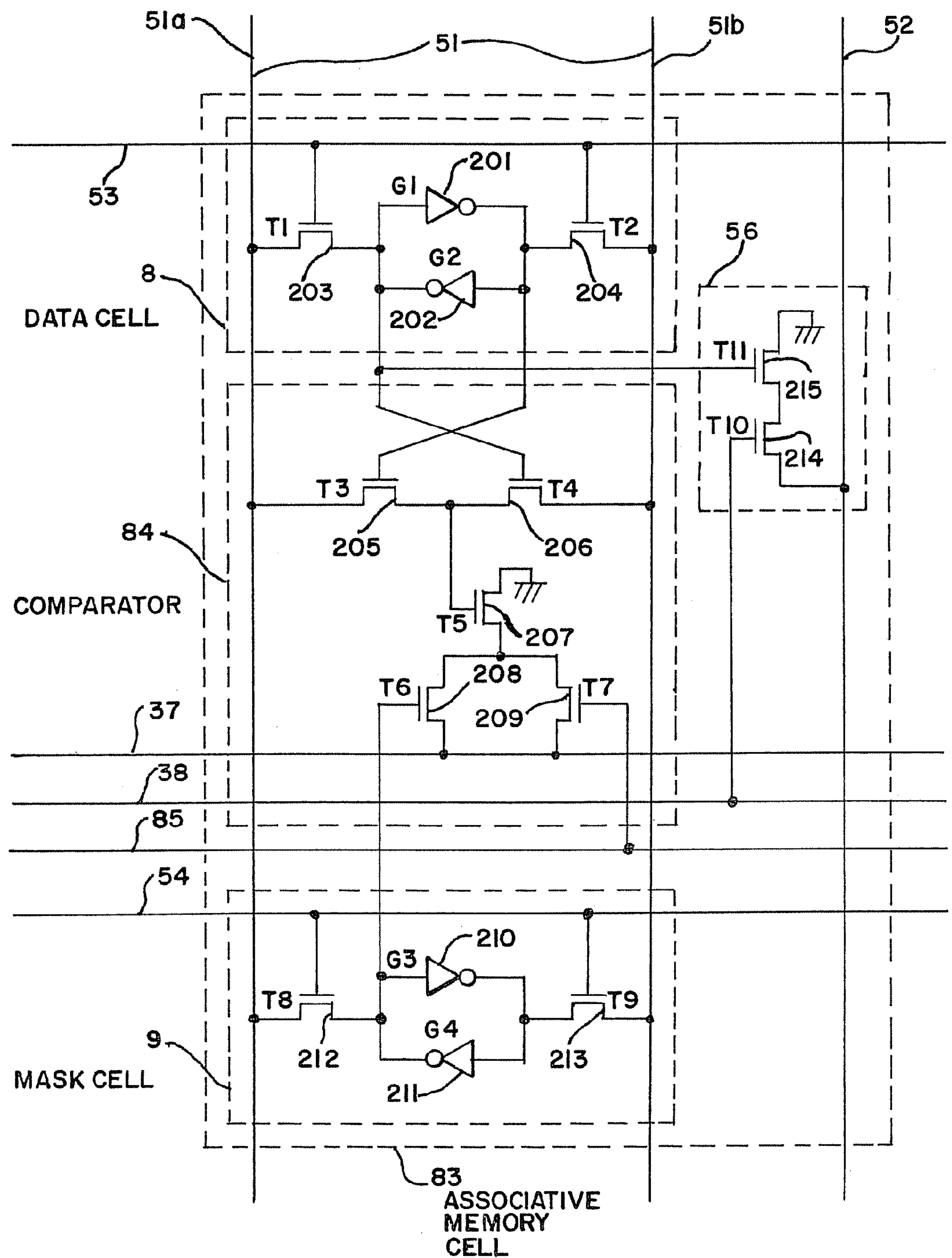
FIG. 4 is a circuit diagram of one example of associative memory cells of an associative memory searching for a single field in an associative memory illustrated in FIG. 3.
Figure 29:
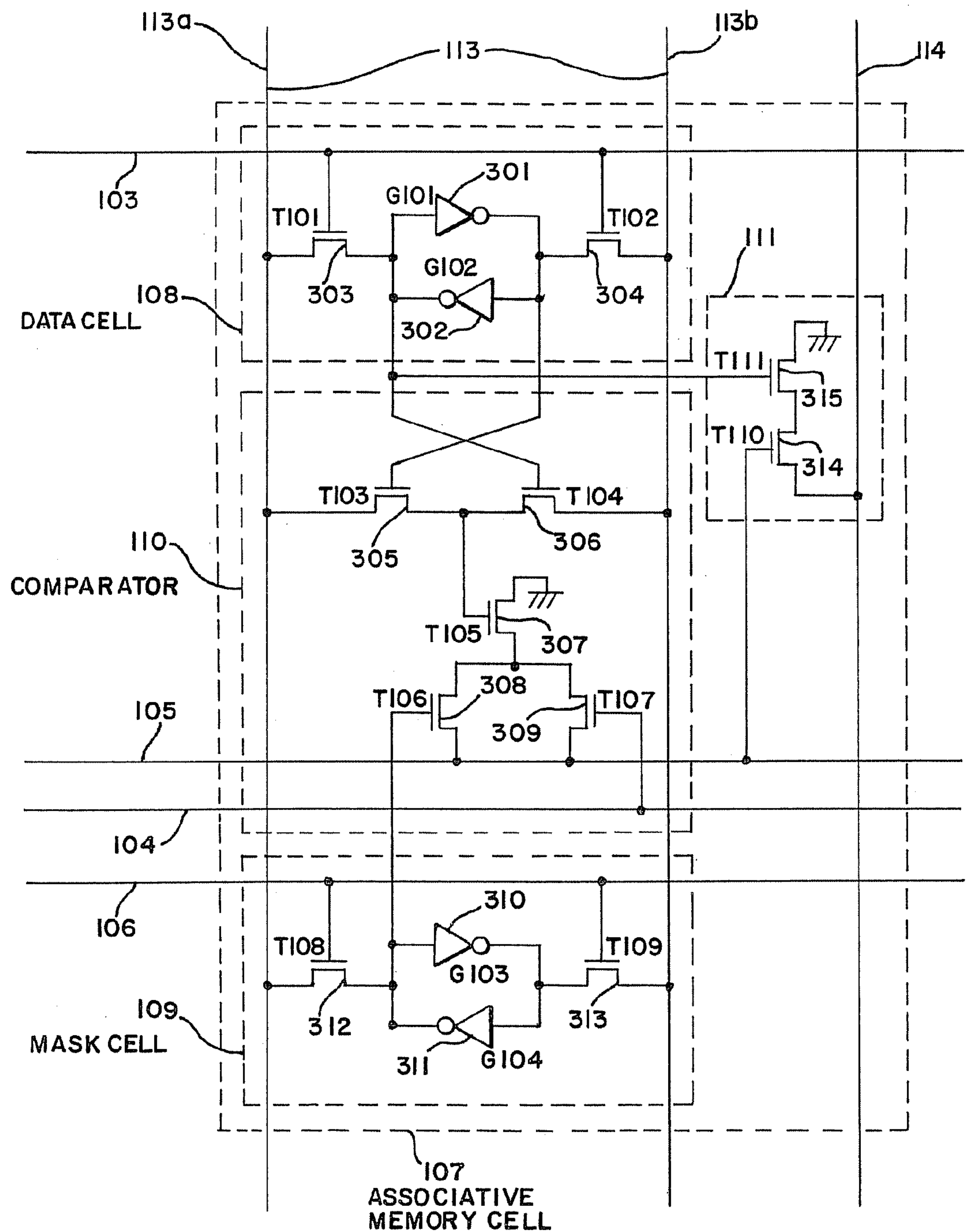
FIG. 29 is a circuit diagram of one example of associative memory cells illustrated in FIG. 28
Figure 30:
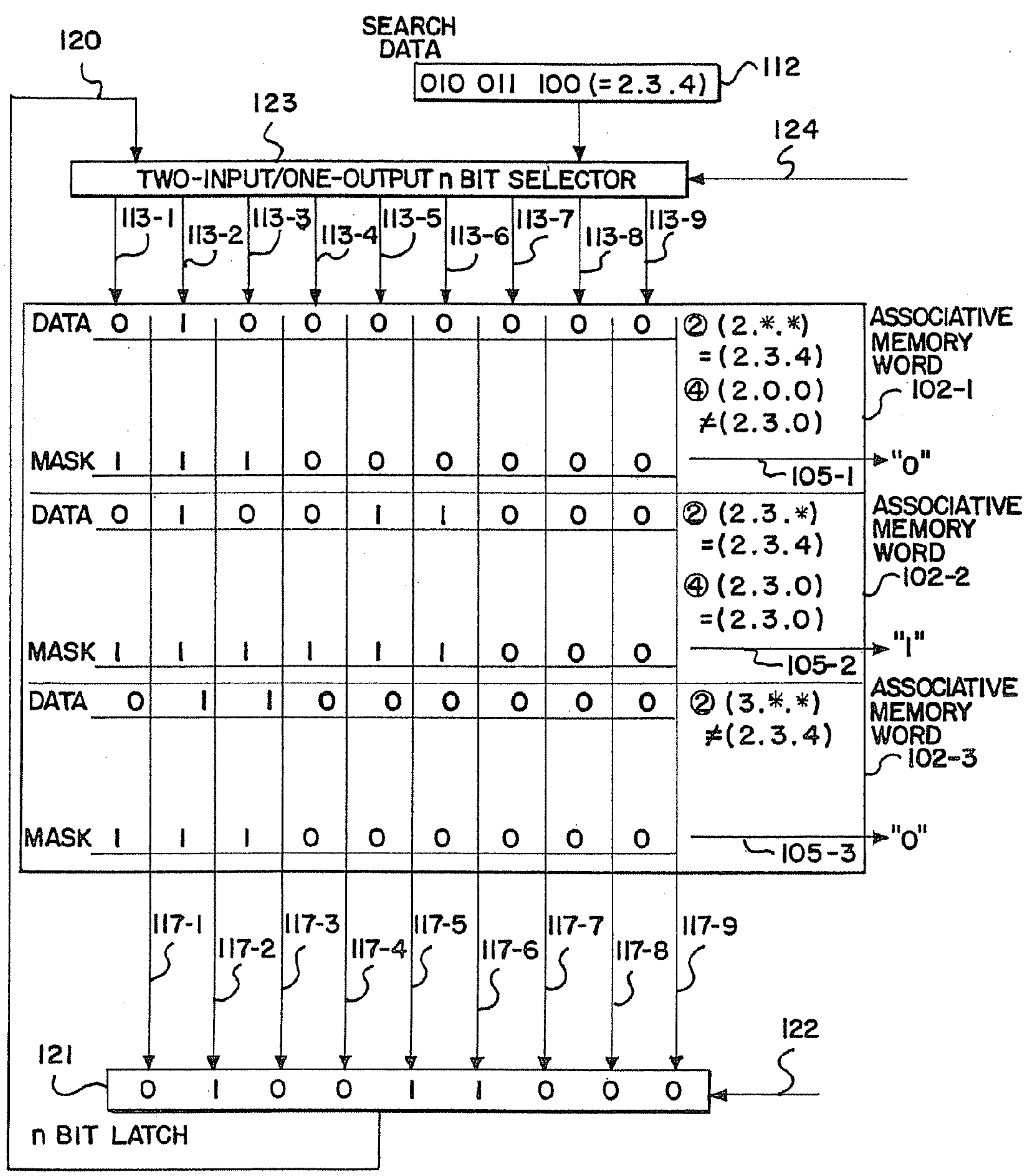
FIG. 30 is a view for describing one example of operations of the associative memory in FIG. 28
Figure 31:
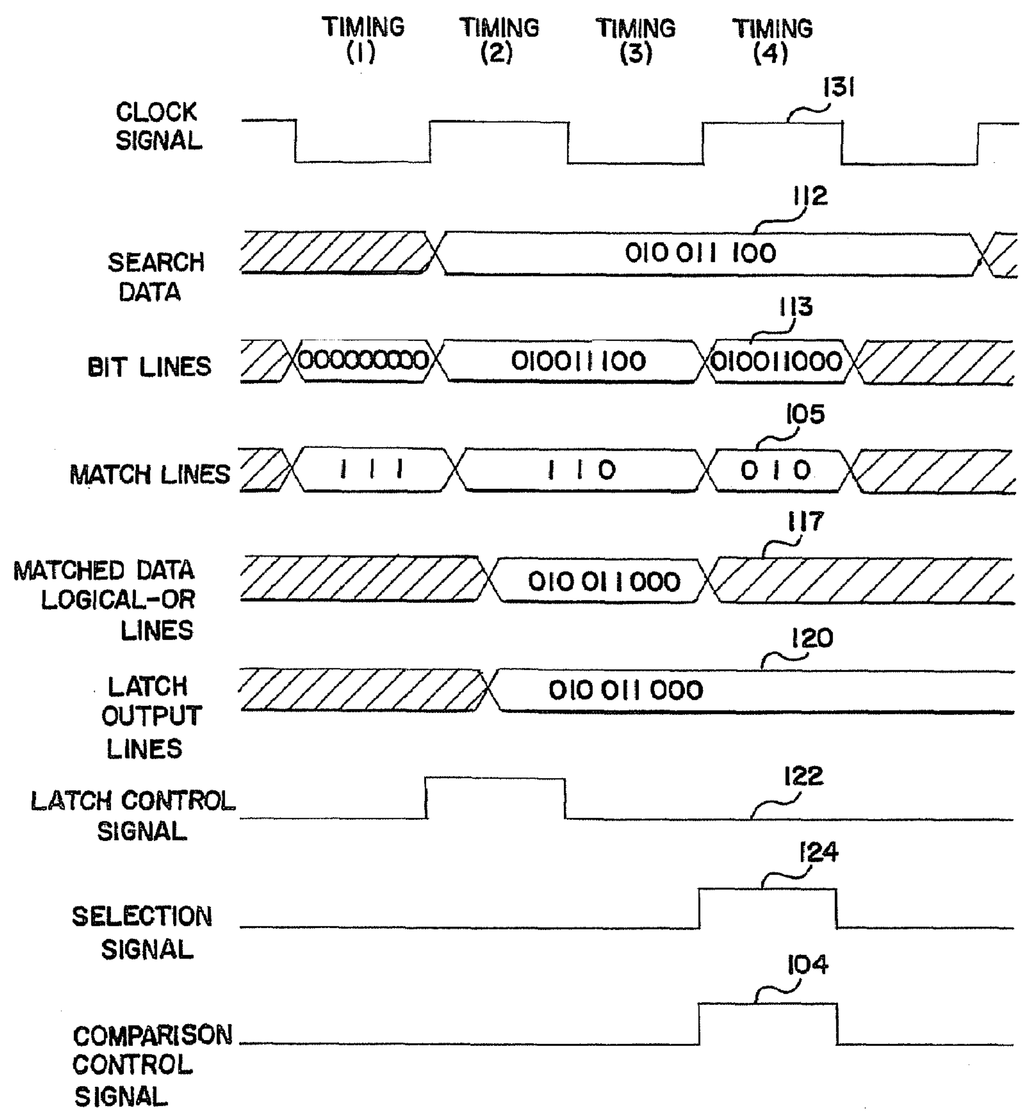
FIG. 31 is a timing chart for describing one example of operations of the associative memory in FIG. 28.
Figure 32:
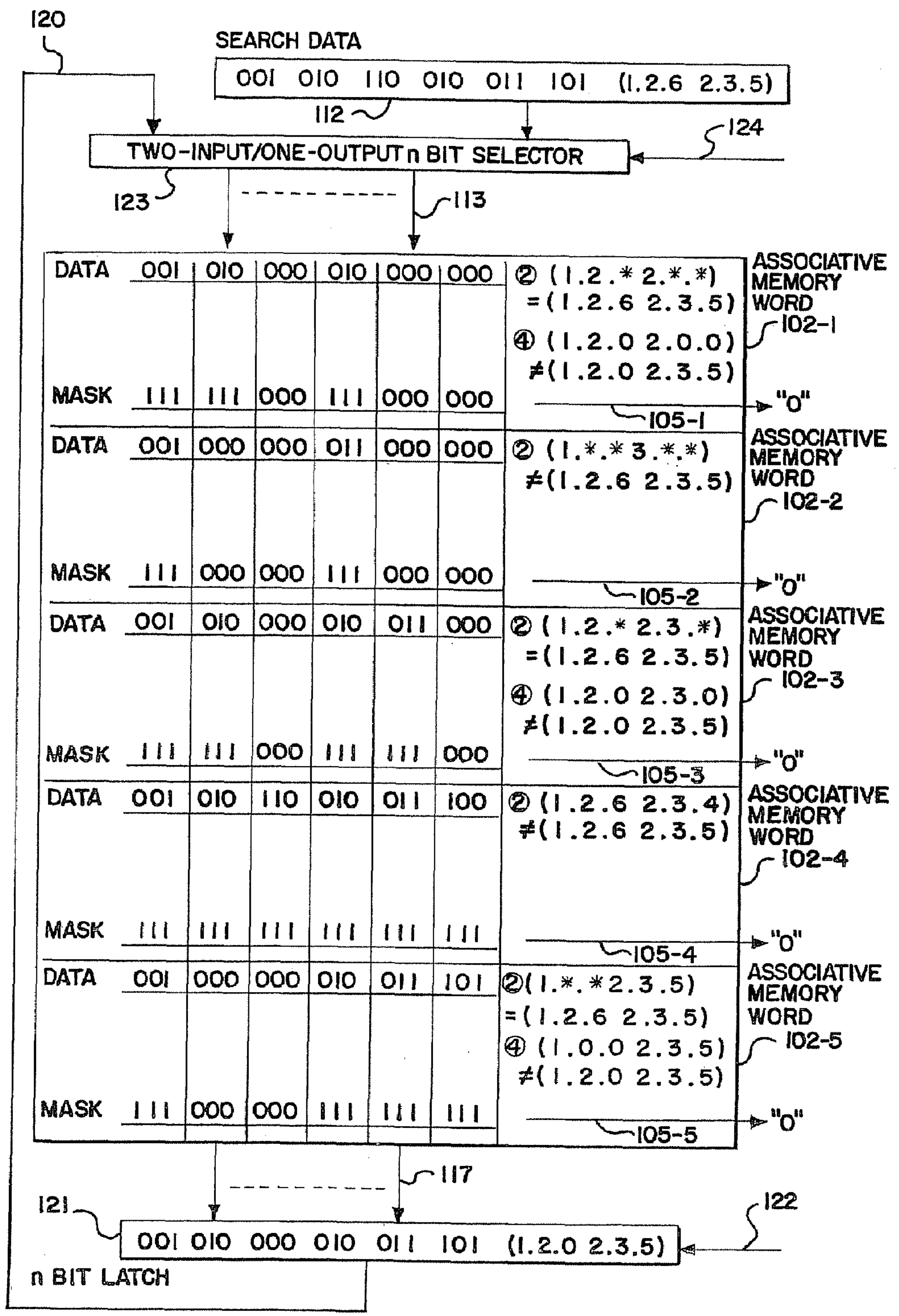
FIG. 32 describes one example of operations of the conventional associative memory searching several network addresses.

Next, referring to FIG. 4, the associative memory cell 83 in this embodiment of present innovation possesses similar component to the corresponding component in the conventional associative memory cell 107 illustrated in FIG. 29, except adding the common match line 38, changing the signal from match line 37 into common match line 38 to render the MOS transistor (T10) 214 in logical gate 56.

Herein, description will be made about the search invalidation data which is supplied to the bit line 51*a* and 51*b* when the two-input/one-output n-bit selector with enable 82 in FIG. 3 is in a valid state. As the search invalidation data, the two-input/one-output n-bit selector with enable 82 in FIG. 3 supplies in an invalid state "0" to all pairs of 51*a* and 51*b* corresponding to the bui line 51-1 through 51-*n*.

Similar to the conventional memory cell 107, upon writing the data or the input of the valid search data, the state of neither bit line 51*a* nor 51*b* is in an invalid state "0", since the inverted value of a value on the bit line 51 is supplied.

In the comparator 84, when both bit line 51*a* and 51*b* are in an invalid state "0", even if either MOS transistor (T3) 205 or MOS transistor (T4) 206, concatenated in cascade between bit line 13*a* and 13*b*, is put into a conductive state, the potential is low at the contact of the MOS transistor (T3) 205 and the MOS transistor (T4) 206, and the MOS transistor (T5) 207 is not put into a conductive state. Thus, the comparator 84 puts the match line 37 into an opened state.

In this embodiment, the function of a search invalidation data is realized by bit line 51*a* and 51*b* put into "0", similar to the description above, it is possible to take up other states as the search invalidation data with reference to the structure of the comparator 84.

As mentioned above, the memory call 83 in this embodiment of present invention comprises 19 transistors, as well as the conventional associative memory cell 107. Thus, the circuit scale is similar to the conventional ones. In case of 1024 words and 32 bits, whole circuit scale of the associative memory cells is 620,000 transistors. In the associative memory 1, the main controller 6 comprises approximately 500 transistors, and logical AND means 39 and the memory means 43 comprises approximately 50 transistors per word. It means that the associative memory 1 has only slight increase in circuit scale, by about few percents, compared with the conventional associative memory 101, in the case of 1024 words with 32 bits as mentioned above.

Operation of the First Embodiment

Next, description will be made about the searching operation of the associative memory according to the first embodiment of this invention when input data is composed of plural search data. Referring to FIG. 5, this searching operation will be described by the use of a flowchart.

Figure 33:
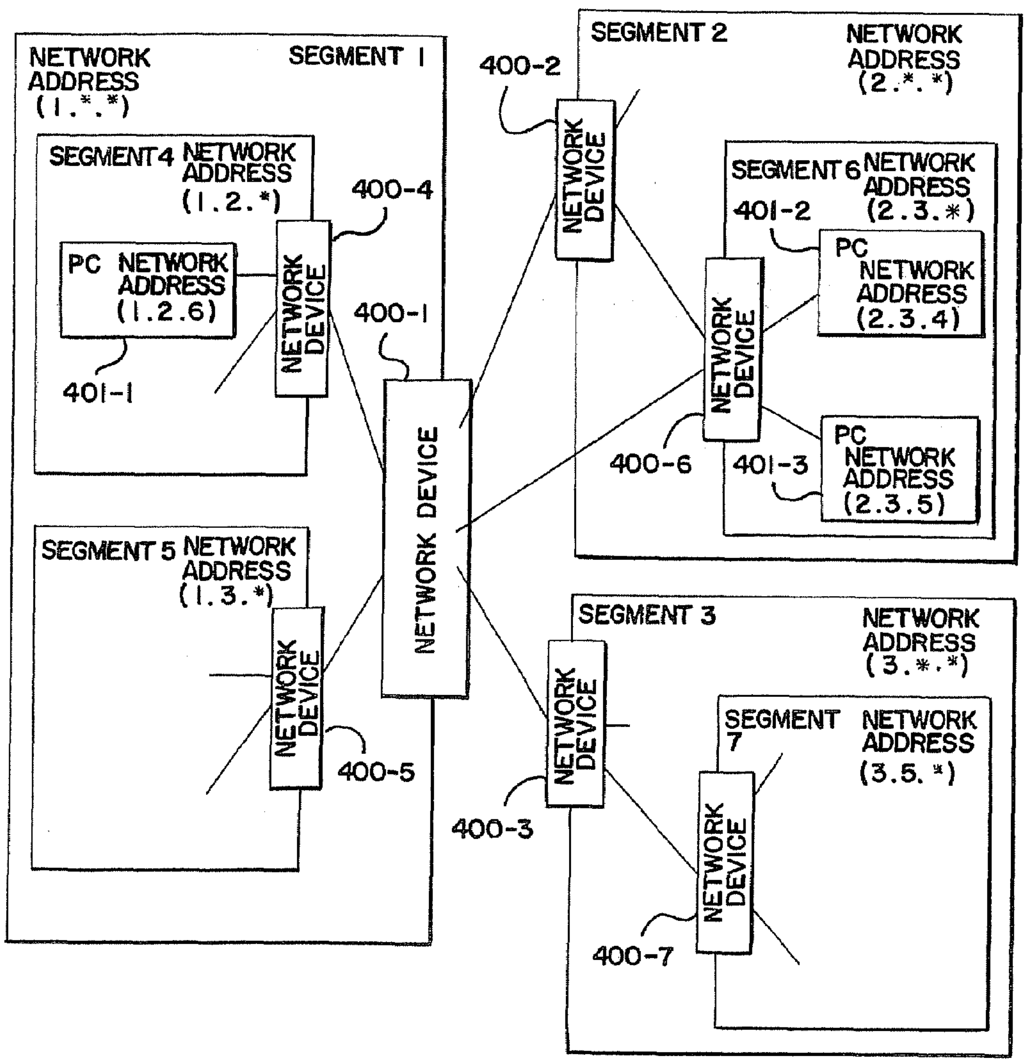
FIG. 33 schematically shows one example of conventional network system.

Description will proceed in FIG. 6 through FIG. 9, to the each step of the flowchart by supplying the associative memory 1 to determine the data transfer permission from the user's terminal (PC) 401-1 with the network address (1, 2, 6) to (PC) 401-3 with the network address (2, 3, 5) in FIG. 33. In this data transfer, the search data 3-1 is supplied as 9-bit source network address (1, 2, 6) with the first priority, likewise, the search data 3-2 is supplied as 9-bit destination network address (2, 3, 5) with the second priority. The associative memory 1 comprises 5 words 9-bit associative memory searching for a single field 36-1 and 36-2 in FIG. 6 through FIG. 9. The 9 bit storage data and 9 bit mask information, which comprise the 9 bit of structure data of the source network address in each transfer rule in Table.1(b), are stored as the storage data and the mask information, respectively, of each associative memory words 44-1-1 through 44-5-1 corresponding to the transfer rule of the associative memory searching for a single field 36-1. Likewise, the 9 bit storage data and 9 bit mask information, which comprise the 9 bit of structure data of the source network address in each transfer rule in Table.1(b), are stored as the storage data and the mask information, respectively, of each associative memory words 44-1-2 through 44-5-2 corresponding to the transfer rule of the associative memory searching for a single field 36-2. The values, supplied from the two-input/one-output n-bit selector with enable 82-1 and 82-2, are represented by the bit line data 95-1 and 95-2, respectively. Like wise, the values of the intermediate data line 92 in the associative memory searching for a single field 36-1 and 36-2, are represented by the intermediate data 93-1 and 93-2, respectively.

Prior to the start of the searching operation, all of the match lines 37-1-1 through 37-*m*-*r* are precharged to a high level ("1") to be put into a valid state "1".

[Step S100]

Following is the description of the step S100 in FIG. 5. With the start signal 42 in a valid a valid state, the searching operation commences. The main controller 6, synchronizing with a clock signal 41, executes the step S100 in FIG. 5, and the internal variable 28 is initialized. The main controller 6 also supplies the information to the memory control signal 12 with which the memory means 43-1 through 43-*m* are initialized to the valid state "1" of the common latch line 38-1 through 38-*m*. All primary search enabling signal 10-1 through 10-*r* and all secondary search enabling signal 11-1 through 11-*r* are supplied with invalid state "0".

Next, referring to FIG. 6, operation of step S100 will be described when the above-mentioned associative memory 1 is used in determination of transfer permission from the user's terminal (PC) 401-1 with the network address (1, 2, 6) to (PC) 401-3 with the network address (2, 3, 5) in FIG. 33. Since all primary search enabling signal 10-1 through 10-*r* and all secondary search enabling signal 11-1 through 11-*r* are in an invalid state "0", the invalidation signals 87-1 through 87-2 are p valid state "1", and the bit line data 95-1 and 95-2, supplied from the two-input/one-output n-bit selector with enable 82-1 and 82-2 respectively, turn out to the search invalidation data. Consequently, both the match line 37-1-1 through 37-5-1 and the match line 37-1-2 through maintain a valid state "1". Since the common line 38-1 through 38-5 supplied from memory means 43-1 through 43-5 is initialized in a valid state "1" by the memory control signal 12, all of the logical AND signal 40-1 through 40-5 are in a valid state "1". As a result, the intermediate data 93-1 possess the state "001, 010, 110", as the result of the logical OR operation of all the storage data stored in the associative memory word 44-1-1 through 44-1-5. Like wise, the intermediate data 93-2 possess the state "011, 011, 101", as the result of the logical OR operation of all the storage data stored in the associative memory word 44-2-1 through 44-2-5.

[Step S101]

Next, the description is proceeded to the step S101 in FIG. 5. The main controller 6, synchronizing with a clock signal 41, proceeds to the step S101 in the flow chart in FIG. 5, and supplies the valid state "1" to the primary search enabling signal 10-1 through 10-*r*, and supplies the valid state "0" to the secondary search enabling signal 11-1 through 11-*r*. The main controller 6 also supplies the signal to the memory control signal 12 with which the value of the logical AND signal 40-1 through 40-*m* is stored in the memory means 43-1 through 43-*m* as the operation proceeds to the next step S102.

Next, referring to FIG. 7, operation of step S101 will be described when the above-mentioned associative memory 1 is used in determination of transfer permission from the user's terminal (PC) 401-1 with the network address (1, 2, 6) to (PC) 401-3 with the network address (2, 3, 5) in FIG. 33. Since the primary search enabling signal 10-1 is in a valid state "1" in the associative memory searching for a single field 36-1, the two-input/one-output n-bit selector with enable 82-1 supplies the value of the search data 3-1 "001, 010, 110" as the bit line data 95-1, and the comparison control line 85-1 is supplied with an invalid state "0". Therefore, as the result of the comparison with the value of the bit line data 95-1 and the storage data in the associative memory word 44-1-1 through 44-5-1, taking the mask information into account, a valid state "1" is put into the match line 37-1-1, 37-2-1, 37-3-1, 37-4-1, and 37-5-1.

Since the primary search enabling signal 10-2 is in a valid state "1" in the associative memory searching for a single field 36-2, the two-input/one-output n-bit selector with enable 82-2 supplies the value of the search data 3-2 "010, 011, 101" as the bit line data 95-2, and the comparison control line 85-2 is supplied with an invalid state "0". Therefore, as the result of the comparison with the value of the bit line data 95-2 and the storage data in the associative memory word 44-1-2 through 44-5-2, taking the mask information into account, a valid state "1" is put into the match line 37-1-2, 37-3-2, and 37-5-1, and an invalid state "0" is put into the match 37-2-2 and 37-4-2.

The memory means 43-1 through 43-5 supplies the value "1" initialized at the step S100 to the common match line 38-1 through 38-5. Hence, the logical AND signal 40-1, 40-3, and 40-5 into "1", and 40-2 and 40-4 is put into "0", respectively. The value of the logical AND signal 40-1 through 40-5 is stored in the memory means 43-1 through 43-5 by the memory control signal 12 as the operation proceeds to the next step S102.

[Step S102]

Next, the description is proceeded to the step S102 in FIG. 5. The main controller 6, synchronizing with a clock signal 41, proceeds to the step S102 in the flow chart in FIG. 5, and supplies a valid state "1" only to the secondary search enabling signal 11-1 corresponding to the associative memory searching for a single field 36-1 which possesses the first priority among the primary search enabling signal 10-1 through 10-*r* and the secondary search enabling signal 11-1 through 11-*r*. Other signals are supplied with an invalid state "0". The main controller 6 also supplies the signal to the memory control signal 12 with which the value of the logical AND signal 40-1 through 40-*m* is stored in the memory means 43-1 through 43-*m* as the operation proceeds to the next step S103.

Next, referring to FIG. 8, operation of step S102 will be described when the above-mentioned associative memory 1 is used in determination of transfer permission from the user's terminal (PC) 401-1 with the network address (1, 2, 6) to (PC) 401-3 with the network address (2, 3, 5) in FIG. 33.

Since the memory means 43-1 through 43-5 supplies the value "1" stored at the step S101, the common match line 38-1 38-3, and 38-5 is put into "1", and 37-2 and 38-4 is put into "0", respectively. As a result, the intermediate data 93-1 possess the state "001, 010, 000", as the result of the logical OR operation of all the storage data stored in the associative memory word 44-1-1 44-3-1, and 44-5-1. Likewise, the intermediate data 93-2 possess the state "010, 011, 101", as the result of the logical OR operation of all the storage data stored in the associative memory word 44-1-2, 44-3-2, and 44-5-2.

Since the secondary search enabling signal 11-2 is in a valid state "1" in the associative memory searching for a single field 36-2 with the first priority, the two-input/one-output n-bit selector with enable 82-1 supplies the value of the intermediate data 93-1 "001, 010, 000" as the bit line data 95-1, and the comparison control line 85-1 is supplied with a valid state "1". Therefore, as the result of the comparison with the value of the bit line data 95-1 and the storage data in the associative memory word 44-1-1 through 44-5-1, irrespective of the mask information, a valid state "1" is put into the match line 37-1-1 and 37-3-1, and a invalid state "0" is put into the mat 37-2-1, 37-4-1 and 37-5-1.

Both the primary search enabling signal 10-2 and the secondary search enabling signal 11-2 are in an invalid state "0" in the associative memory searching for a single field 36-2. Hence, the invalidation signal 87-2 is put into in a valid state "1", and the two-input/one-output n-bit selector with enable 82-2 supplies the search invalidation signal as the bit line data 95-2, and the comparison control line 85-2 is supplied with an invalid state "0". Consequently, all of the match line 37-1-2 through 37-5-2 are put into a valid state "1".

As a result of the logical AND operation of the match line 37-1-1 through 37-5-1, the match line 37-1-2 through 37-5-2, and the common match line 38-1 through 38-5, the logical AND and 40-3 is put into a valid state "1", and the logical AND signal 40-2, 40-4 and 40-5 is put invalid state "0". The value of the logical AND signal 40-1 through 40-5 is stored in the memory means 43-1 through 43-5 by the memory control signal 12 as the operation proceeds to the next step S103.

[Step S103~S105]

Next, the description is proceeded to the step S103 through S105 in FIG. 5. The main controller 6, synchronizing with a clock signal 41, proceeds to the step S103 in the flowchart in FIG. 5, and compares the value "p" of the internal variable 28 and "r", the number of the associative memory searching for a single field 36. Upon coincidence, the searching operation is completed, and the final search result is supplied as the match signal 5-1 through 5-*m* with valid state. Upon incoincidence, the operation proceeds to the step S104 wherein the value "p" of the internal variable 28 is added by 1. Then in the next step S105, a valid state "1" is supplied to only to the secondary search enabling signal 11-*p* corresponding to the associative memory searching for a single field 36-*p* which possesses the same priority as p among the primary search enabling signal 10-1 through 10-*r* and the secondary search enabling signal 11-1 through 11-*r*. Other signals are supplied with an invalid state "0". The value of the logical AND signal 40-1 through 40-*m* at step S105 is supplied to the memory control signal 12 in order to store them in the memory means 43-1 through 43-*m* as the operation proceeds to the next step S103. Although the step S103, S104, and S105 are operated with the same state as the clock 41 in description of the first embodiment, it is possible to implement the similar function even the operation is divided by the clock 41.

Next, referring to FIG. 9, description will be made about a operation of step S105 when the above-mentioned associative memory 1 is used in determination of transfer permission from the user's terminal (PC) 401-1 with the network address (1, 2, 6) to (PC) 401-3 with the network address (2, 3, 5) in FIG. 33.

The memory means 43-1 through 43-5 supplies the value stored at the step S102. Hence the common match line 38-1 and 38-3 is put into "1", and the common match line 38-2 38-4, and 38-5 is put into "0", respectively. As a result, the intermediate data 93-1 in the associative memory searching for a single field 36-1 possess the state "001, 010, 000", which is the result of the logical OR operation of the storage data stored in the associative memory word 44-1-1 and 44-3-1. Like wise, the intermediate data 93-2 in the associative memory searching for a single field 36-2 possess the state "010, 011, 000", which is the result of the logical OR operation of the storage data stored in the associative memory word 44-1-2 and 44-3-2.

Both the primary search enabling signal 10-1 and the secondary search enabling signal 11-1 are in an invalid state "0" in the associative memory searching for a single field 36-1. Hence, the invalidation signal 87-1 is put into in a valid state "1", and the two-input/one-output n-bit selector with enable 82-1 supplies the search invalidation signal as the bit line data 95-1, and the comparison control line 85-1 is supplied with an invalid state "0". Consequently, all of the match lines 37-1-1 through 37-5-1 are put into a valid state "1".

Since the secondary search enabling signal 11-2 is in a valid state "1" in the associative memory searching for a single field 36-2 with the second priority because the value "p" of the internal variable is 2, the two-input/one-output n-bit selector with enable 82-2 supplies the value of the intermediate data 3-2 "010, 011, 000" as the bit line data 95-2, and the comparison control line 85-2 is supplied with a valid state "1". Therefore, as the result of the comparison with the value of the bit line data 95-2 and the storage data in the associative memory word 44-1-2 through 44-5-2, irrespective the mask information, an invalid state "0" is put into the match line 37-1-2, 37-2-2, 37-4-2, and 37-5-2.

As a result of the logical AND operation of the match line 37-1-1 through 37-5-1, the match line 37-1-2 through 37-5-2, and the common match line 38-1 through 38-5, the logical AND signal 40-3 is put into a valid state "1", and the logical AND signal 40-1, 40-2, 40-4 and 40-5 is put into an invalid state "0". The value of the logical AND signal 40-1 through 40-5 is stored in the memory means 43-1 through 43-5 by the memory control signal 12 as the operation proceeds to the next step S103.

Next, the description is proceeded to the step S103 in FIG. 5. The main controller 6, synchronizing with a clock signal 41, proceeds to the step S103 in the flowchart in FIG. 5, and compares the value "p" of the internal variable 28 and "r", the number of the associative memory searching for a single field 36. Herein FIG. 9, both the value "p" of the internal variable 28 and "r", the number of the associative memory searching for a single field 36 in the associative memory 1 are 2, and upon coincidence, the searching operation is completed. The final search result is acquired from the match signal 5-3, only which supplies the valid state "1" among the match signal 5-1 through 5-5. As mentioned above, the transfer from the user's terminal (PC) 401-1 with the network address (1, 2, 6) to (PC) 401-3 with the network address (2, 3, 5) ought to applied the transfer rule 3, which indicates that the operation possesses resulted properly.

The frequency of the clock signal can be made higher by inserting a weight cycle just before the step S102 and S105 and latch to store the intermediate data 93-1 through 93-*r*.

The secondary search in step S105 is operated among the words matched in the secondary searching operation in step S102. Thus, as will readily be understood, the value of intermediate data 93-1 in step S105 in FIG. 9 is as same as the value of intermediate data 93-1 in step S102 in FIG. 8. Therefore, similar result is acquired even if the secondary search-signal 11-1 through 11-*p* is supplied with a valid state in step S105 in FIG. 5 when the value of the internal variable 28 is "p".

It is possible to implement the similar function of the conventional associative memory by changing the operation of the main controller 6 to supply a valid state to all secondary search enabling signal 11-1 through 11-*r*. It is also possible for one associative memory1 to implement the similar function of r conventional associative memory, r in number, 101 by controlling the primary search enabling signal 10-*i* and the secondary search enabling signal 11-*i*, independently against the i-th search data 3-*i*. It is also possible to switch the operation described in FIG. 5 of this invention and plural operations mentioned above, by adding the input signal to the main controller 6 in order to select the operation.

As mentioned above, for the associative memory 1 of this invention, it is possible to determine the transfer permission through three steps such as S101, S102, and S105. By the use of one clock per one searching operation in the associative memory of this invention, the calculation to determine the transfer permission is implemented by (r+1) clocks, (r+1) in number, where r represents the number of the search field.

Since only the match signal corresponding to the transfer rule to be applied is put into a valid state, there is no limitation for the order of stored transfer rules or position of stored words. Therefore, pre-event process is not required which needs considerable clocks for example, sorting, or preparing a table, when the transfer rule is added, eliminated, or edited. Using the process of this invention, the software to administrate the associative memory can be simplified dramatically.

In this first embodiment of this invention, the associative memory can be produced with only slight increase in circuit scale, by about few percents, compared with the conventional associative memory.

Second Construction of an Associative Memory Searching for a Single Field According to the First Embodiment Next referring to FIG. 10, description will be made about the associative memory searching for a single field 22, in the associative memory in the first embodiment, according to a second embodiment of this invention. The associative memory searching for a single field 22 of the second embodiment is similar to the associative memory searching for a single field 36 in FIG. 3, except changing the two-input/one-output n-bit selector with enable 82 to the two-input/one-output n-bit selector 96, inserting the logical gate 37-*j* at the i-th match line 37-*j*, supplying the invalidation signal 87 from the controller 45 to m-th logical gate 78-1 through 78-*m*, and changing the name of the signal to internal match line 97-*j* which is supplied as the comparison result of n-th associative memory cell 69-*j*-1 through 69-*j*-*n* in i-th memory word 70-1. Therefore, description will be directed only to those components different from the associative memory searching for a single field 36 of the first embodiment.

The two-input/one-output n-bit selector 96 is supplied with the selection signal 86, the intermediate data line 92-1 through 92-*n*, the search data 3-1 through 3-*n*, and deliver bit line 51-1 through 51-*n* through 51-*n*. The two-input/one-output n-bit selector 96 delivers to the bit line 51-1 through 51-*n* with the search data 3-1 through 3-*n*, and the intermediate data line 92-1 through 92-*n*, when the selection signal 86 is in an invalid state and in valid state, respectively.

The internal match line 97-1 through 97-*m* is precharged to a high level to be put into a valid state "1", prior to the start of the searching operation. As similar to the match line 37 in FIG. 3, The wired AND logic concatenation with the valid state "1" for the internal match line 97 as true is achieved such that, when all of the comparator 84-*j*-1 through 84-*j*-*n*, n in number, in the associative memory word 44-*j* render the internal match line 97-*j* in an opened state, the internal match line 97-*j* is put into a valid state "1" and otherwise into an invalid state "0". Alternatively, an ordinary logical gate may be used as far as the similar operation is performed.

The j-th logical gate 78-*j* is supplied the internal match line 97-*j* and the invalidation single 87, and provide the match line 37-*j*. The logical gate 78-*j* supplies a valid state of the common match line 38 to the match line 37-*j* when the invalidation single 87 is in a valid state. Otherwise, the logical gate 78-*j* supplies the state of the logical gate 78-*j* to the match line 37-*j*.

Figure 10:
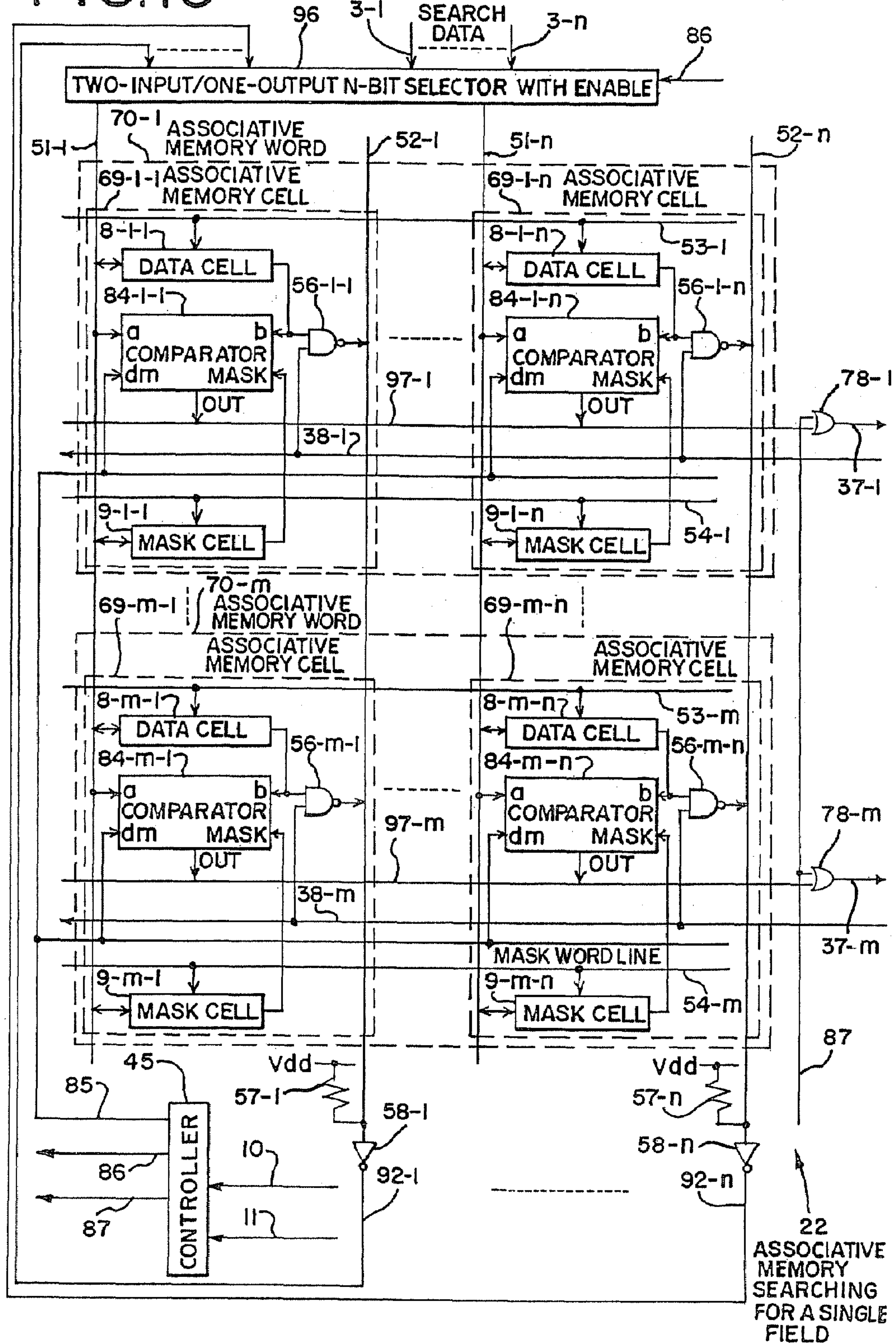
FIG. 10 is a block diagram of the second example of associative memories searching for a single field in an associative memory according to the first embodiment of this invention.

In other words, unlike the associative memory searching for a single field 36 in FIG. 3 with the function to supply the search invalidation data to the bit line 51+1 through 51-*n*, the associative memory searching for a single field 22 in FIG. 10 in the second embodiment of this invention implements the function to put the match line 37-1 through 37-*m* into a valid state of all common match line 38 when both the primary search enabling signal 10 and the secondary search enabling signal 11 are in an invalid state, controlling the match line 37-1 through 37-*m* by the logical gate 78-1 through 78-*m*. Irrespective of the structure of the comparator 84-1-1 through 84-*m*-*n*, above mentioned function is implemented with the associative memory searching for a single field 22 in the second embodiment. It is also possible to implement the similar function as the whole associative memory 1 even the inserted position of the logical gate 78-1 through 78-*m* is moved to before the input of logical AND means 39-1 through 39-*m*.

Construction of the Second Embodiment

Next referring to FIG. 11, description will be made about the associative memory 29 according to a second embodiment of this invention. The associative memory 29 concatenates the output signals, which are the comparison results of j-th associative memory words 27-*j*-1 through 27-*j*-*r* of each associative memory searching for a single field 26-1 through 26-*r*, r in number, to one match line 37-*j* by a wired AND logic concatenation. The associative memory 29 utilizes these states stored in the match line 37-*j* dynamically in order to produce the intermediate data. Herein, the data match line 37-*j* is precharged into a valid state "1" only when the start signal 42 is in a valid state. Thus, the logical AND means 39-*j*, memory means 43-*j*, and common match line 38-*j* in the associative memory 1 according to the first embodiment in FIG. 2 is implemented by the match line 37-*j*, concatenated by wired AND logic, in the associative memory 29 according to the second embodiment in FIG. 11. Consequently, the memory control signal 12 supplied from the main controller 6 is concatenated nowhere. The main controller 6 supplies the state of the match line 37-*j* as the match signal 5-*j*, directly outside. The associative memory 29 according to the second embodiment possess similar structure to the associative memory 1 according to the first embodiment except above mentioned components. It will therefore be understood that similar searching operation is implemented against the input data composed of plural search data.

Figure 11:
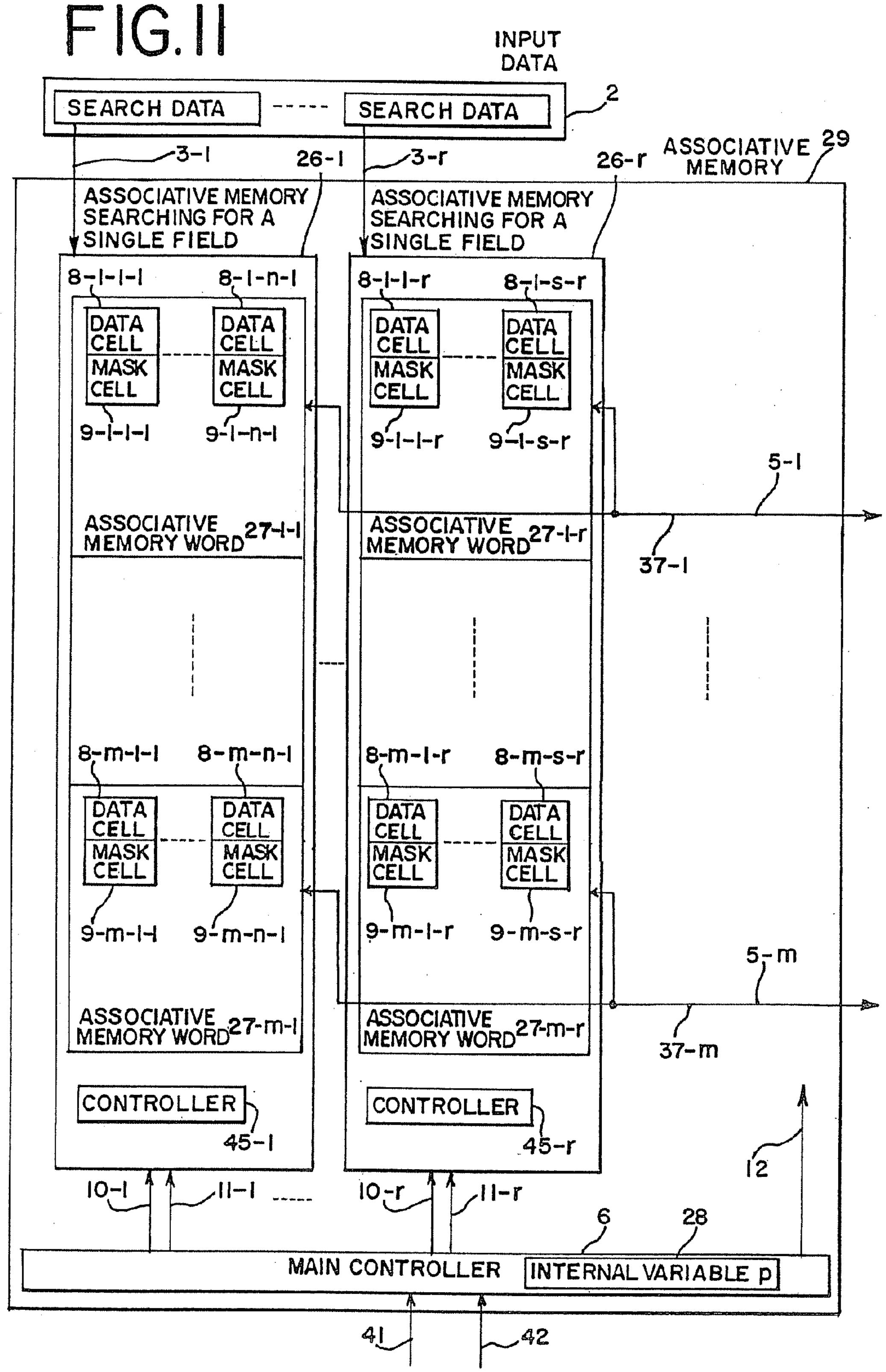
FIG. 11 is a detailed block diagram of one example of associative memories according to the second embodiment of this invention.

Only the match lines 37-1 through 37-*m*, m in number, between associative memories searching for a single field 26-1 through 26-*r*, r in number, are required in the associative memory 29 in FIG. 11. The match lines 37-1-1 through 37-*m*-*r* and common match line 38-1 through 38-*m*, m in number, between associative memories searching for a single field 36-1 through 36-*r*, r in number, are required in the associative memory 1 in FIG. 2. Specifically, (m*(r+1)) lines, (m*(r+1)) in number, are required in the associative memory 1 in FIG. 2. Therefore, the associative memory 29 of the second embodiment of this invention implements the significant reduction of lines. The lines between associative memories searching for a single field 26-1 through 26-*r*, r in number, are wired up over the whole associative memory 29. Thus, the parasitic capacitance is very large, and the power consumption of the whole chip goes very large as the maintained status changes. Consequently, the associative memory 29 of the second embodiment of this invention can be implemented in a shorter line, a smaller chip, and significant reduction of the power consumption.

Next referring to FIG. 12, description will be made about the associative memory searching for a single field 26 according to a second embodiment of this invention. The associative memory searching for a single field 26 of the second embodiment is similar to the associative memory searching for a single field 36 in FIG. 3 of the first embodiment, except eliminating the common match line 38-*j* in the j-th associative memory word 27-*j*, and changing the common match line 38-*j* to the match line 37-*i* to supply the logical gates 56-*j*-1 through 56-*j*-*n* in the associative memory cell 71-*j*-1 through 71-*j*-*n*, n in number, which compose the j-th associative memory word 27-*j*.

Figure 12:
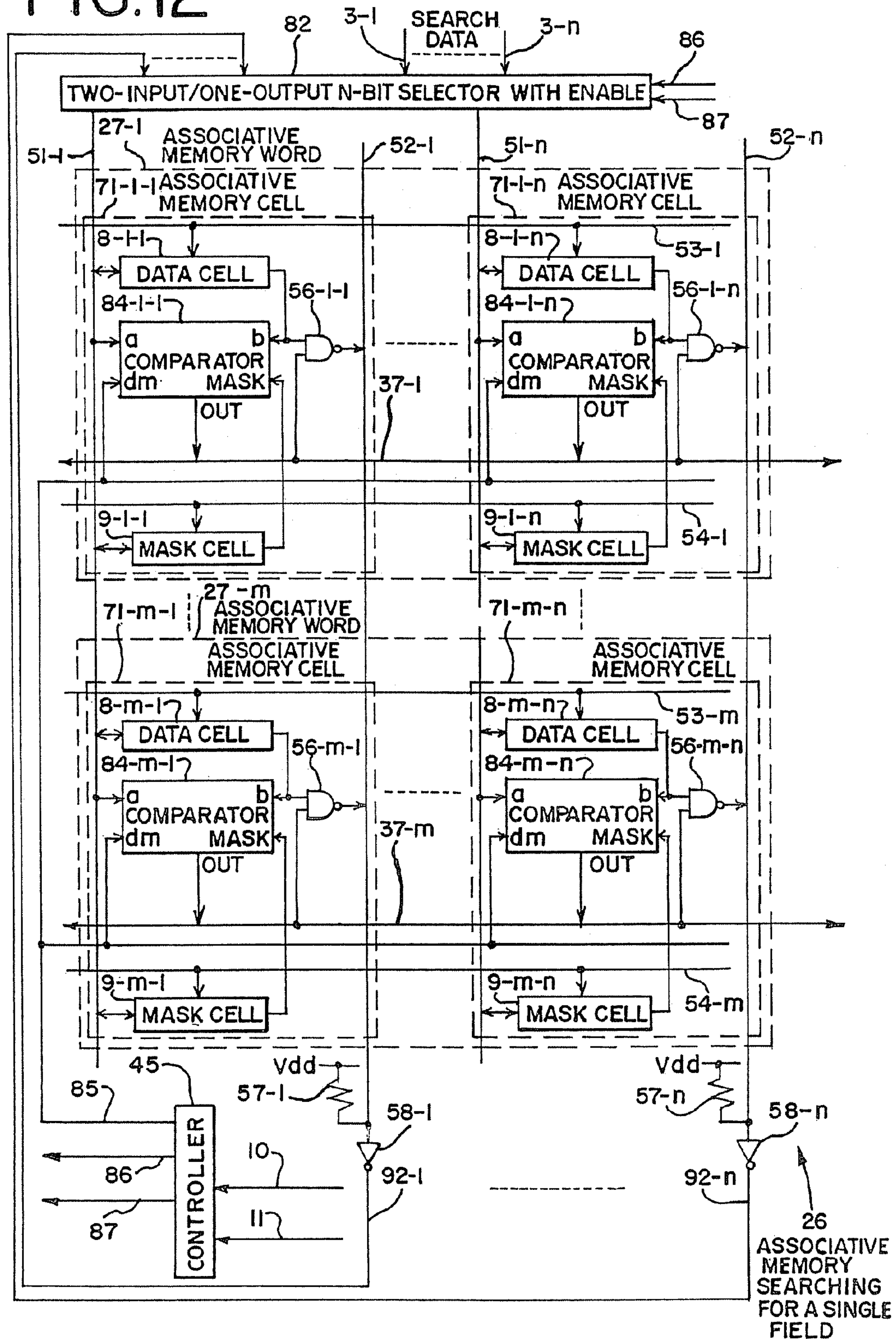
FIG. 12 is a block diagram of one example of associative memories searching for a single field in an associative memory according to the second embodiment of this invention.

The associative memory searching for a single field 26 in FIG. 12 produces 37-*j*, which is the output signal, by a wired AND logic concatenation of logical gate 56-*j*-1 through 56-*j*-*n*. Thus, it is possible to share the common match line 38-*j* with match line 37-*j* in the associative memory searching for a single field 26.

As will readily be understood, when the match line 37-1 through 37-*m* is produced by an ordinary logical gate in stead of the wired AND logic concatenation, the similar operation is performed as the associative memory searching for a single field 26 in the associative memory 29 of the second embodiment, by using the logical gate to supply the match line 37-*j* which drives the output only in case of an invalid state, otherwise, puts the output into an opened state in case of a valid state, even at the associative memory searching for the single field wherein the match line 37-1 through 37-*m* is supplied from the logical gate 78-1 through 78-*m* as described in FIG. 10.

The state of the match line 37-*j* is supplied as the match signal 5-*j* directly outside in FIG. 11. The state of the match line 37-*j* may be supplied as the match signal 5-*j*, after buffering the state of the match line 37-*j* for shaping.

Construction of the Third Embodiment

Next referring to FIG. 13, description will be made about an associative memory 25 according to the third embodiment of this invention. The associative memory 25 of the third embodiment is similar to the associative memory 1 of the first embodiment, except changing The associative memory searching for a single field 36-1 through 36-*r* into the associative memory searching for a single field 4-1 through 4-*r*, changing the logical AND means 39-1 through 39-*m* into the logical AND means 13-1 through 13-*m*, and adding the logical AND means 15-1 through 15-*m*. With the associative memory searching for a single field 36 in the associative memory 1 of the first embodiment, both search results of the primary search enabling signal 10 in a valid state and the secondary search enabling signal 11 in a valid state are supplied to the same match line 37-1 through 37-*m*. In this embodiment, the associative memory 25 is described with the associative memory searching for a single field 4-1 through 4-*r* which possess both the primary match line 17-1 through 17-*m* and the secondary match line 18-1 through 18-*m*, which supply the search results of the primary search enabling signal 10 and the secondary search enabling signal 11, independently. Therefore, description will be directed only to components different from the associative memory in the first embodiment.

The i-th associative memory searching for a single field 4-*i* is supplied the search data 3-*i*, the primary search enabling signal 10-1 through 10-*i*, the secondary search enabling signal 11-1 through 11-*i*, and the common math line 38-1 through 38-*m*, and as a search result in a single field, provides the primary match line 17-*i*-1 through 17-*i*-*m*, m in number, and the secondary match line 18-*i*-1 through 18-*i*-*m*, m in number, respectively.

The searching operation of the associative memory searching for a single field 4-*i* is controlled by the primary search enabling signal 10-*i*, and the secondary search enabling signal 11-*i*, as follows. When the primary search enabling signal 10-*i* is in a valid state, the primary searching operation is performed in which the search data 3-*i* and the internal storage data is compared taking the corresponding mask information into account. The search result is provided into the primary match line 17-*i*-*i* through 17-*i*-*m*. When the secondary search enabling signal 11-*i* is in a valid state, intermediate data is produced depends on the state of common match line 38-1 through 38-*m*, using the internal storage data and/or mask information. The result of secondary searching operation by intermediate data is provided into the secondary match line 18-*i*-1 through 18-*i*-*m*. Referring to the secondary searching operation by intermediate data, in case that the secondary searching operation is implemented following to the primary searching operation with the i-th associative memory searching for a single field 4 independently composed, only the secondary match line 18-*i*-1 through 18-*i*-*m* is supplied with a valid state, which corresponds to the storage data with the least number of bits in a mask valid state, in the storage data coincident with the search data 3-*i* taking the mask information into account.

The i-th associative memory searching for a single field 4-*i* puts the primary match lines 17-*i*-1 through 17-*i*-*m*, m in number, into a valid state of all common match line 38 when the result of the primary search enabling signal 10-*i* is in an invalid state. Likewise, the i-th associative memory searching for a single field 4-*i* puts the secondary match lines 18-*i*-1 through 18-*i*-*m*, m in number, into a valid state of all common match line 38 when the result of the secondary search enabling signal 11-*i* is in an invalid state.

The j-th logical AND means 13-*j* is supplied the primary match line 17-*j*-1 through 17-*j*-*r*, r in number, single common match line 38-*j*, and single match signal 5-*j*, and provides the result of logical AND as the logical AND signal 40-*j* wherein logical operation is a logical AND with the valid state for the common match line 38-*j* as true.

Likewise, the j-th logical AND means 15-*j* is supplied the secondary match line 18-*j*-1 through 18-*j*-*r*, r in number, and provides the result of logical AND as the logical AND signal 5-*j* wherein logical operation is a logical AND with the valid state for the common match line 38-*j* as true.

Referring to FIG. 2, the associative memory 1 is described in detail as one example of preferred embodiments according to a first embodiment of this invention. In this example, the m-th n-bit associative memory searching for a single field 36-1 are similar to the corresponding component in the m-th s-bit associative memory searching for a single field 36-*r* except the bit number of one word. In this embodiment, the m-th g-bit associative memory searching for a single field 4-*i* is described which possesses both the m-th g-bit primary associative memory 20-*i* and the m-th g-bit secondary associative memory 21-*i* independently, which perform the searching operation when the primary search enabling signal 10-1 and the secondary search enabling signal 11-*i* are in a valid state, respectively. The composition of the associative memory searching for a single field 4-*i* of the associative memory 25 in FIG. 13 may not be limited to the composition described in FIG. 14, and it will therefore be understood that the similar composition is implemented by using the associative memory described in the Japanese Unexamined Patent Publication (JP-A) No.H11-073782(073782/1999), for example.

The primary associative memory 20-*i* is supplied with the search data 3-*i*, the primary search enabling signal 10-*i*, and the common match line 38-1 through 38-*m*, and provides the search result in a single field to the primary match line 17-1-*i* through 17-*m*-*i*. At the same time, the primary associative memory 20-*i* also provides the intermediate data 93-*i*. The primary associative memory 20-*i* put all the primary match lines 17-*i*-1 through 17-*i*-*m*, m in number, into a valid state of common match line 38 when the result of the primary search enabling signal 10-*i* is in an invalid state. The primary associative memory 20-*i* possesses the associative memory word 7-1-*i* through 7-*m*-*i*, m in number, and the j-th associative memory word 7-*j*-*i* possesses the data cell 8-*j*-1-*i* through 8-*j*-*g*-*i* and the mask cell 9-*j*-1-*i* through 9-*j*-*g*-*i*, g in number.

The secondary associative memory 21-*i* is supplied with the intermediate data 93-*i*, and the secondary search enabling signal 11-*i*, and provides the search result in a single field to the secondary match line 18-1-*i* through 18-*m*-*i*. The secondary associative memory 21-*i* put all the primary match lines 18-*i*-*i* through 18-*i*-*m*, m in number, into a valid state of common match line 38 when the result of the secondary search enabling signal 11-*i* is in an invalid state. The secondary associative memory 21-*i* possesses the associative memory word 24-1-*i* through 24-*m*-*i*, m in number, and the j-th associative memory word 24-*j*-*i* possesses the data cell 23-*j*-1-*i* through 23-*j*-*g*-*i*. Prior to the operation, the data cell 23-*j*-*k*-*i* in the j-th memory word 24-*j*-*i* stores the second storage data which possess the same value as the storage data stored in the data cell 8-*j*-*k*-*i* corresponding to the primary associative memory 20-*i*. However, the data cell 23-*j*-*k*-*i* in the j-th memory word 24-*j*-*i* stores the second storage data which possess an invalid state when the bit information stored in the corresponding mask cell 9-*j*-*k* is in a valid state.

Figure 15:
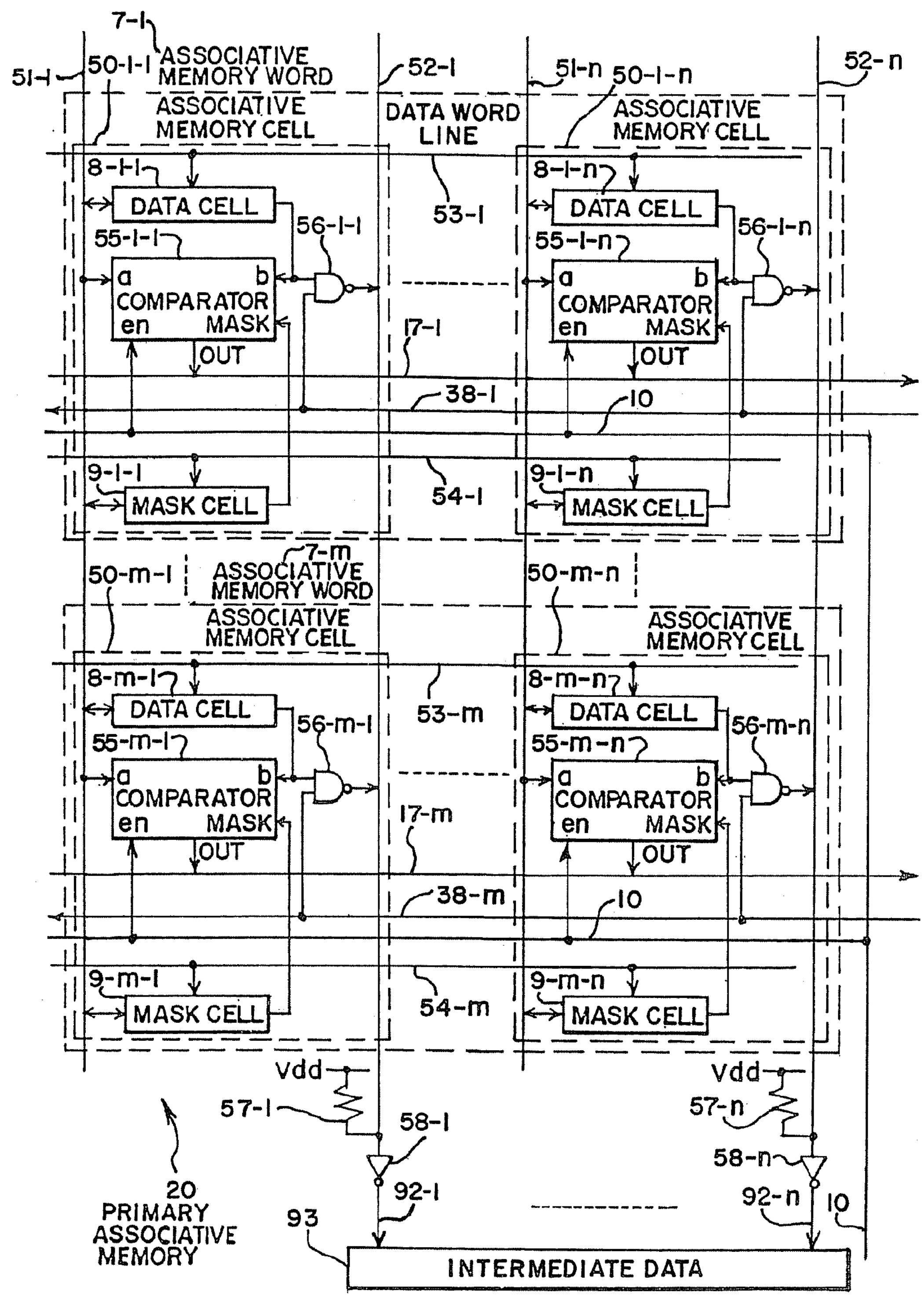
FIG. 15 is a block diagram of one example of primary associative memories in an associative memory according to the third embodiment of this invention.

Construction of an Associative Memory Searching for a Single Field According to the Third Embodiment Referring to FIG. 15, the primary associative memory 20 according to the third embodiment of this invention comprises the first through m-th n-bit associative memory words 7, the logical gates 58-1 through 58-*n*, the registers 57-1 through 57-*n*. The j-th associative memory word 7-*j* comprises the associative memory cells 50-*j*-1 through 50-*j*-*n*. Each associative memory word 7-*j* (where j is an integer variable between 1 and m, both inclusive) comprises first through n-th associative memory cells 50-*j*-1 through 50-*j*-*n*. Each of the associative memory words 7-*j* is concatenated to the corresponding data word line 53-*j*, the corresponding mask word line 54-*j*, the common match line 38-*j*, and the primary search enabling signal 10 as input lines, and to the corresponding primary match line 17-*j* and the first through the n-th matched data intermediate logic lines 52 as output lines and to the first through the n-th bit lines 51 as data input/output lines.

In this embodiment, a valid state and an invalid state for the mask information are represented by "0" and "1". A valid state and an invalid state are represented by "1" and "0", respectively, for all of the storage data, the matched data logical-OR lines 52-1 through 52-*n*, the primary match line 17-1 through 17-*m*, the secondary match line 18-1 through 18-*m*, and the common match lines 38-1 through 38-*m*.

Prior to the start of the searching operation, the primary match line 17 is precharged to a high level to be put into a valid state "1".

The k-th associative memory cell 50-*j*-*k* of the associative memory word 7-*j* is concatenated to the corresponding data word line 53-*j*, the corresponding mask word line 54-*j*, the common match line 38-*j*, and the primary search enabling signal 10 as input lines, and to the corresponding primary match line 17-*j* and the matched data intermediate logic lines 52-*k* as output lines and to the bit lines 51-*k* as data input/output lines.

Each associative memory cell 50-*j*-*k* comprises a data cell 8-*j*-*k*, a comparator 55-*j*-*k*, a mask cell 9-*j*-*k*, and logical gate 56-*j*-*k*. The data cell 8-*j*-*k* is for storing "data" bit information at a corresponding bit of storage data supplied from an external source through a bit line 51-*k*. The comparator 55-*j*-*k* is for comparing the "data" bit information memorized in the data cell 8-*j*-*k* and information supplied from the external source. The mask cell 9-*j*-*k* is for storing "mask" bit information of a corresponding bit of mask information supplied from the external source through the bit line 51-*k*.

The primary associative memory 20 in FIG. 15 is similar to the associative memory searching for a single field 36 in FIG. 3, except being supplied the search data 3-1 through 3-*n* from external source to the bit line 51-1 through 51-*n* directory, supplying the state of the intermediate data line 92-1 through 92-*n* directly exteriorly, eliminating the two-input/one-output n-bit selector with enable 82 and the controller 45, changing the signal supplied to the comparator 55 from the comparison control signal 85 into the primary search enabling signal 10, and changing the name of the match line 37-1 through 37-*m* into primary match line 17-1 through 17-*m*. The intermediate data 93 is provided by the intermediate data line 92-1 through 92-*n* in the similar operation of the associative memory searching for a single field 36 in FIG. 3.

Therefore, description will be directed only to those components different from the associative memory searching for a single field 36 of the first embodiment.

The comparator 55-*j*-*k* is supplied with the value of the search data on the corresponding bit line 51-*k*, the storage data stored in the data cell 8-*j*-*k* in the same associative memory cell 50-*j*-*k*, the mask information stored in the mask cell 9-*j*-*k* in the same associative memory cell 50-*j*-*k*, and the primary search enabling signal 10, and produce the primary match line 17-*j*. When the primary search enabling signal 10 is in a valid state and the value on the corresponding bit line 51-*k* and the storage data stored in the data cell 8-*j*-*k* are not coincident with each other, the primary match line 17-*j* is put into an invalid state "0". Otherwise, the comparator 55-*j*-*k* puts the primary match line 17-*j* into an opened state. Thus, the wired AND logic concatenation is achieved such that, when all of the comparator 55, n in number, in the associative memory word 7-*j* render the primary match line 17-*j* in an opened state, the primary match line 17 is put into a valid state "1" and otherwise into an invalid state "0". In other words, the primary match line 17-*j* is always in a valid state "1" when the primary search enabling signal 10 is in an invalid state "0". In case the primary search enabling signal 10 is in a valid state "1", only when all of the storage data stored in the associative memory word 7-*j* is completely coincident with the bit lines 51-1 through 51-*n* except those bits excluded from a comparison object by the corresponding mask information, the primary match line 17-*j* is put into a valid state "1" and otherwise into an invalid state "0". Alternatively, an ordinary logical gate may be used as far as the similar operation is performed.

Detailed Construction of an Associative Memory Searching for a Single Field According to the Third Embodiment Next referring to FIG. 16, description will be made about an associative memory cell 50 according to a third embodiment of this invention. The associative memory cell 50 is similar to the associative memory cell 83 of the first embodiment in FIG. 4 except changing the comparison control signal 85 into the primary search enabling signal 10 to supply the comparator 55, renaming the match line 37-1 through 37-*m* the primary match line 17-1 through 17-*m*, eliminating the MOS transistor (T7) 209 which conductive state is controlled by the comparison control signal 85, and adding the MOS transistor (T12) 216 which conductive state is controlled by the primary search enabling signal 10. Therefore, description will be directed only to components different from the associative memory cell 83 of the first embodiment.

The comparator 55 comprises a MOS transistor (T3) 205, a MOS transistor (T4) 206, a MOS transistor (T5) 207, a MOS transistor (T6) 208, and a MOS transistor (T12) 216. The MOS transistor (T3) 205 and the MOS transistor (T4) 206 are inserted between the bit lines 51*a* and 51*b* in cascade. The MOS transistor (T3) 205 is rendered conductive when the inverted logical gate (G1) 201 in the data cell 8 produces an output of a high level. The MOS transistor (T4) 206 is rendered conductive when the inverted logical gate (G2) 202 in the data cell 8 produces an output of a high level. The MOS transistor (T6) 208, the MOS transistor (T12) 216 and the MOS transistor (T5) 207 are concatenated between a low potential and the primary match line 5 in cascade. The MOS transistor (T6) 208 is rendered conductive when the inverted logical gate (G4) 211 in the mask cell 9 produces an output of a high level. The MOS transistor (T12) 216 is rendered conductive when the primary search enabling signal 10 is in a valid state "1".

The MOS transistor (T5) 207 is rendered conductive when a junction or node of the MOS transistor (T3) 205 and the MOS transistor (T4) 206 possesses a potential of a high level. When both the bit line 51*a* and the inverted logical gate (G1) 201 produce outputs of a high level or when both the bit line 51*b* and the inverted logical gate (G2) 202 produce outputs of a high level, the junction of the MOS transistor (T3) 205 and the MOS transistor (T4) 206 possesses a high level to render the MOS transistor (T5) 207 conductive.

Therefore, when the storage data stored in the data cell 8 and the search data 3 on the bit lines 51*a* and 51*b* are different from each other, the MOS transistor (T5) 207 is rendered conductive. The MOS transistor (T6) 208 is put into an opened state and conductive state when the mask information stored in the mask cell 9 is "0" and "1", respectively. The primary match line 17 is precharged to a high potential prior to the start of the searching operation. This provides the wired AND concatenation such that, when a plurality of the associative memory cells 50 are concatenated to the primary match line 17 through the MOS transistors (T6) 208, the primary match line 17 is given a low level if at least one associative memory cell 50 produces an output of a low level.

When MOS transistor (T5) 207 is conductive and either of the MOS transistor (T6) 208 or the MOS transistor (T12) 216 is conductive, the associative memory cell 50 supplied an invalid state "0" to the match line 5. Otherwise, the primary match line 17 is put into an opened state. Specifically, when the mask information is in a valid state "0" and the primary search enabling signal 10 is in an invalid state "0", the primary match line 17 is put into an opened state irrespective of the result of comparison between the search data 3 and the storage data. Otherwise, when the mask information is in a valid state "1" and the primary search enabling signal 10 is in a valid state "1", the primary match line 17 is put into an opened state and supplied with an invalid state "0" when the search data 3 on the bit lines 51*a* and 51*b* and the storage data stored in the data cell 8 are coincident with each other and different from each other, respectively.

In this embodiment, it is implemented to put the primary match line 17 into opened state when the primary search enabling signal 10 is in an invalid state "0" by controlling the MOS transistor (T12) 216 by the primary search enabling signal 10. The similar operation is performed by the means to put the both bit lines 51*a* and 51*b* into "0" when the primary search enabling signal 10 is in an invalid state "0", as similar to the associative memory searching for a single field 36 in the first embodiment. Alternatively, the similar operation is performed by inserting the logical gate which puts the primary match line in a valid state when the primary search enabling signal 10 is in an invalid state, as similar to the associative memory searching for a single field 22 in the second example of the first embodiment.

Figure 17:
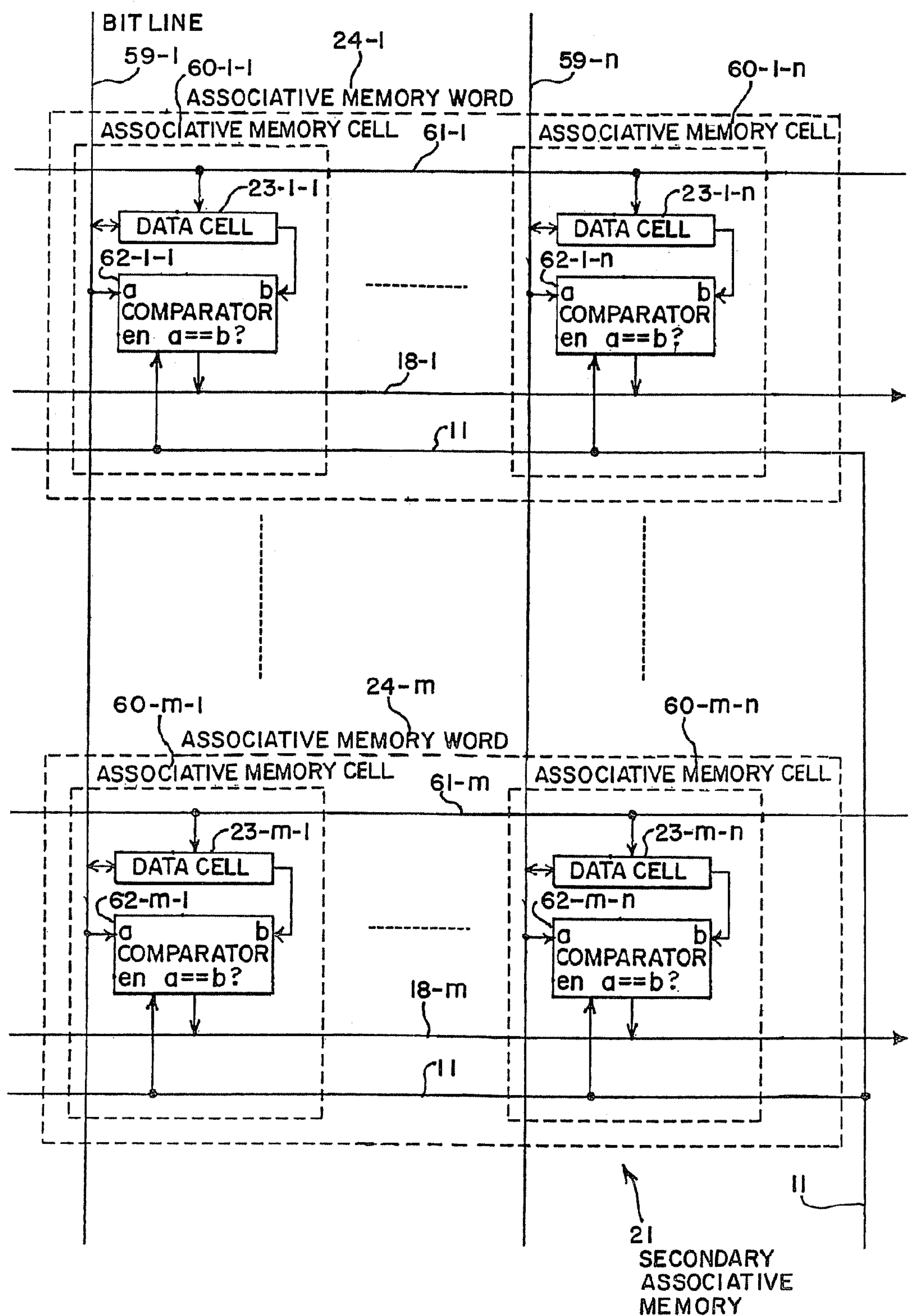
FIG. 17 is a block diagram of one example of secondary associative memories in an associative memory according to the third embodiment of this invention.

Referring to FIG. 17, the secondary associative memory 21 comprises first through m-th associative memory words 24. Each associative memory word 24-*j* (where j is and integer variable between 1 and m, both inclusive) comprises first through n-th associative memory cells 60-*j*-1 through 60-*j*-*n*. Each of the associative memory words 24-*j* is concatenated to the corresponding data word line 61-*j* and secondary search enabling signal as input lines, and to the corresponding secondary match line 18-*j* as output lines, and to the first through the n-th bit lines 59 as data input/output lines.

The associative memory cell 60-*j*-*k* in the j-th associative memory word 24-*k* (where k is and integer variable between 1 and n, both inclusive) is concatenated to the corresponding data word line 61-*j* and the secondary search enabling signal 11 as input lines, and to the corresponding secondary match line 18-*j* as output lines, and to the corresponding bit line 59-*k* as data input/output line. The associative memory cell 105-*j*-*k* comprises a data cell 23-*j*-*k*, a comparator 62-*j*-*k*. The data cell 23-*j*-*k* is for storing the second "data" bit information at a corresponding bit of storage data supplied from an external source through the bit line 59-*k*. The comparator 62-*j*-*k* is for comparing the intermediate data 93 supplied through the bit line 59-*k* and the "data" bit information memorized in the data cell 23-*j*-*k*.

The operations of the bit line 59-*k*, the data word line 61-*j* and the data cell 23-*j*-*k* are similar, respectively, to the operations of the bit line 113, the data word line 103 and the data cell 108 of the conventional associative memory 107.

Prior to the start of the searching operation, the secondary match line 18 is precharged to a high level.

When the secondary search enabling signal 11 is in a valid state "1", and the second storage data and the value of the bit line 59-*k* in the same data cell 23-*j*-*k* is not coincident with each other, the comparator 62-*j*-*k* puts the corresponding secondary match line 18-*j* into an invalid state and otherwise into an opened state. Thus, the wired AND logic concatenation with the valid state "1" for the secondary match line 18 as true is achieved such that, when all of the comparator 62-*j*-1 through 62-*j*-*n*, n in number, in the associative memory word 24-*j* render the secondary match line 18 in an opened state, the secondary match line 18 is put into a valid state "1" and otherwise into an invalid state "0". In other words, upon the searching operation, when the secondary search enabling signal 11 is in an invalid state "0", the secondary match line 18-*j* is always in a valid state "1". Otherwise, if the secondary search enabling signal 11 is in a valid state "1", only when all of the storage data stored in an associative memory word 24-*j* are completely coincident with the bit lines 59-1 through 59-*n*, the secondary match line 18-*j* is put into a valid state "1" and otherwise into an invalid state "0". Alternatively, an ordinary logical gate may be used as far as the similar operation is performed.

Figure 16:
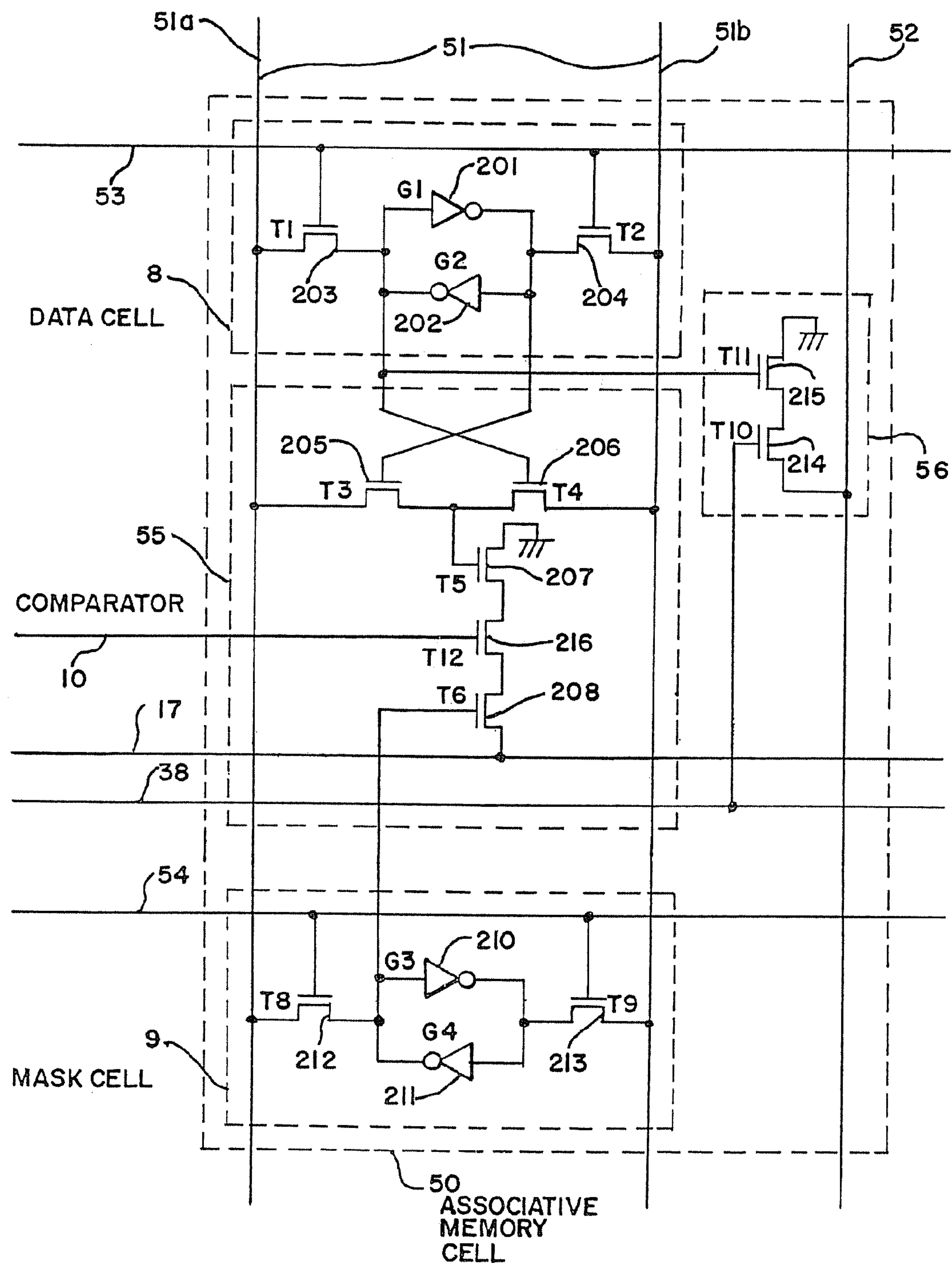
FIG. 16 is a circuit diagram of one example of associative memory cells of primary associative memory in an associative memory searching for a single field in an associative memory illustrated in FIG. 15.
Figure 18:
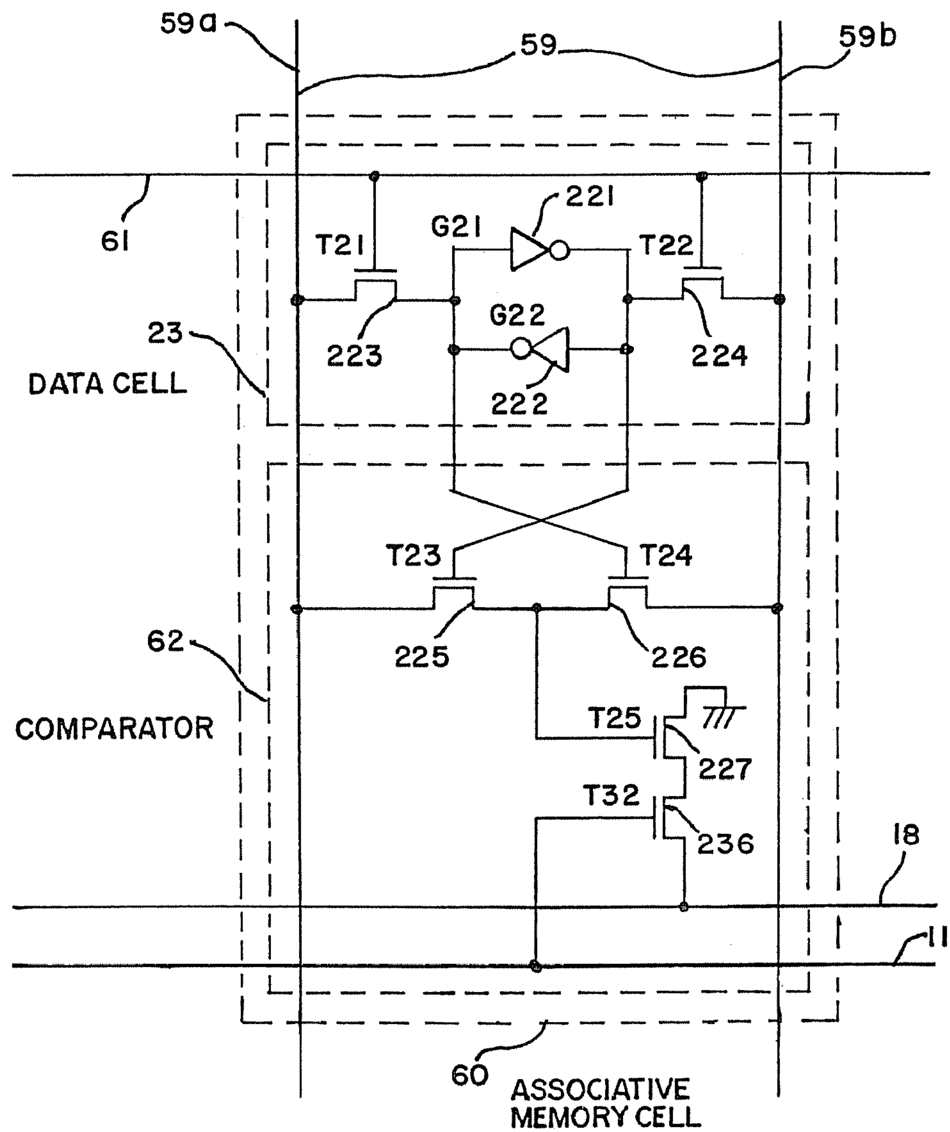
FIG. 18 is a circuit diagram of one example of associative memory cells of secondary associative memory in an associative memory illustrated in FIG. 17.

Next, referring to FIG. 18, each of the bit lines 59*a* and 59*b*, the data word line 61 and the data cell 23 in the associative memory cell 21 of the secondary associative 21 are similar to the corresponding component in the associative memory cell 50 of the primary associative memory 20 illustrated in FIG. 16.

The comparator 62 comprises the MOS transistor (T23) 225, the MOS transistor (T24) 226, the MOS transistor (T25) 227, and the MOS transistor (T32) 236. The MOS transistor (T23) 225 and the MOS transistor (T24) 226 are inserted between the bit lines 59*a* and 59*b* in cascade. The MOS transistor (T23) 225 is rendered conductive when the inverted logical gate (G21) 221 in the data cell 23 produces an output of a high level. The MOS transistor (T24) 226 is rendered conductive when the inverted logical gate (G22) 222 in the data cell 23 produces an output of a high level. The MOS transistor (T32) 236 and the MOS transistor (T25) 227 are concatenated between a low potential and the secondary match line 18 in cascade. The MOS transistor (T32) 236 is rendered conductive when the secondary search enabling signal 11 is in a valid state "1".

The MOS transistor (T25) 227 is rendered conductive when a junction or node of the MOS transistor (T23) 225 and the MOS transistor (T24) 226 possesses a potential of a high level. When both the bit line 59*a* and the inverted logical gate (G21) 221 produce outputs of a high level or when both the bit line 59*b* and the inverted logical gate (G22) 222 produce outputs of a high level, the junction of the MOS transistor (T23) 225 and the MOS transistor (T24) 226 has a high level to render the MOS transistor (T25) 227 conductive.

Therefore, when the storage data stored in the data cell 23 and the intermediate data 23 on the bit lines 59*a* and 59*b* are different from each other, the MOS transistor (T25) 227 is rendered conductive. The secondary match line 18 is precharged to a high potential prior to the start of the searching operation. This provides the wired AND concatenation such that, when a plurality of the associative memory cells 60 are concatenated to the secondary match line 18 through the MOS transistors (T32) 236, the secondary match line 18 is given a low level if at least one associative memory cell 60 produces an output of a low level.

Only when MOS transistor (T25) 227 is conductive and the MOS transistor (T32) 236 concatenated in cascade is conductive, the associative memory cell 60 supplied an invalid state "0" to the secondary match line 18. Otherwise, the secondary match line 18 is put into an opened state. Specifically, when the secondary search enabling signal 11 is in an invalid state "0", the secondary match line 18 is put into an opened state irrespective of the result of comparison between the intermediate data 23 and the second storage data. Otherwise, the secondary match line 18 is put into an opened state or an invalid state "0" when the intermediate data 23 on the bit lines 59*a* and 59*b* and the second storage data stored in the data cell 23 are coincident with each other and different from each other, respectively.

In this embodiment, it is implemented to put the secondary match line 18 into opened state when the secondary search enabling signal 11 is in an invalid state "0" by controlling the MOS transistor (T32) 236 by the secondary search enabling signal 11. The similar operation is performed by putting the both bit lines 51*a* and 51*b* into "0" when the secondary search enabling signal 11 is in an invalid state "0", as similar to the associative memory searching for a single field 36 in the first embodiment.

Operation of an Associative Memory Searching for a Single Field According to the Third Embodiment Next referring to FIG. 19, description will be made about the operation when the above-mentioned associative memory searching for a single field 4 is used in calculating the transfer network address in the network devise 400-1 in FIG. 33, as similar to the conventional associative memory 101. It is assumed here that the associative memory searching for a single field 4 comprises three words of nine bits.

The primary associative memory 20 memorizes the concatenation information in the associative memory words 7-1 through 7-3 except the network address (1, *, *) of the network device 400-1 in FIG. 33. Herein, when a digit of a network address is represented by the symbol "*" as "don't care", the corresponding bit of the mask information is stored with a valid state "0" for the mask information. The state of the storage data is optional, and in this embodiment, the corresponding bit of the storage data is stored with an invalid state "0".

Specifically, the associative memory word 7-1 stores in binary numbers the storage data (010, 000, 000) and the mask information (111, 000, 000) to implement (2, *, *) Likewise, the associative memory word 7-2 stores in binary numbers the storage data (010, 011, 000) and the mask information (111, 111, 000) to implement (2, 3, *). The associative memory word 7-3 stores in binary numbers the storage data (011, 000, 000) and the mask information (111, 000, 000) to implement (3, *, *).

As the second storage data stored in each associative memory word 24-1 through 24-3 of the secondary associative memory 21, the value is memorized in which the symbol "*" as "don't care" of the concatenation information of the network device 400-1 is substituted by "0" as an invalid state of the storage data. Specifically, the associative memory word 24-1 stores (010, 000, 000) in binary numbers, and the associative memory word 24-2 stores (010, 011, 000) in binary numbers, and the associative memory word 24-3 stores (011, 000, 000) in binary numbers.

Figure 19:
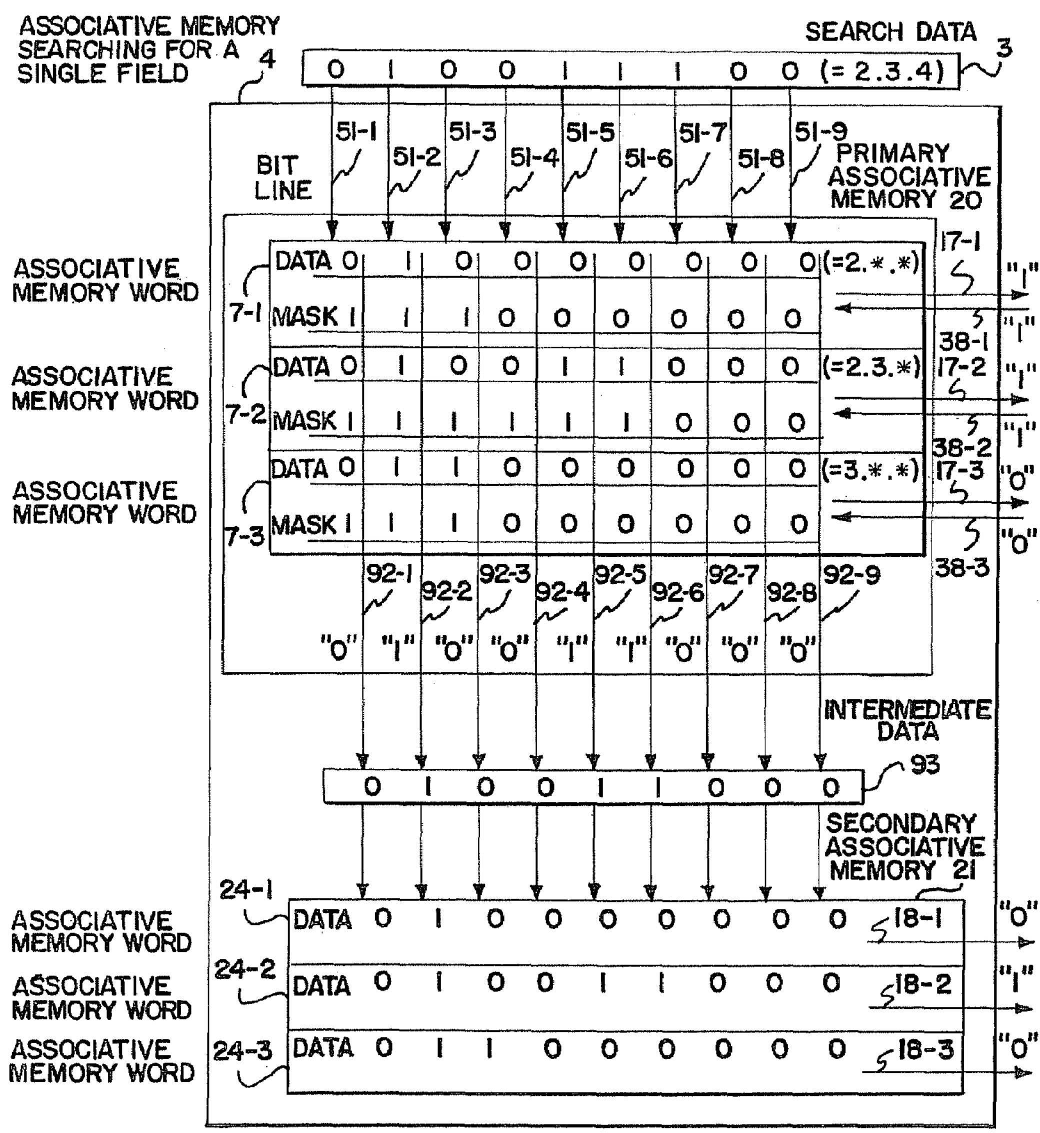
FIG. 19 describes one example of the operations of an associative memory searching for a single field in an associative memory according to the third embodiment of this invention.

In FIG. 19, the common match line 18-1, 18-2, and 18-3 are supplied with the value of the primary match line 17-1, 17-2, and 17-3 respectively, from the external source, in order to describe the associative memory searching for a single field 4.

Description will proceed to the searching operation by supplying as the search data 112 the network address (2, 3, 4), in octal numbers, of the user's terminal (PC) 401-2 in FIG. 33.

Prior to the searching operation, all of the primary match lines 17-1 through 17-3 and the secondary match line 18-1 through 18-3 are precharged to be put into a valid state "1".

When the search data of the network address (2, 3, 4), in octal numbers, is supplied to the bit lines 51-1 through 51-9, the primary associative memory 4 implements the primary searching operation taking the "don't care" state represented by the symbol "*" into account. The octal notations (2, *, *) and (2, 3, *) respectively stored in the primary associative memory word 7-1 and 7-2 in the primary associative memory 4 are coincident with the search data 3 on the bit lines 51-1 through 51-9. On the other hand, the octal notations (3, *, *) stored in the primary associative memory word 7-3 is not coincident with the search data 3. Accordingly, the primary match lines 17-1 and 17-2 are put into a valid state "1" while the remaining primary match line 17-3 is put in an invalid state "0". Herein, as mentioned above, the common match line 18-1, 18-2, and 18-3 are supplied with "1", "1", and "0" as the value of the primary match line 17-1, 17-2, and 17-3 respectively, from the external source.

Herein, the intermediate data line 92-1 produces the logical sum "0", with "1" as true, of the storage bit data "0" and "0" in the associative memory words 7-1 and 7-2 at bit positions corresponding to the matched data intermediate logical-OR line 52-1. The intermediate data line 92-2 produces the logical sum "1", with "1" as true, of the storage bit data "1" and "1" in the associative memory words 7-1 and 7-1 at bit positions corresponding to the matched data intermediate logical-OR line 52-2.

Likewise, the intermediate data lines 92-3, 92-4, 92-5, 92-6, 92-7, 92-8 and 92-9 prod the logical sum "0" of "0" and "0", the logical sum "0" of "0" and "0", the logical sum "1" of "0" and "1", the logical sum "1" of "0" and "1", the logical sum "0" of "0" and "0", the logical sum "0" of "0" and "0", and the logical sum "0" of "0" and "0", respectively, with "1" as true.

As a result, the binary notation "010011000" is delivered to the secondary associative memory 21 as the intermediate data 23.

Thereafter, the secondary associative memory 21 starts a second searching operation against the supplied value "010011000" of intermediate data 23. In this example of the operation, the second storage data stored in the associative memory word 24-2 is completely coincident, so that the corresponding secondary match line 18-2 is put into an opened state. Since the second storage data stored in any other associative memory words 24-1 and 24-3 is not coincident, the corresponding secondary match lines 18-1 and 18-3 are supplied with an invalid state "0". Thus, in the secondary match line 18-1, 18-2, and 18-3 that maintain a valid state "1" prior to the start of the second searching operation, the only secondary match line 18-2 can maintain a valid state "1" upon completion of the second searching operation.

As mentioned above, in the associative memory searching for a single field 4, which is similar to the associative memory searching for a single field 36 in FIG. 3, it will be understood that, in the secondary match lines 18 corresponding to one of the storage data coincident with the octal notation "2, 3, 3" of search data 3, taking the mask information into account, the only secondary match line 18-2 corresponding to the storage data with the least number of bits in a mask valid state is put into a valid state.

Operation of the Third Embodiment

Next, description will be made about the searching operation of the associative memory according to the third embodiment of this invention when input data is composed of plural search data. Referring to FIG. 5, this searching operation will be described by the use of a flowchart. Description will proceed in FIG. 20 through FIG. 23, to the each step of the flowchart by supplying the associative memory 25 to determine the data transfer permission from the user's terminal (PC) 401-1 with the network address (1, 2, 6) to (PC) 401-3 with the network address (2, 3, 5) in FIG. 33.

As similar to the associative memory 1 in the first embodiment, in this data transfer, the search data 3-1 is supplied as 9-bit source network address (1, 2, 6) with the first priority, likewise, the search data 3-2 is supplied as 9-bit destination network address (2, 3, 5) with the second priority. The associative memory 25 is comprised of 5th 9-bit associative memory searching for a single field 4-1 and 4-2 in FIG. 20 through FIG. 22.

The 9 bit storage data, which comprises the 9 bit of structure data of the source network address in each transfer rule in Table.1(b), is stored as the storage data of each associative memory words 7-1-1 through 7-5-1 corresponding to the transfer rule of the primary associative memory 20-1, and stored as the second storage data of each associative memory words 24-1-1 through 24-5-1 corresponding to the transfer rule of the secondary associative memory 21-1 of the associative memory searching for a single field 4-1. The 9 bit mask information, which comprises the 9 bit of structure data of the source network address in each transfer rule in Table.1(b), is stored as the mask information of each associative memory words 7-1-1 through 7-5-1 corresponding to the transfer rule of the primary associative memory 20-1 of the associative memory searching for a single field 4-1.

The 9 bit storage data, which comprises the 9 bit of structure data of the source network address in each transfer rule in Table.1(b), is stored as the storage data of each associative memory words 7-1-2 through 7-5-2 corresponding to the transfer rule of the primary associative memory 20-2, and stored as the second storage data of each associative memory words 24-1-2 through 24-5-2 corresponding to the transfer rule of the secondary associative memory 21-2 of the associative memory searching for a single field 4-2. The 9 bit mask information, which comprises the 9 bit of structure data of the source network address in each transfer rule in Table.1(b), is stored as the mask information of each associative memory words 7-1-2 through 7-5-2 corresponding to the transfer rule of the primary associative memory 20-2 of the associative memory searching for a single field 4-2.

The 9 bit storage data and 9 bit mask information, which comprise the 9 bit of structure data of the source network address in each transfer rule in Table.1(b), are stored as the storage data and the mask information, respectively, of each associative memory words 44-1-2 through 44-5-2 corresponding to the transfer rule of the associative memory searching for a single field 36-2.

At first, all of the primary match lines 17-1-1 through 17-*m*-*r* and all of the secondary match lines 18-1-1 through 18-*m*-*r* are precharged to a high level ("1") to be put into a valid state "1".

The operation of the main controller 6 in the associative memory 25 of the third embodiment in each step is similar to the operation in the associative memory 1 of the first embodiment. The state of the clock signal 41 and 42 in FIG. 20 through 23 is similar to the operation in the associative memory 1 of the first embodiment.

[Step S100]

Figure 20:
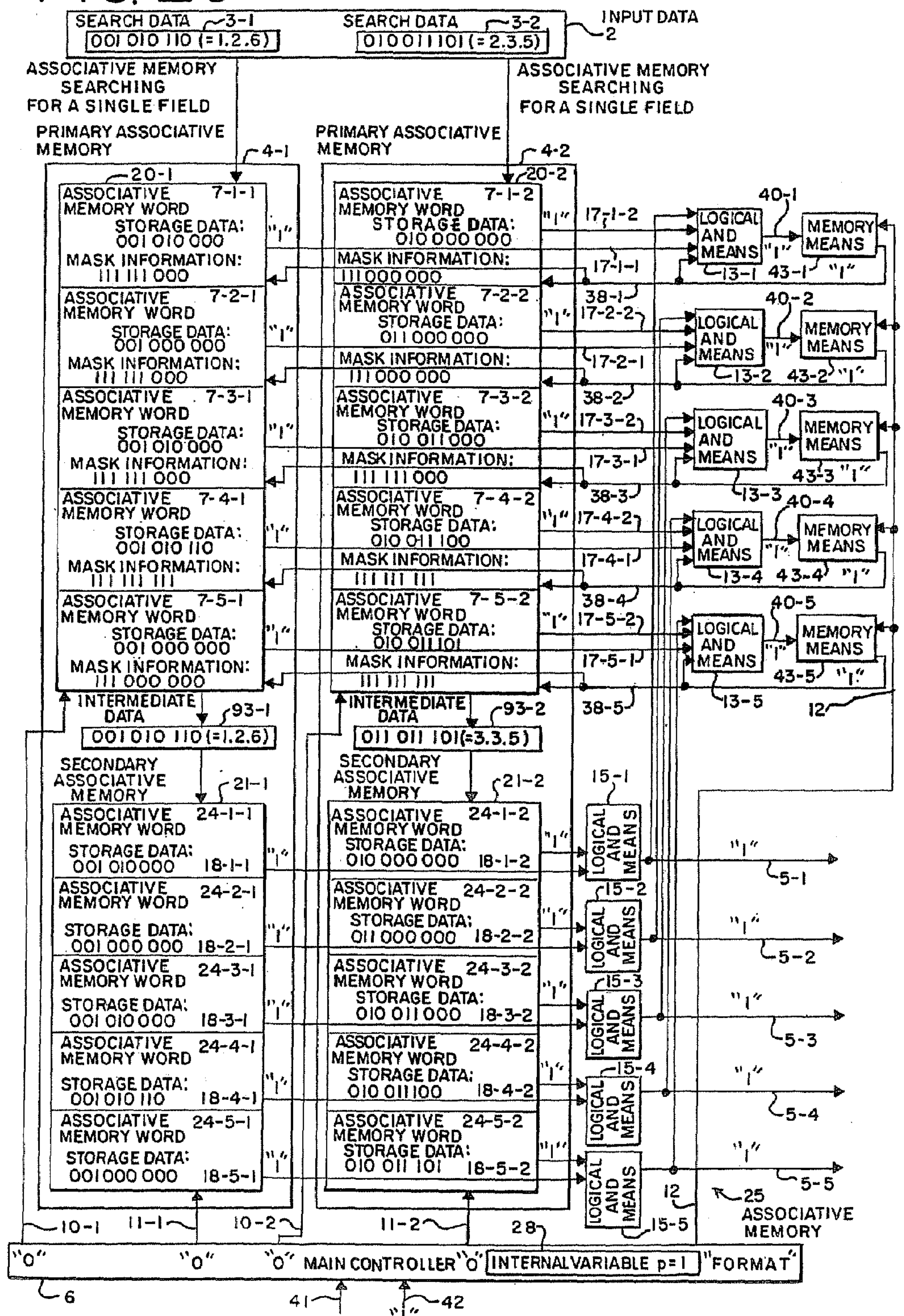
FIG. 20 describes one example of the operation of an associative memory at step S100 in FIG. 5 according to the third embodiment of this invention.

Description will proceed in FIG. 20, to the step S100 of the flowchart by supplying the associative memory 1 to determine the data transfer permission from the user's terminal (PC) 401-1 with the network address (1, 2, 6) to (PC) 401-3 with the network address (2, 3, 5) in FIG. 33.

Since the primary search enabling signal 10-1 is in an invalid state "0", the primary associative memory 20-1 puts the primary match lines 17-1-1 through 17-5-1 into an opened state. As a result, the primary match lines 17-1-1 through 17-5-1 maintain a valid state "1". Likewise, since the secondary search enabling signal 11-1 is in an invalid state "0", the secondary associative memory 21-1 puts the secondary match lines 18-1-1 through 18-5-1 into an opened state. As a result, the secondary match lines 18-1-1 through 18-5-1 maintain a valid state "1".

Likewise, since the primary search enabling signal 10-2 is in an invalid state "0", the primary associative memory 20-2 puts the primary match lines 17-1-2 through 17-5-2 into an opened state As a result, the primary match lines 17-1-2 through 17-5-2 maintain a valid state "1". Likewise, since the secondary search enabling signal 11-2 is in an invalid state "0", the secondary associative memory 21-2 puts the secondary match lines 18-1-2 through 18-5-2 into an opened state. As a result, the secondary match lines 18-1-1 through 18-5-1 maintain a valid state "1". Consequently, all the match signals 5-1 through 5-5 supplied from the logical AND means 15-1 through 15-*m* maintain a valid state "1".

Since the common lines 38-1 through 38-5 supplied from memory means 43-1 through 43-5 are initialized in a valid state "1" by the memory control signal 12, all of the logical AND signals 40-1 through 40-5 are in a valid state "1". As a result, the intermediate data 93-1 possess the state "001, 010, 110", which is the result of the logical OR operation of all the storage data stored in the associative memory word 44-1-1 through 44-1-5. Like wise, the intermediate data 93-2 possess the state "011, 011, 101", which is the result of the logical OR operation of all the storage data stored in the associative memory word 44-2-1 through 44-2-5.

[Step S101]

Figure 21:
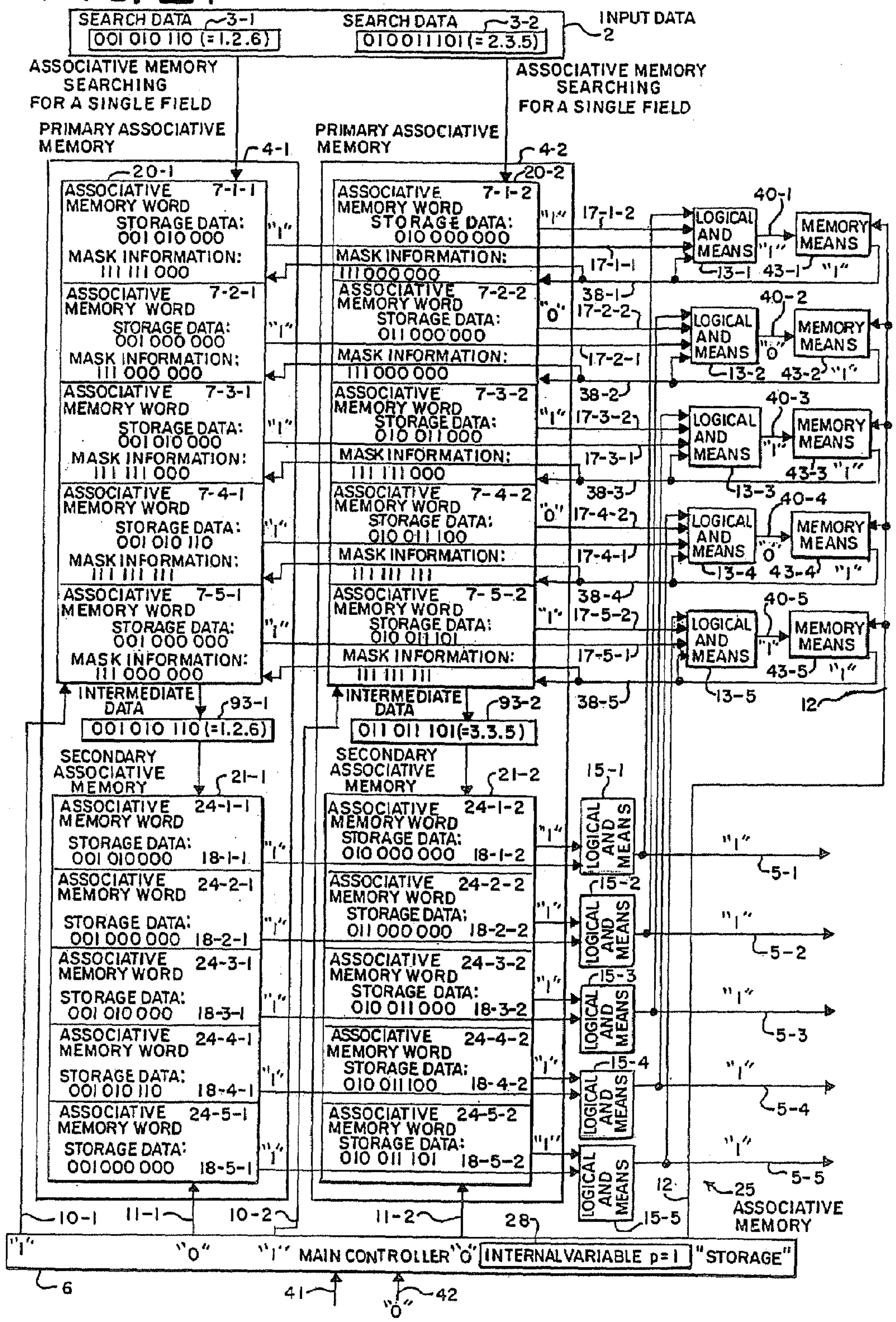
FIG. 21 describes one example of the operation of an associative memory at step S101 in FIG. 5 according to the third embodiment of this invention.

Description will proceed in FIG. 21, to the step S101 of the flowchart by supplying the associative memory 25 to determine the data transfer permission from the user's terminal (PC) 401-1 with the network address (1, 2, 6) to (PC) 401-3 with the network address (2, 3, 5) in FIG. 33.

The primary search enabling signal 10-1 is in a valid state "1" in the primary associative memory 20-1 of the associative memory searching for a single field 4-1. Therefore, as the result of the comparison with the search data 3-1 with the value of "001, 010, 110" and the storage data in the associative memory word 7-1-1 through 7-5-1, taking the mask information into account, a valid state "1" is put into the primary match line 17-1-1, 17-2-1, 17-3-1, 17-4-1, and The primary search enabling signal 10-2 is in a valid state "1" in the primary associative memory 20-2 of the associative memory searching for a single field 4-2. Therefore, as the result of the comparison with the search data 3-2 with the value of "010, 011, 101" and the storage data in the associative memory word 7-1-2 through 7-5-2, taking the mask information into account, a valid state "1" is put into the primary match line 17-1-2, 17-3-2 and 17-5-1, and an invalid st put into the primary match line 17-2-2 and 17-4-2.

Since the secondary search enabling signal 11-1 is in an invalid state "0", the secondary associative memory 21-1 puts the secondary match lines 18-1-1 through 18-5-1 into an opened state. As a result, the secondary match lines 18-1-1 through 18-5-1 maintain a valid state "1". Likewise, since the secondary search enabling signal 11-2 is in an invalid state "0", the secondary associative memory 21-2 puts the secondary match lines 18-1-2 through 18-5-2 into an opened state. As a result, the secondary match lines 18-1-2 through 18-5-2 maintain a valid state "1". Consequently, all the match signals 5-1 through 5-5 supplied from the logical AND means 15-1 through 15-5 maintain a valid state "1".

Since the common lines 38-1 through 38-5 supplied from memory means 43-1 through 43-5 are initialized in a valid state "1" in step S100, the logical AND signals 40-1, 40-3 and 40-5 are put into a valid state "1", and the logical AND signals 40-2 and 40-4 are put into an invalid state "0". As a result, the intermediate data 93-1 possess the state "001, 010, 110", which is the result of the logical OR operation of all the storage data stored in the associative memory word 44-1-1 through 44-1-5. Like wise, the intermediate data 93-2 possess the state "011, 011, 101", as the result of the logical OR operation of all the storage data stored in the associative memory word 44-2-1 through 44-2-5. The value of the logical AND signal 40-1 through 40-5 is memorized in the memory means 43-1 through 43-5 by the memory control signal 12 as the operation proceeds to the next step S102.

[Step S102]

Figure 22:
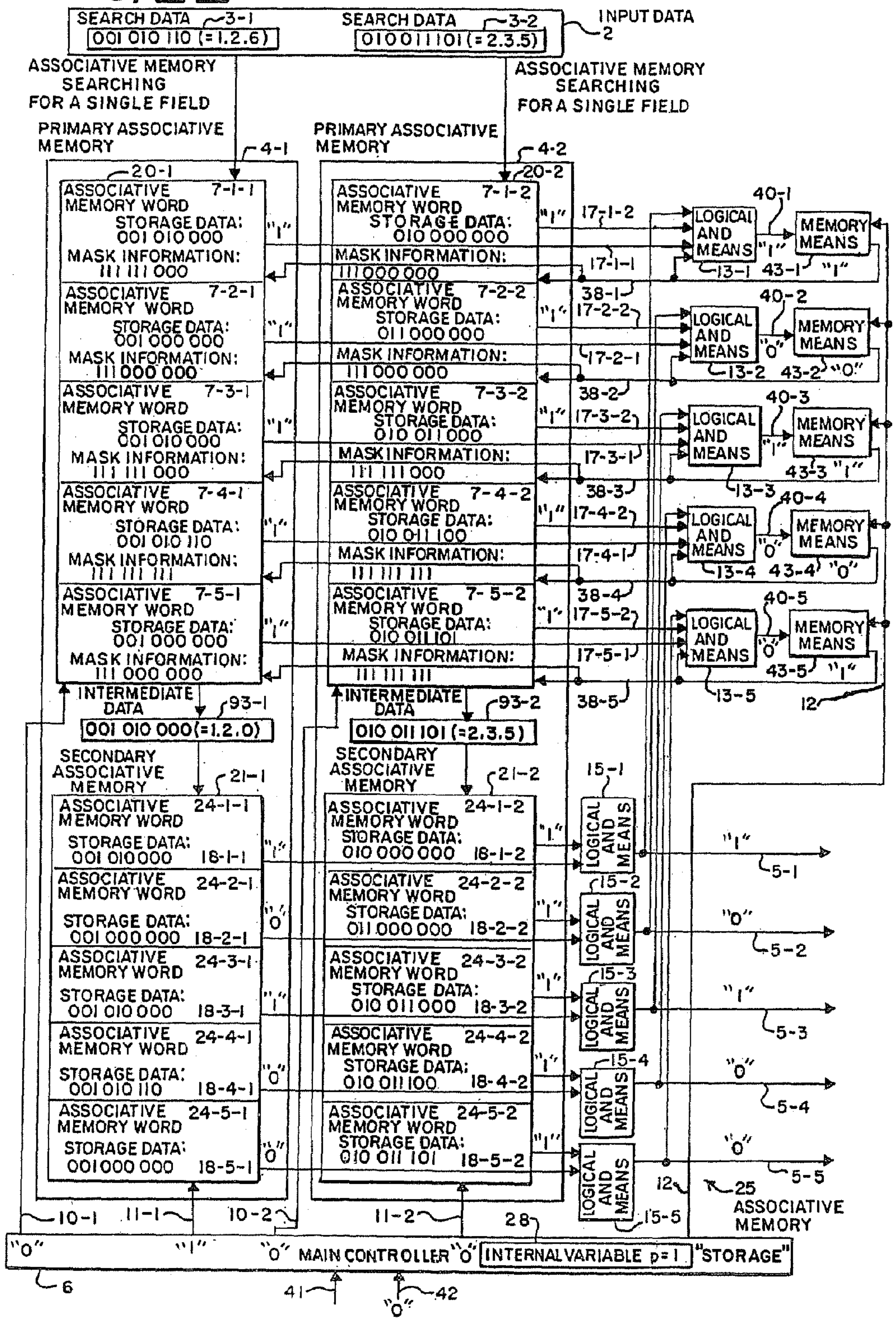
FIG. 22 describes one example of the operation of an associative memory at step S102 in FIG. 5 according to the third embodiment of this invention.

Description will proceed in FIG. 22, to the step S102 of the flowchart by supplying the associative memory 25 to determine the data transfer permission from the user's terminal (PC) 401-1 with the network address (1, 2, 6) to (PC) 401-3 with the network address (2, 3, 5) in FIG. 33.

Since the common lines 38-1 through 38-5 supplied from memory means 43-1 through 43-5 are initialized in a valid state "1" in the step S101, the common match line 38-1, 38-3 and 38-5 are in invalid state "0". As a result, the intermediate data 93-1 possess the state "001, 010, 000", which is the result of the logical OR operation of the storage data stored in the associative memory word 7-1-1, 7-3-1 and 7-5-1. Like wise, the intermediate data 93-2 possess the state "010, 011, 101", which is the result of the logical OR operation of the storage data stored in the associative memory word 7-1-2, 7-3-2 and 7-5-2.

In the associative memory searching for a single field 4-1 with the first priority 1, the secondary search enabling signal 11-1 is supplied with a valid state "1", and the secondary associative memory 21-1 compare the state of the intermediate data 93-1 "001, 010, 000" and the second storage data stored in the associative memory word 24-1-1 through 24-5-1. As a result, the secondary match line 18-1-1 and 18-3-1 are supplied with a valid state "1", and 18-2-1, 18-4-1, and 18-5-1 are supplied with an invalid state "0". Since the primary search enabling signal 10-1 is in an invalid state "0", the primary associative memory 20-1 of the associative memory searching for a single field 4-1 puts all the primary match lines 17-1-1 through 17-5-1 into an opened state. As a result, a the primary match lines 17-1-1 through 17-5-1 maintain a valid state "1".

Since the primary search enabling signal 10-2 is in an invalid state "0", the primary associative memory 20-2 of the associative memory searching for a single field 4-2 puts all the primary match lines 17-1-2 through 17-5-2 into an opened state. As a result, all of the primary match lines 17-1 through 17-5-2 maintain a valid state "1". Since the secondary search enabling signal 11-2 is in an invalid state "0", the secondary associative memory 21-2 of the associative memory searching for a single field 4-2 puts all the secondary match lines 18-1-2 through 18-5-2 into an opened state a result, all of the secondary match lines 18-1-2 through 18-5-2 maintain a valid state "1".

As a result of the logical AND operation of the secondary match line 18-1-1 through 18-5-1 and the corresponding secondary match line 18-1-2 through 18-5-2, the logical AND means 15-1 through 15-5 provide a valid state "1" to the match signal 5-1 and 5-3, and an invalid state "0" to the match signal 5-2, 5-4 and 5-5, respectively.

As a result of the logical AND operation of the corresponding signals of the primary match line 17-1-1 through 17-5-1, the primary match line 17-1-2 through 17-5-2, th 5-5, and the common match line 38-1 through 38-5, the logical AND means 13-1 through 13-5 provide a valid state "1" to the logical AND signal 40-1 and 40-3, and an invalid state "0" to the logical AND signal 40-2, 40-4 and 40-5, respectively. The state of the logical AND signal 40-1 through 40-5 is memorized in the memory means 43-1 through 43-5 by the memory control signal 12 as the operation proceeds to the next step S103.

[Step S103~S105]

Figure 23:
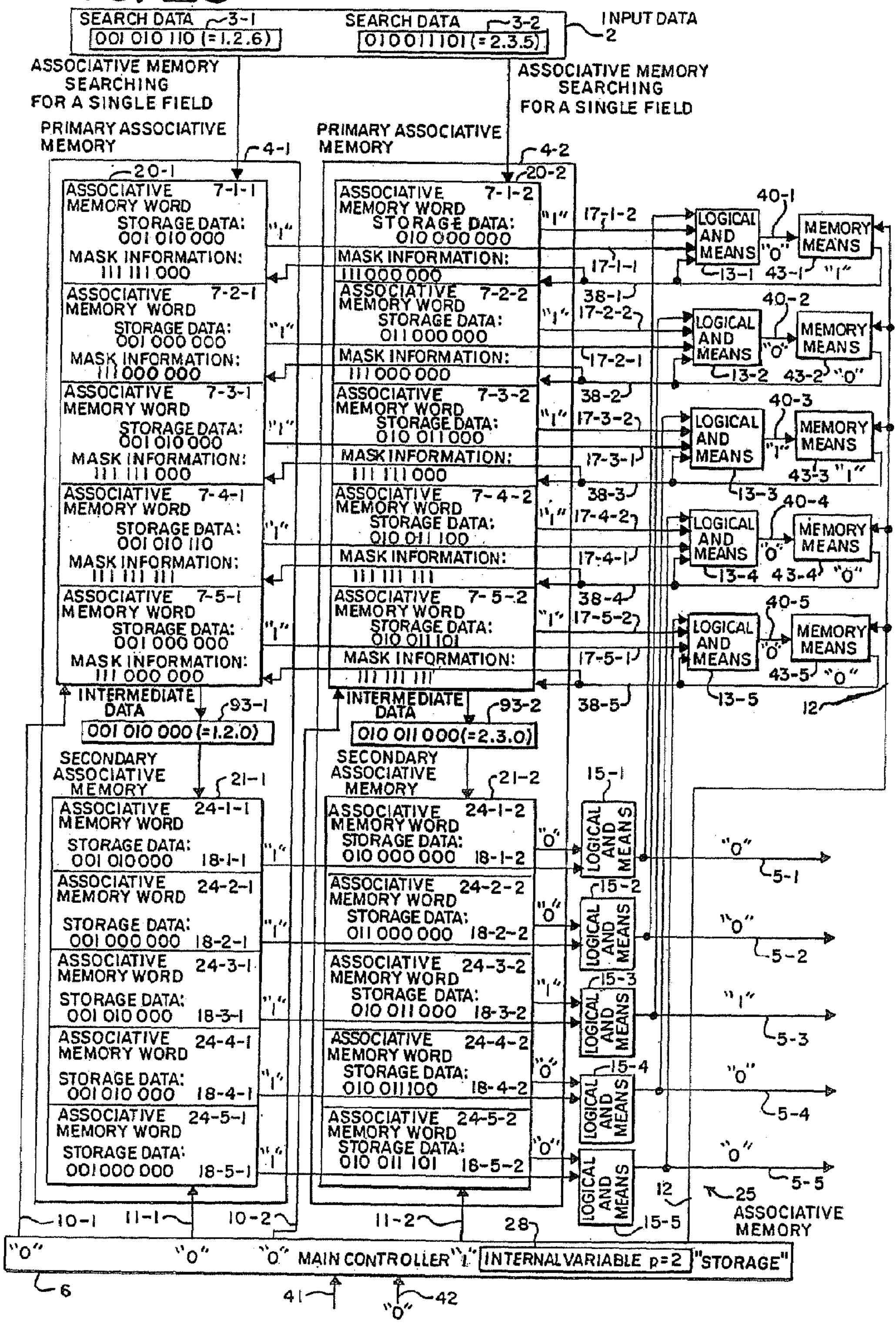
FIG. 23 describes one example of the operation of an associative memory at step S105 in FIG. 5 according to the third embodiment of this invention.

Description will proceed in FIG. 23, to the step S103 through S105 of the flowchart by supplying the associative memory 25 to determine the data transfer permission from the user's terminal (PC) 401-1 with the network address (1, 2, 6) to (PC) 401-3 with the network address (2, 3, 5) in FIG.33.

Since the common line 38-1 through 38-3 supplied from memory means 43-1 through 43-5 possess a valid state "1" stored at the step S102, the common match line 38-1 and 38-3 are in a valid state "1", and the common match line 38-2, 38-4 and 38-5 are in an invalid state "0". As a result, the intermediate data 93-1 of the associative memory searching for a single field 4-1 is possess the state "001, 010, 000", as the result of the logical OR operation of all the storage data stored in the associative memory word 7-1-1 and 7-3-1. Like wise, the intermediate data 93-2 of the associative memory searching for a single field 4-2 possess the state "010, 011, 000", as the result of the logical OR operation of all the storage data stored in the associative memory word 7-1-2 and 7-3-2.

Since the primary search enabling signal 10-1 is in an invalid state "0", the primary associative memory 20-1 with the first priority, of the associative memory searching for a single field 4-1, puts the primary match lines 17-1-1 through 17-5-1 into an opened state. As a result, the primary match lines 17-1-1 through 17-5-1 maintain a valid state "1". Likewise, the secondary search enabling signal 11-1 is in an invalid state "0", the secondary associative memory 21-1, of the associative memory searching for a single field 4-1, puts the secondary match lines 18-1-1 through 18-5-1 into an opened state. As a result, the secondary match lines 18-1-1 through 18-5-1 maintain a valid state "1".

In the primary associative memory 20-2 of the associative memory searching for a single field 4-2 with the second priority 2, the secondary search enabling signal 11-2 is supplied with a valid state "1", and the secondary associative memory 21-2 compares the state of the intermediate data 93-2 "010, 011, 000" and the second storage data stored in the associative memory word 24-1-2 through 24-5-2. As a result, the secondary match line 18-3-2 is supplied with a valid state "1", and 18-1-2, 18-2-2, 18-4-2, and 18-5-2 are supplied with an invalid state "0". Since the primary search enabling signal 10-2 is in an invalid state "0", the primary associative memory 20-2 of the associative memory searching for a single field 4-2 puts all the primary match lines 17-1-2 through 17-5-2 an opened state. As a result, all of the primary match lines 17-2-1 through 17-5-2 maintain a valid state "1".

Consequently, as a result of the logical AND operation of the secondary match line 18-1-1 through 18-5-1 and the corresponding secondary match line 18-1-2 through 18-5-2, the logical AND means 15-1 through 15-5 provide a valid state "1" to only the match signal 5-3, and an invalid state "0" to the other match signals 5-1, 5-2, 5-4 and 5-5, respectively.

As a result of the logical AND operation of the corresponding signals of the primary match line 17-1-1 through 17-5-1, the primary match line 17-1-2 through 17-5-2, through 5-5, and the common match line 38-1 through 38-5, the logical AND means 13-1 through 13-5 provide a valid state "1" to the logical AND signal 40-3, and an invalid state "0" to the other logical AND signal 40-1, 40-2, 40-4 and 40-5, respectively. The state of the logical AND signal 40-1 through 40-5 is memorized in the memory means 43-1 through 43-5 by the memory control signal 12 as the operation proceeds to the next step S104.

The main controller 6, synchronizing with a clock signal 41, proceeds to the step S103 in the flowchart in FIG. 5, and compares the value "p" of the internal variable 28 and "r" which is the number of the associative memory searching for a single field 36. In the example of FIG. 23, both the value "p" of the internal variable 28 and "r" which is the number of the associative memory searching for a single field 4 are "2". Upon coincidence, the searching operation is completed. The final search result is acquired from the match signal 5-3, only which supplies the valid state "1" among the match signal 5-1 through 5-5. As mentioned above, the transfer from the user's terminal (PC) 401-1 with the network address (1, 2, 6) to (PC) 401-3 with the network address (2, 3, 5) ought to applied the transfer rule 3, which indicates that the operation possesses resulted properly.

The frequency of the clock signal can be made higher by inserting a weight cycle just before the step S102 and S105 and latch to store the intermediate data 93-1 through 93-*r*.

The secondary search in step S105 is operated among the words matched in the secondary searching operation in step S102. Thus, as will readily be understood, the value of intermediate data 93-1 in step S105 in FIG. 23 is as same as the value of intermediate data 93-1 in step S102 in FIG. Therefore, the same result is acquired even if the secondary search signal 11-1 through 11-*p* is supplied with a valid state in step S105 in FIG. 5 when the value of the internal variable 28 is "p".

As will readily be understood from the above explanation, each of the primary associative memory 20-1 and 20-2 and the secondary associative memory 21-1 through 21-2 operate in turn, and the working timing is never piled up. Therefore, as readily understood, it is possible to implement pipeline processing by arranging the wire concatenation.

Herein, in FIG. 15, one example is cited in which the logical AND means 15-1 through 15-*m* are eliminated and the shared common match line 38-1 through 38-*m*, the shared logical AND means 40-1 through 40-*m* and the shared memory means 43-1 through 43-*m* are changed into the common match line 38-1-1 through 38-*m-r*, the logical AND means 40-1-1 through 40-*m-r* and the memory means 43-1-1 through 43-*m-r*, respectively, in order to specialize in each secondary associative memory 21-1 through 21-*r*. In this bout, the group of the common match lines (38-1-1 through 38-*m*-1) through (38-1-*r* through 38-*m-r*), r in number, corresponding to the secondary associative memory 21-1 through 21-*r* are supplied only to the corresponding primary associative memory 21-1 through 21-*r*. Herewith, it can be implemented to produce the intermediate data 93-1 through 93-*r*.

Herein, in FIG. 15, it is implemented that the secondary associative memory 21-1 through 21-*r* operate independently in case that the logical AND means 13-1-1 through 13-*m*-1, m in number, corresponding to the secondary associative memory 21-1 are supplied with an valid state instead of the match signal 5-1 through 5-*m*, and the logical AND means 13-1-2 through 13-*m*-2, r in number, corresponding to the secondary associative memory 21-2 are supplied with the secondary match line 18-1-1 through 18-*m*-1 instead of the match signal 5-1 through 5-*m*, and likewise, the logical AN means 13-1-*r* through 13-*m*-*r*, r in number, corresponding to the secondary associative memory 21-*r* are supplied with the secondary match line 18-1-(*r*-1) through 18-*m*-(*r*-1) instead of the match signal 5-1 through 5-*m*, and the wire concatenation of the last secondary match line 18-1-*r* through 18-*m*-*r* are changed as similar to the match signal 5-1 through 5-*m*.

In this bout, as will readily be understood, it is optional whether all of the primary search enabling signal 10-1 through 10-*r* and the secondary search enabling signal 11-1 through 11-*r* can be in a valid state, or, only the signal which is supposed to operate corresponding to the frequency of the clock signal of pipeline can be in a valid state. If the above mentioned memory means 43-1-1 through 43-*m*-*r* are eliminated and all of the primary search enabling signal 10-1 through 10-*r* and the secondary search enabling signal 11-1 through 11-*r* are in a valid state, the all operations will be finished in one clock. As mentioned above, it is also readily understood that the frequency of the clock signal of the pipeline can be made higher by inserting a latch in order to store the intermediate data 93-1 through 93-*r*.

Construction of the Fourth Embodiment

Next referring to FIG. 24, description will be made about an associative memory 35 which comprise words, m in number, according to a forth embodiment of this invention.

The associative memory 35 concatenates the output signals, which are the comparison results of j-th associative memory words 32-*j*-1 through 32-*j*-*r* of the primary associative memory 31-1 through 31-*r* which comprise the associative memory searching for a single field 30-1 through 30-*r*, r in number, to one match line 17-*j* by a wired AND logic connection. The associative memory 35 utilizes these states stored in the match line 17-*j* dynamically in order to produce the intermediate data. Only when the start signal 42 is in a valid state, the primary match line 17-*j* is precharged to a high level to be put into a valid state "1", prior to the start of the searching operation. The associative memory 35 concatenates the output signals, which are the comparison results of i-th associative memory words 24-*j*-1 through 24-*j*-*r* of the secondary associative memory 21-1 through 21-*r*, which comprise the associative memory searching for a single field 26-1 through 26-*r*, r in number, to one secondary match line 18-*j* by a wired AND logic connection. Herein, the secondary match line 18-*j* is precharged to a high level to be put into a valid state "1", prior to the start of the searching operation. The secondary match line 18-*j* comprises MOS transistors 33-1 through 33-*m* and inverted MOS transistors 34-1 through 34-*m*, m in number, the j-th MOS transistors 33-*j* and the j-th inverted MOS transistors 34-*j* are inserted in cascade between the primary match line 17-*j* and a low potential. The MOS transistor 33-*j* is rendered conductive when the memory control signal 12 supplied from the main controller 6 is in a valid state. The MOS inverted transistor 34-*j* is rendered conductive when the secondary match line 18-*m* is in an invalid state "0".

Figure 14:
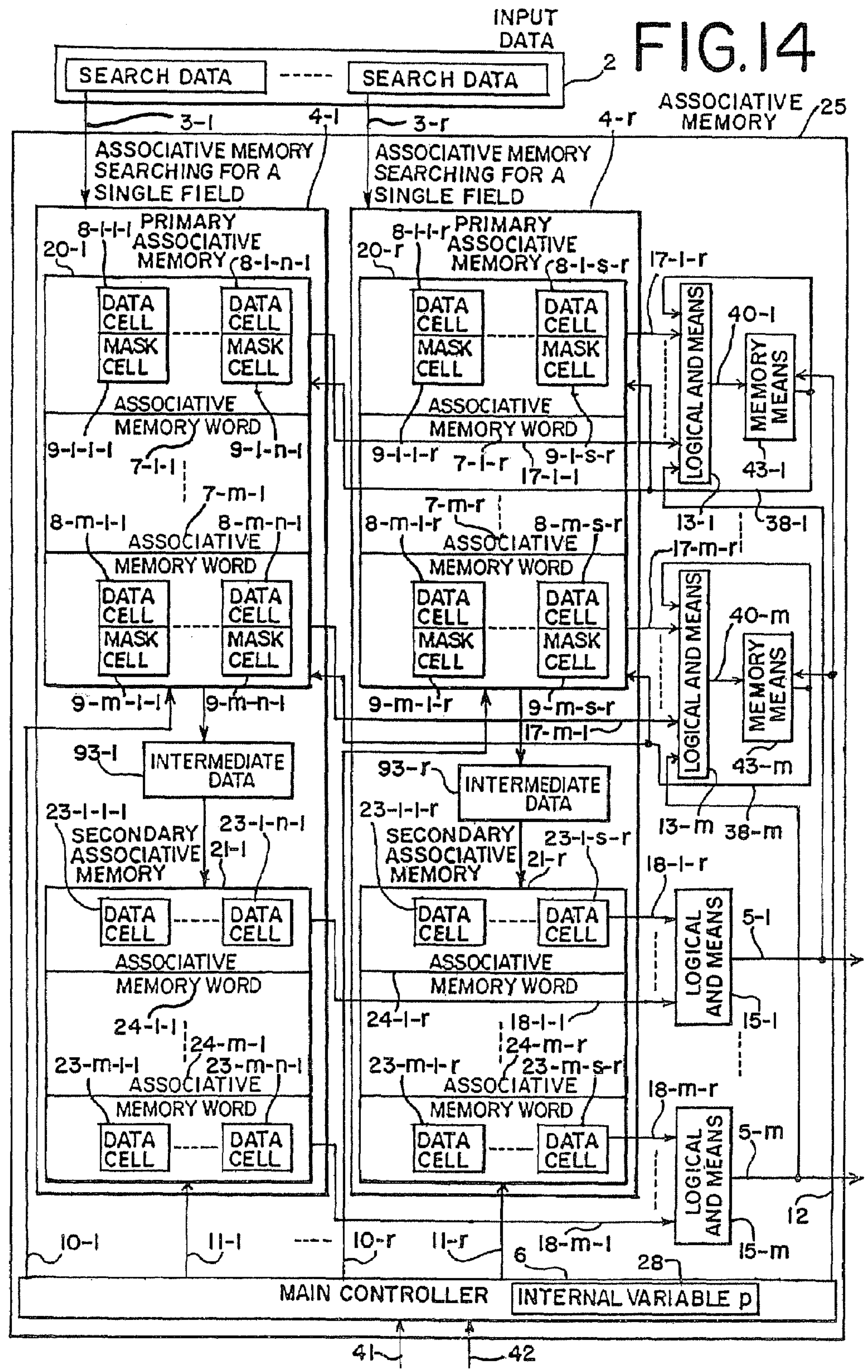
FIG. 14 is a detailed block diagram of one example of associative memories illustrated in FIG. 13.

The logical AND means 15-*j* of the associative memory 25 of the third embodiment in FIG. 14 as mentioned above is implemented by the secondary match line 18-*j*, concatenated by wired AND logic, in the associative memory 35 according to the forth embodiment in FIG. 11. The associative memory 35 supplies the state of the secondary match line 18-*j* as the match signal 5-*j*, directly outside.

Figure 24:
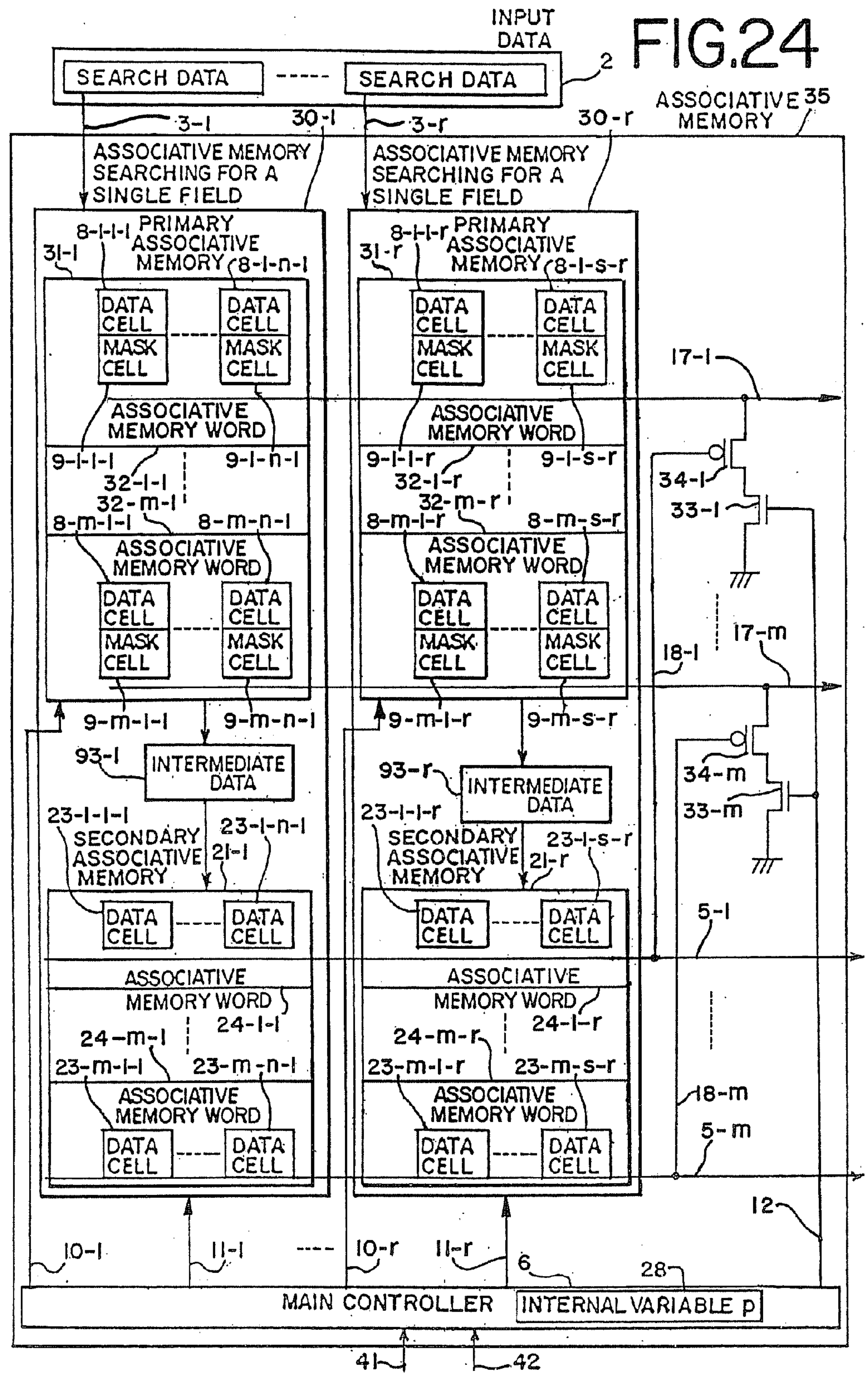
FIG. 24 is a detailed block diagram of one example of associative memories according to the forth embodiment of this invention.

The j-th primary match line 17-*j* of the associative memory 35 in FIG. 24 is precharged in a valid state "1" when the start signal 42 is in a valid state "1". Then, until the flowchart in FIG. 5 is completed, the j-th primary match line 17-*j* of the associative memory 35 maintain a valid state "1" only when all the comparison results of each j-th associative memory words 32-*j*-1 through 32-*j*-*r* of the primary associative memory 31-1 through 31-*r* which comprise the associative memory searching for a single field 30-1 through 30-*r*, r in number, are coincident with each other, and the primary match line 17-*j* is in a valid state "1" at the previous step, and the memory control signal 12 possesses a valid state "1" prior to the next step, and the secondary match line 18-*j* is in a valid state "1" when the MOS transistor 33-*j* is rendered conductive. In other words, the logical AND means 13-*j* in FIG. 14 comprises the primary match line 17-*j* and inverted MOS transistor 34-*j* concatenated in wired AND logic in the associative memory 35 in FIG. 24, and the logical AND means 43-*j* in FIG. 24 comprises the primary match line 17-*j* and inverted MOS transistor 33-*j* concatenated in wired AND logic in the associative memory 35 in FIG. 24.

The associative memory 35 possesses similar structure to the associative memory 25 in FIG. 14 according to the third embodiment except the above mentioned components. It will therefore be understood that similar searching operation is implemented against the input data composed of plural search data.

In the associative memory 35 in FIG. 24 according to the forth embodiment, the number of the lines between the associative memories searching for a single field 30-1 through 30-*r*, r in number, is twice as m (2*m), which is the number of the primary match lines 17-1 through 17-*m*, and the secondary match lines 18-1 through 18-*m*, m in number. In the associative memory 25 in FIG. 14 according to the third embodiment, the number of the lines between the associative memories searching for a single field 4-1 through 4-*r*, r in number, is (m*(2*r+1)), which is the number of the primary match lines 17-1-1 through 17-*m*-*r*, and the secondary match lines 18-1-1 through 18-*m*-*r* and the match lines 38-1 through 38-*m*, m in number. Consequently, the associative memory 35 in FIG. 24 of the forth embodiment can be implemented in the grate reduction of lines. Herein, it is assumed that the wires between the associative memories searching for a single field 30-1 through 30-*r*, r in number, are expanding over the whole associative memory 35. Thus, the wire capacity and the power consumption consumed as often as the state changes of the whole chip is very large. Accordingly, the associative memory 35 according to the forth embodiment possesses the advantage wherein the great reduction of the wire field, chip area, and the power consumption is achieved in comparison with the associative memory 25 according to the third embodiment.

Figure 25:
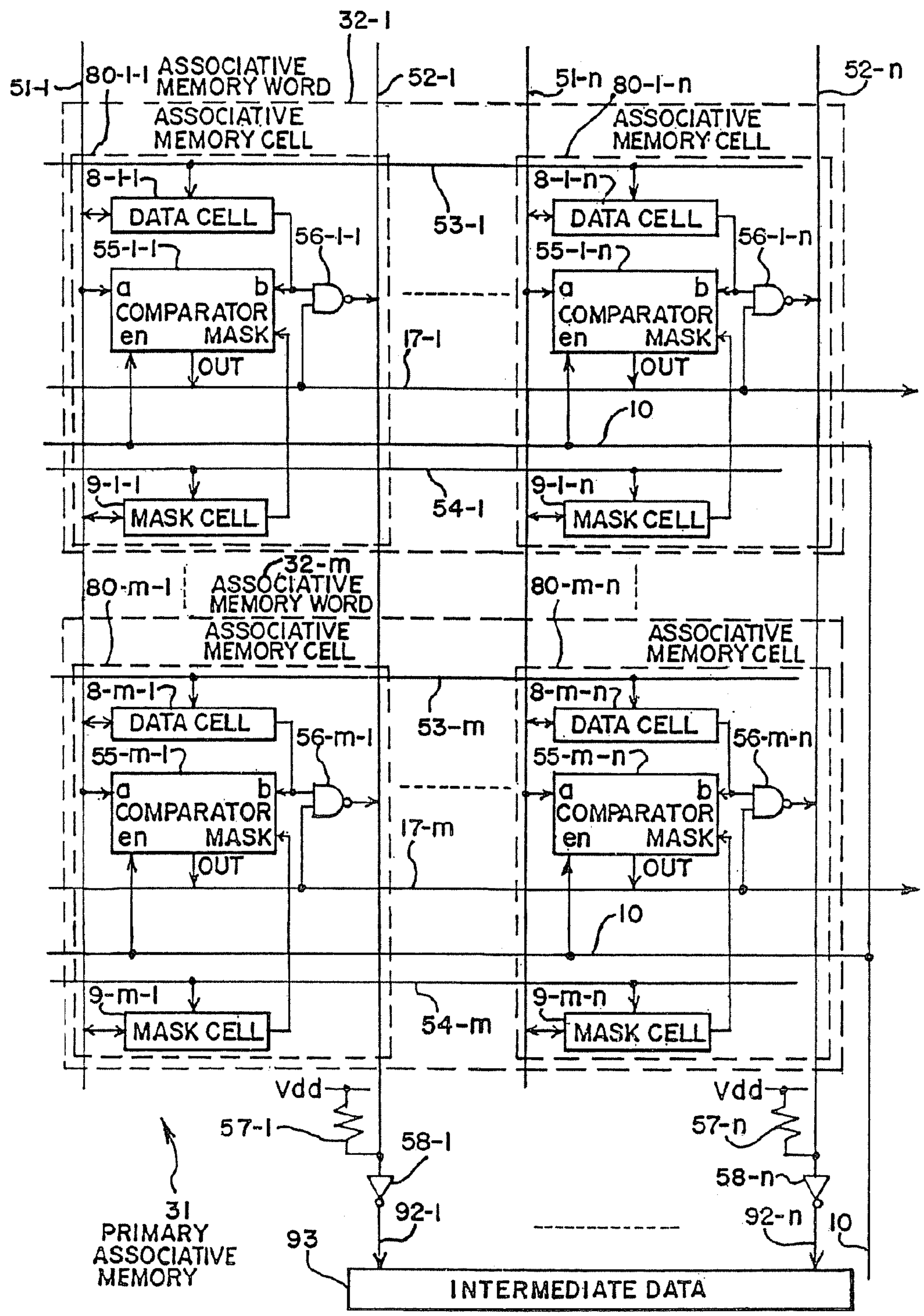
FIG. 25 is a block diagram of one example of primary associative memories in an associative memory according to the forth embodiment of this invention.

Next, referring to FIG. 25, the primary associative memory 31 in the forth embodiment of present innovation has similar component to the corresponding component in the primary associative memory 20 in the third embodiment illustrated in FIG. 15, except eliminating the common match line 38-*j* from the j-th associative memory word 32-*j*, changing the common match line 38-*j* into the primary match line 17-*j* in order to supply the logical gate 56-*j*-1 through 56-*j*-*n* in the associative memory cell 80-*j*-1 through 80-*j*-*n*, n in number, which comprise the j-h associative memory word 32-*j*.

In the primary associative memory 31 in FIG. 25, the primary match line 17-*j* is produced as the output signal by the wired AND concatenation with the logical gate 56-*j*-1 through 56-*j*-*n*. Therefore, the common match line 38-*j* and the primary match line 17-*j* can be shared inside the primary associative memory 31.

As will readily be understood, when the match line 17-1 through 17-*m* is produced by an ordinary logical gate in stead of the wired AND logic concatenation, the similar operation is performed as the primary associative memory 35 in the associative memory 31 of the forth embodiment, by using the logical gate to supply the primary match line 17-*j* which drives the output only in case of an invalid state, otherwise, puts the output into an opened state in case of a valid state, even at the primary associative memory wherein the primary match line 17-1 through 17-*m* is supplied from the logical gate like as illustrated in FIG. 10.

The state of the secondary match line 18-*j* is supplied as the match signal 5-*j* directly outside in FIG. 24. The state of the secondary match line 18-*j* may be supplied as the match signal 5-*j* after buffer the state of the match line 37-*j* for shaping.

The Fifth Embodiment

Next referring to FIG. 26, description will be made about an associative memory 46 which comprise m words, m in number, according to the fifth embodiment of this invention. The associative memory 46 which comprises m words, m in number, of the fifth embodiment is similar to the associative memory 25 of the third embodiment which comprises words, m in number, except adding the search data 48 as a component of input data 47, adding the associative memory 49 which is supplied with the search data 48 and produces the match line 90-1 through 90-*m*, and adding the corresponding match line 90-1 through 90-*m* as the input signal of the logical AND means 91-1 through 91-*m*.

Figure 26:
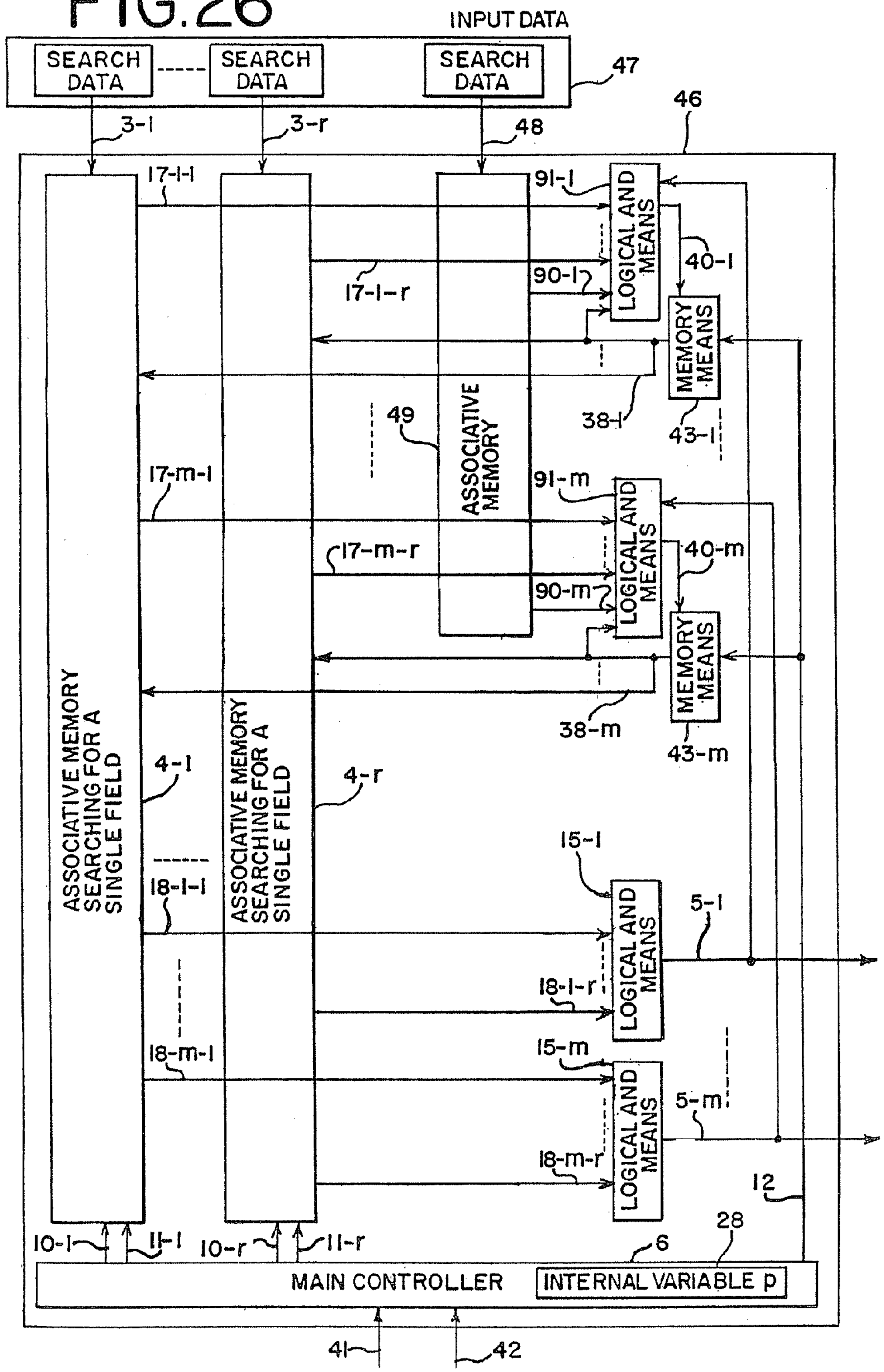
FIG. 26 is a block diagram of one example of associative memories according to the fifth embodiment of this invention.

Therefore, it is possible for the associative memory 46 in FIG. 26 to implement the similar function of the associative memory 25, and the associative memory 46 possesses the additional function, which narrows down the search results by using the search data 48 prior to the operation. Accordingly, it is possible to switch plural tables of the transfer rules described in Table1(b).

For example, a day of the week is supplied as the search data 48. Herein, the transfer rule of Table1(b) is stored in a certain word in the associative memory searching for a single field 4-1 through 4-*r*, and the data indicating "a week day" are stored as the storage data of the corresponding word of the associative memory 49. The transfer rule, with which only the transfer from a certain user's terminal (PC) to a certain user's terminal (PC) is permitted and the other transfers is rejected, is stored in the other words of in the associative memory searching for a single field 4-1 through 4-*r*, and the data indicating "a holiday" is stored as the storage data of the corresponding word of the associative memory 49. Herein, it is possible to change the transfer rules with reference to the search data 48. In other words, the transfer rules can be set more flexible compared with the associative memory 25.

The Sixth Embodiment

Figure 27:
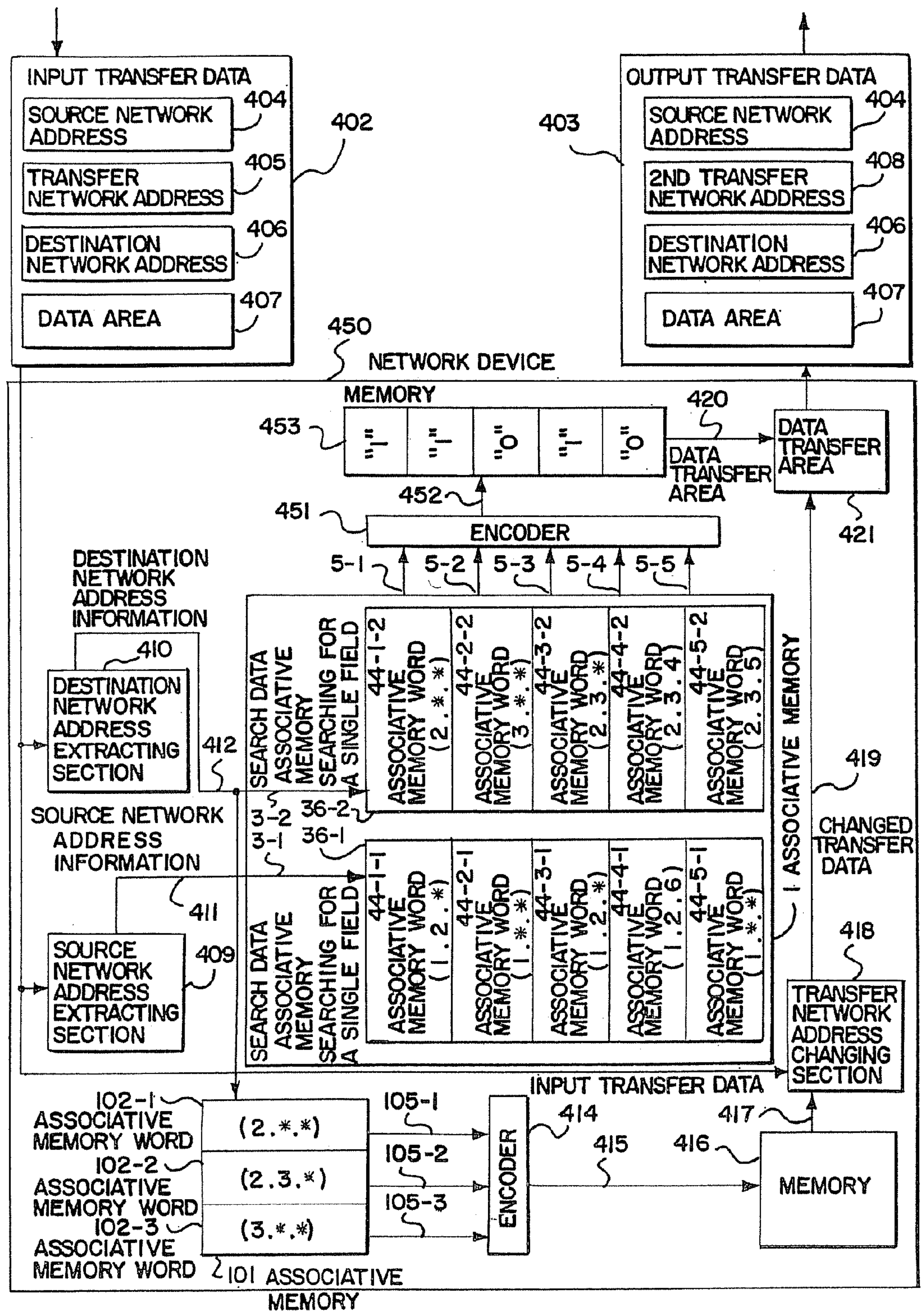
FIG. 27 is a block diagram of one example of network devices of this invention used associative memory of this invention as determination of transfer.
Figure 28:
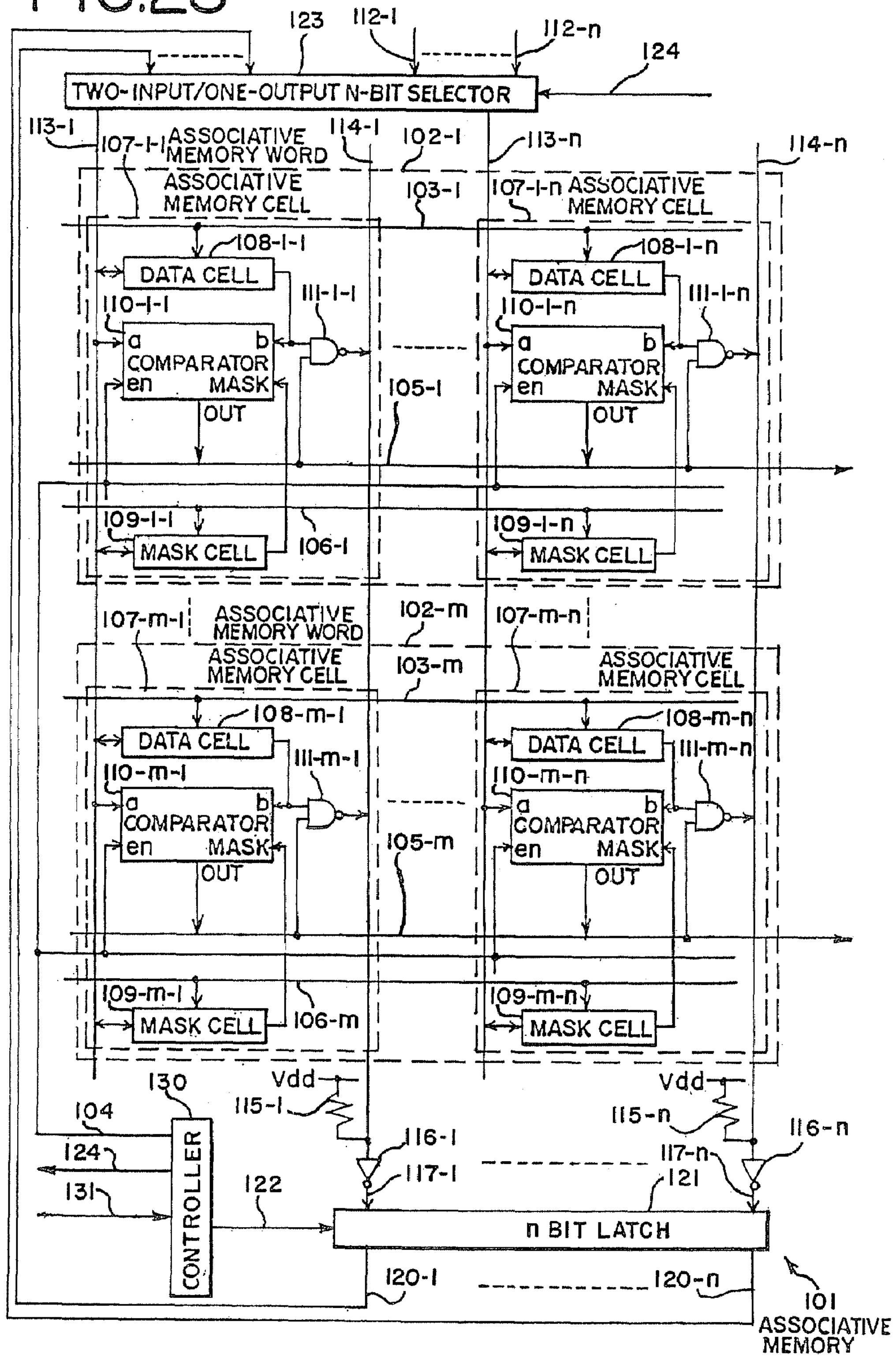
FIG. 28 is a block diagram of one example of conventional associative memories.

Next referring to FIG. 27, the associative memory 1 of the first embodiment is used in the network device to calculate the transfer network address. Herein, in FIG. 27, description will be made about the case where the network device 450 of this invention is applied to the network device 400-1 in FIG. 33 as similar to the conventional network device 422 in FIG. 34. Alternatively, another network device in FIG. 33 can be used to perform the similar operation.

Figure 34:
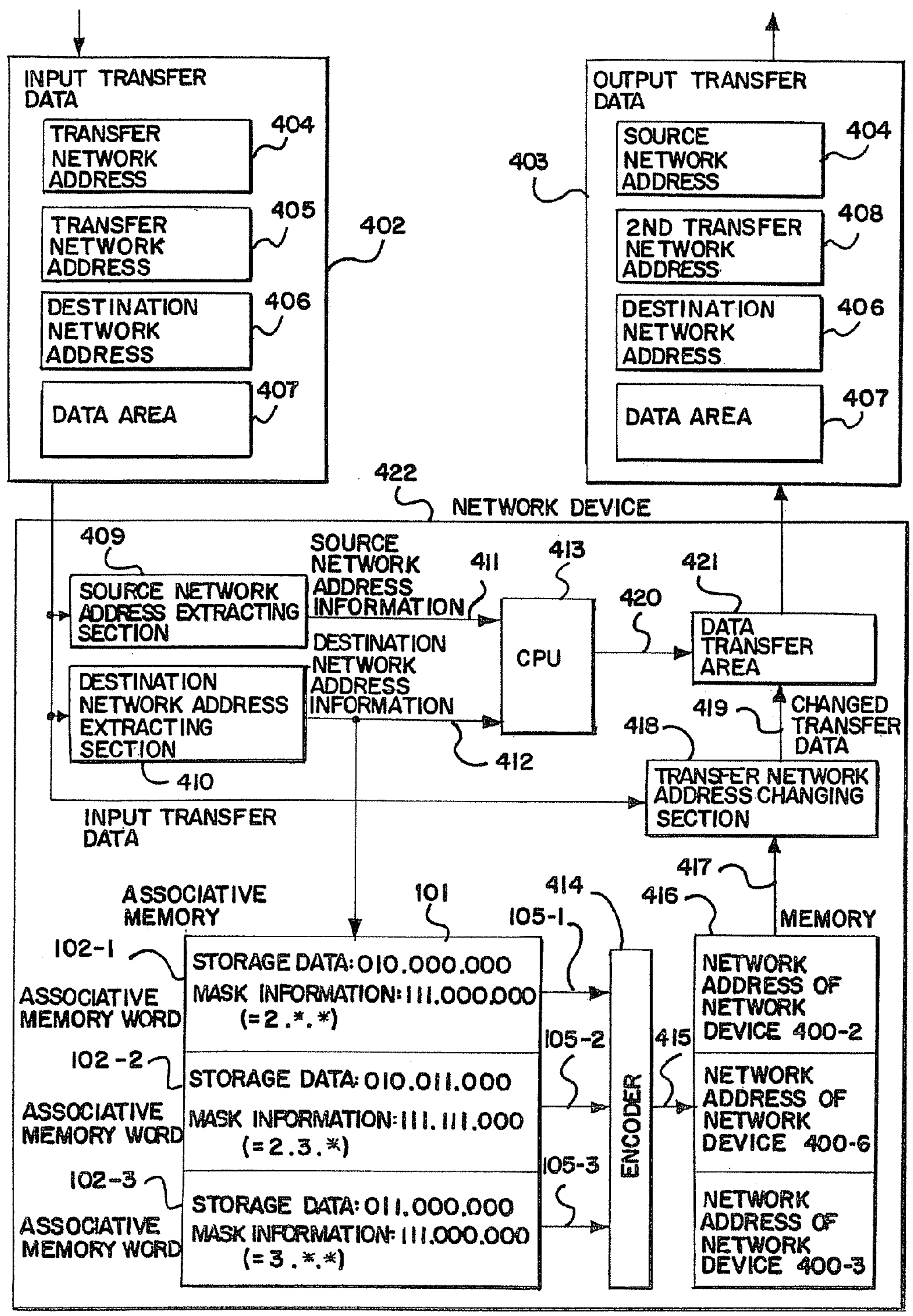
FIG. 34 is a block diagram of one example of conventional network device in which conventional associative memory is used for transfer network address calculation.

The network device 450 in FIG. 27 is supplied with input transfer data 402 and produces output transfer data 403 as similar to the conventional network device 422 in FIG. 34. The input transfer data 402 comprise a source network address 404, a transfer network address 405, a destination network address 406, and a data division 407. The output transfer data 403 comprise a source network address 404, the second transfer network address 408, a destination network address 406, and a data division 407. Herein, since the network device 450 is applied to the network device 400-1 in FIG. 33, the transfer network address 405 in the input transfer data 402 is the network address of the network device 400-1 in FIG. 33.

The network device 450 of this invention in FIG. 27 comprises a source network address extracting section 409, a destination network address extracting section 410, the associative memory 101, encoder 414, a memory 416, a transfer network address changing section 418, a data transfer division 421, the associative memory 1 of this invention, encoder 451, and a memory 453. The CPU 413 in the conventional network device 422 in FIG. 34 possesses the function which produces the transfer control signal 420 as the arithmetic result of the determination of transfer permission supplied with the source network address information 411 and the destination network address information 412. The CPU 413 in the network devise 450 of this invention is similar to the CPU 413 in the conventional network device 422 in FIG. 34, except composing of the associative memory 1, the encoder 451, and the memory 453. The other components, such as the source network address extracting section 409, the destination network address extracting section 410, the associative memory 101, the encoder 414, and the memory 41 6 are similar to the corresponding component in the conventional network device in FIG. 34. The set information applied to the network device 400-1 in FIG. 33 is also similar to the corresponding information in FIG. 34. Therefore, description will be directed only to components different from the conventional network device 422.

Referring to FIG. 27, an associative memory 1 comprises first through fifth 9-bit associative memory searching for a single field 36-1 and 36-2. The source network address information 411 produced by the source network address extracting section 409 is supplied to the associative memory searching for a single field 36-1 as the search data 3-1. The destination network address information 412 produced by the destination network address extracting section 410 is supplied to the associative memory searching for a single field 36-2 as the search data 3-2. Herein, the search data 3-1 possesses the highest priority "1", and the search data 3-1 possesses the priority "2".

The 9 bit storage data and 9 bit mask information, which comprise the 9 bit of structure data of the source network address in each transfer rule in Table.1(b), are stored as the storage data and the mask information, respectively, of each associative memory words 44-1-1 through 44-5-1 corresponding to the transfer rule of the associative memory searching for a single field 36-1. Likewise, the 9 bit storage data and 9 bit mask information, which comprise the 9 bit of structure data of the source network address in each transfer rule in Table.1(b), are stored as the storage data and the mask information, respectively, of each associative memory words 44-1-2 through 44-5-2 corresponding to the transfer rule of the associative memory searching for a single field 36-2. The associative memory 1 is supplied with the start signal and the clock signal by the controller which is not illustrated.

The encoder 415 encodes the match signal 5-1 through 5-5 that the associative memory 1 supplies into a memory address signal 451. The memory 453 stores the information of the Table.1(b) in the same address of the associative memory word where the corresponding storage data the mask information is memorized. Each information "1" and "0" of the Table.1(b) indicates the transfer permission, or the transfer prohibition, respectively. For example, the information corresponding to the transfer rule 1 is stored in the associative memory word 44-1-1 and 44-1-2 of the associative memory 1 while the information indicating the transfer permission "1" corresponding thereto is stored in the first word of the memory 453. Similarly, the information corresponding to the transfer rule 2 indicating the transfer permission "1", the information corresponding to the transfer rule 3 indicating the transfer prohibition "0", the information corresponding to the transfer rule 4 indicating the transfer permission "1", the information corresponding to the transfer rule 5 indicating the transfer prohibition "0", are stored in the second word, the third word, the fourth word, and fifth word of the memory 453, respectively. The memory 453 produces the stored data, which is specified with the memory address signal 452 as a read address, to the data transfer division 421 as the transfer control signal 420. The data transfer division 421 output the changed transfer data 419 when the transfer-control signal 420 permits the data transfer, otherwise, output nothing when the transfer control signal 420 prohibits the transfer.

Description will be made about an operation in the network device 450 set as mentioned above. It is assumed here that the network device 450 is supplied with the input transfer data 402 which possesses the network address (1, 2, 6) of the user's terminal (PC) 401-1 in FIG. 33 as the source network address 404 and the network address (2, 3, 5) of the user's terminal (PC) 401-3 in FIG. 33 as the destination network address 406.

After the searching operation in the associative memory 101, the match line 105-2 corresponding to the stored data (2, 3, *) in the associative memory word 102-2 is put into a valid state. Accordingly, the encoder 414 produces "2" as the memory address signal 415, and the memory 416 produces the memory data signal 417 which is the network address of the network device 400-6. The transfer network address changing section 418 changes the transfer network address 405 of the input transfer data 402 into the network address of the network device 400-6, and supplies it to the data transfer division 421 as the changed transfer data 419.

Herein, the associative memory 1 is supplied with the network address (1, 2, 6) as the search data 3-1 from the source address extracting section and the network address (2, 3, 5) as the search data 3-2 from the destination address extracting section. The state of the search data 3-1 and 3-2, and the transfer rule stored in the associative memory searching for a single field 36-1 and 36-2 are similar to the first embodiment. Consequently, the match signal 5-3 supplies a valid state while the other match lines 5-1, 5-2, 5-4, and 5-5 supplies an invalid state "0". Accordingly, the encoder 415 produces "3" as the memory address signal 452, and the memory 453 produces the information corresponding to the transfer rule 3 indicating the transfer prohibition "0" as the transfer control signal 420 to the data transfer division. Consequently, the data transfer division does not produce the changed transfer data 419 as the output transfer data 403. As mentioned above, the transfer from the user's terminal (PC) 401-1 with the network address (1, 2, 6) to (PC) 401-3 with the network address (2, 3, 5) ought to be prohibited by the transfer rule 3, which indicates that the operation has resulted properly.

Although the memory address signal 452 is produced by the encoder 451 in this embodiment, the encoder 451 may be unnecessary if the match signal 5-1 through 5-5 is supplied directly as the word line.

As described above, by the use of the network device of this embodiment, it is possible to implement the determination of transfer permission in a single clock. As will be understood, the network system using the network device of this invention can accelerate the data transfer rate, compared with the conventional network device in FIG. 34 which operates the determination of transfer permission by the software process of CPU in hundreds of clocks.

Further, since an expensive CPU for high speed data transfer is unnecessary, whole cost of a network equipment is reducible.

Furthermore, since only a modification of a stored data in an associative memory is needed for elimination, addition, and change of a transfer rule, it takes only time for memory access.

Consequently, the network equipment of this invention can eliminate, add, and change a transfer rule without interruption of transfer operation.

As mentioned above, if the associative memory of this invention is used, the network system with high security and high speed data transfer can be implemented.

INDUSTRIAL APPLICABILITY

As described above, the associative memory of this invention possesses the advantage to output exteriority at a high speed, such as in (number of search field +1) or less clocks, the signal that distinguish the word in the corresponding words with the least number of bits in a mask valid state in the mask information which compose the structured data in every search field taking the priority into account if two or more words fulfill the condition with all the storage data corresponding to the input data are coincident when the search operation is carried out against the input data composed of plural search field. In addition, it can be implemented by slight increase of circuit scale compared with a conventional associative memory.

Since the associative memory of this invention does not limit an order of words to store structured data or a position of stored words, structured data can be added, deleted, and changed in only time for ordinary memory access. Consequently, software process to administrate the structured data of an associative memory can be simplified.

As will be understood from the foregoing, the network equipment using the associative memory of this invention can accelerate the determination of transfer permission hundreds times faster than a conventional network equipment, because the operation of the determination of transfer permission can be made in three clocks while a conventional network equipment takes hundreds of clocks for the software operation with a binary tree algorithm.

Since the associative memory of this invention implements deletion, addition, and change of transfer rules in time of ordinary memory access, a network equipment using the associative memory of this invention implement deletion, addition, and change of transfer rules without interruption of transfer operation. Consequently, a huge search table used in a soft ware process to determine transfer permission in conventional network equipment can be unnecessary, interruption of network communication can be reduced, and administration of system operation can be easier. In addition, whole network system implements high security because the latest transfer rules are applied immediately.

As will be understood from the foregoing, the network system using the associative memory of this invention can implements the total cost reduction of network equipment with high speed determination of transfer permission, because the associative memory of this invention, which is capable of the determination of transfer permission at high a speed, does not need an expensive high speed CPU system.

A network system with high security, high speed data transfer, and easy administration can be built by using the network equipment of this invention.

What is claimed is:

1. An associative memory which stores mask information for every single word of storage data to indicate a valid state or an invalid state representative of whether or not every single bit or every plural bits of said storage data should be excluded from a search object; said associative memory comprising:

i) a first circuit means as a primary searching means for producing a primary distinguishing signal to distinguish a selected word, when all bits of an external search data composed of partial bits, n in number (where n is an integer variable 2 or more), are in a primary searching operation, said primary searching operation taking said mask information into account in order to exclude single or plural bits of said storage data from a search object when said corresponding mask information is in a valid state of mask information for each single word, ii) a second circuit means for producing an intermediate data which supply an intermediate data produced by a logical operation of storage data corresponding to words in a selected state, a logical operation of mask information corresponding to said words, and a logical operation of a single or plural pairs of external search data, iii) a third circuit means as a single or plural shared secondary searching means for producing a secondary distinguishing signal which distinguish a word selected from said search operation, when said intermediate data divided into n, n in number, are supplied similar to a composition of partial bit fields of said external search data, controlling whether or not a secondary search operation is to be carried out against only a bit field of said storage data or mask information corresponding to said partial bit fields in words, depending on a state of secondary search controlling signal, and iv) a fourth circuit means for controlling, to produce said secondary search controlling signal to implement said secondary search, using said partial bit field, n in number, of said intermediate data as a search data in order, after said primary search operation using all bit fields of said external search data as a search data.

2. An associative memory as claimed in claim 1, wherein said searching means which use a single or plural attribute data as search data, said associative memory possessing the second associative memory to produce an attribute match signal corresponding to said word storing said storage data, and producing a primary distinguishing signal which distinguish a word, said primary distinguishing signal selected by primary searching operation and indicating coincidence as a result of searching operation for said attribute data by said attribute matching signal using said second associative memory, said primary searching operation against said external search data taking said mask information into account in order to exclude single or plural bits of said storage data from a search object when said corresponding mask information is in a valid state of mask information for each single word.

3. An associative memory as claimed in claim 1, wherein said primary searching means which shares structure elements of said primary searching means and secondary searching means, said associative memory comprising:

i) a first circuit means as a selecting means for selecting said external search data as search data when primary control enabling signal is in a valid state, otherwise select said intermediate data, and ii) a second circuit means for carrying out a primary search operation against all bits of said external search data as search data to exclude single or plural bits of said storage data from a search object when said corresponding mask information is in a valid state of mask information for each single word, when primary search enabling signal is in a valid state, and a secondary search operation selectively against only a designated bit field, depending on a state of said storage data or mask information in words when secondary search controlling signal is in a valid state, said associative memory possessing means to put primary control enabling signal into a valid state, and produce said secondary search controlling signal in order to carry out said secondary search operation using said partial bit field, n in number, of said intermediate data after said primary search operation using all bit fields of said external search data as search data.

4. An associative memory as claimed in claim 1, sharing the lines for providing said information to said intermediate data producing means and the lines for a primary or a secondary distinguishing signal, by using a wire connection logic for updating and storing the information whether or not the corresponding word for each word is selected through a primary or a secondary searching operation which provides to said intermediate data producing means.

5. An associative memory as claimed in claim 1, establishing a same priority to each partial bit field of said intermediate data as the corresponding partial bit field of said external searching data, and operating a said secondary searching operation against said intermediate data in the order of descending priorities of said partial bit field.

6. An associative memory as claimed in claim 1, storing a particular bit pattern in single or plural bits as said storage data excluded from a search object by said corresponding mask information in said primary searching operation, and selecting the word including said storage data, or partial bit field of said storage data as a searching target, coincident with the said intermediate data, or partial bit field of said intermediate data in a secondary searching operation.

7. An associative memory as claimed in claim 1, carrying out a secondary searching operation regarding single or plural bits of said storage data excluded from the search object by said corresponding mask information in the primary searching operation as a particular bit pattern, to select t the word including said storage data, or partial bit field of said storage data as a searching target, coincident with the said intermediate data, or partial bit field of said intermediate data provided as a search data.

8. An associative memory as claimed in claim 6 or claim 7, wherein each bit of said particular bit pattern is in an invalid state for the storage data.

9. An associative memory as claimed in any one of claims 6 to 8, wherein said logical operation is a logical sum (an OR operation) of the storage data corresponding with the words in a selected state, with the valid state for the storage data as true, carrying out said secondary searching operation of selecting the word including said storage data coincident with said intermediate data as a result of said logical sum (an OR operation).

10. An associative memory as claimed in any one of claims 6 to 9, wherein said logical operation is a logical multiplication (an AND operation) of the mask information corresponding with the words in a selected state, with the valid state for the mask information as true; said first logical operation is conducted to produce said intermediate data in a manner that information of the same bit position of the said external search data is set as the intermediate data at the same bit position when a bit for the result of said logical AND information is an invalid state for the mask information, or that invalid state of a storage data is set as intermediate data at the same bit position when a bit for the result of said logical AND information is a valid state for the mask information, and selecting the word including said storage data, coincident with the said intermediate data in a secondary searching operation.

11. An associative memory as claimed in claim 1, wherein said logical operation is a logical multiplication (an AND operation) of the mask information corresponding with the words in a selected state, with the valid state for the mask information as true, and selecting the word including mask information, coincident with the said intermediate data, and possessing the selected state by that time in a secondary searching operation.

12. A network device possessing a means, determining a transfer permission of said input transfer data with reference to an match state in search operation for a single or plural transfer rule, using an issuer network address and a destination network address annexed to an input transfer data as search data, said transfer rule wherein said network device which stores a transfer rule table to indicate a mask information representative of whether or not every single bit or every plural bits of said storage data should be excluded from a search object, for every storage data including a bit field corresponding to each component, information of transfer permission, and said single or plural transfer rule, said transfer rule possessing, when all bits of determination input data are in a primary searching operation, said primary searching operation taking said mask information into account in order to exclude single or plural bits of said storage data from a search object when said corresponding mask information is in a valid state of mask information for each single word, a primary searching means to produce a primary distinguishing signal to distinguish a selected word, said network device possessing an intermediate data producing means which supply an intermediate data produced by a logical operation of the storage data corresponding to words holding a selected state, a logical operation of the mask information corresponding to said words, and a logical operation of a single or plural pairs of external search data, said network device possessing a single or plural shared secondary searching means when each partial bit field of divided said intermediate data are supplied, similar to a composition of partial bit fields of said determination input data, controlling whether or not a secondary search operation is to be carried out for only a bit field of said storage data or mask information corresponding to said partial bit fields in transfer rule, with reference to a state of secondary search controlling signal, and producing a secondary identification signal for identifying a particular transfer rule selected from said search operation, said network equipment memory possessing means producing said secondary search controlling signal in order to carry out said secondary search operation using said partial bit field of said intermediate data upon completion of said primary search operation using all bit fields of said determination input data as search data, said network device possessing a determination means to determine a transfer permission of said input transfer data, with reference to information of transfer permission with said match signal.

13. A network system in which data communication is carried out among apparatuses connected to the network via network equipment as claimed in claim 12.

* * * * *